United States Patent [19]

Machado

[11] Patent Number: 4,730,321

[45] Date of Patent: Mar. 8, 1988

[54] DISK DRIVE WITH IMPROVED ERROR CORRECTION CODE

[75] Inventor: Michael G. Machado, San Jose, Calif.

[73] Assignee: Quantum Corporation, Milpitas, Calif.

[21] Appl. No.: 869,005

[22] Filed: May 30, 1986

[51] Int. Cl.$^4$ ............................................. G06F 11/10
[52] U.S. Cl. ........................................ 371/38; 371/40
[58] Field of Search ................................ 371/38, 39, 40

[56] References Cited

U.S. PATENT DOCUMENTS

| | | | |
|---|---|---|---|
| 4,410,989 | 10/1983 | Berlekamp | 371/40 |
| 4,564,945 | 1/1986 | Glover et al. | 371/38 |
| 4,567,594 | 1/1986 | Deodhar | 371/38 |
| 4,608,692 | 8/1986 | Nagumo et al. | 371/38 X |
| 4,633,471 | 12/1986 | Perera et al. | 371/38 |
| 4,642,808 | 2/1987 | Baggen | 371/39 |

Primary Examiner—Charles E. Atkinson
Attorney, Agent, or Firm—David B. Harrison

[57] ABSTRACT

A rotating disk data storage subsystem is disclosed for recording and retrieving data in blocks of predetermined finite length, each block of data including an error correction code syndrome portion calculated in accordance with a predetermined Galois field error correction algorithm. The subsystem includes a data controller including a unitary, cyclic error correction code syndrome generator/decoder for processing each incoming byte of the block in accordance with the said error correction algorithm in a manner which tests for the presence of any errors and which generates error values from which the errors may be located and corrected. A microprocessor controller has access to the data controller for testing to determine if the generator has determined the presence of an error for an incoming block, and if so, for obtaining the error values. The microprocessor is programmed to process the error values to determine the location and nature of at least one error, and having access to the buffer memory whereby a data byte of the block including an error may be removed and a corrected byte substituted in its place.

28 Claims, 15 Drawing Figures

DISK DRIVE WITH IMPROVED ERROR CORRECTION CODE

FIELD OF THE INVENTION

The present invention relates to rotating disk data storage devices including improved and simplified apparatus and methods for automatic detection and correction of errors in blocks of data. More particularly, this invention relates to an error correction coding system which carries out a Reed-Solomon cyclic error correction code process on blocks of data to be stored in a rotating disk data storage device with simplified and minimized hardware logic.

BACKGROUND OF THE INVENTION

Since the advent of digital computing techniques thirty five years ago, attention has focused on methods for reducing errors in data. Such errors may be attributable to transient conditions in a computing apparatus or transmission channel, called "soft" errors; or they may be recurrent errors, such as those resulting from defects in data storage media, etc., called "hard" errors. In either event, in order to insure the integrity of data it has early recognized that errors must be located and corrected. For example, an error rate of $10^{-12}$ bits (i.e. one error bit in $10^{12}$ bits) is a typical performance specification for hard errors in a high capacity disk data storage subsystem.

Many different types of block and convolutional error detection and/or correction codes have been devised and have been applied to reduce error rates typically associated with different types of data paths and storage media. These codes are frequently named after the people who first devised or disclosed the particular code. For instance, such codes as Hamming codes, Fire codes, Golay code, Bose-Chaudhuri-Hocquenghem (BCH) codes, Reed-Solomon (RS) codes, and Goppa codes are known and used in the prior art and were introduced by the persons whose surnames have come to identify the particular code. The characteristics of these codes are summarized and explained in general terms in a recent article by Solomon W. Golomb entitled "Optical Disk Error Correction" appearing in *Byte Magazine*, Vol. 11, No. 5, May 1986, pages 203 to 210.

Rotating disk data storage devices typically store data as discrete blocks or frames, with each frame being related to a single data track or sector within a track. Commonly employed frame lengths are 256 ($2^8$), 512 ($2^9$) and 1024 ($2^{10}$) bytes. As a result of this characteristic of disk stores, one currently popular code for use in error correction processes associated therewith is the Reed-Solomon (RS) code method. This code treats m-bit bytes as individual code symbols. A single RS code word, or "frame" of data (including overhead associated with the error correction process) can be up to $2^m-1$ of m-bit bytes. If it is desired to correct any error that affects up to and no more than t bytes per frame, then the RS methodology requires that 2t bytes per frame be devoted to error correction redundancy or overhead. This leaves $2^m-1-2t$ bytes available for useful data storage and retrieval.

While RS codes are becoming popular for error correction in disk stores, implementation of RS code methods has heretofore been very complicated and has required a considerable overhead of hardware devoted to carrying out the error correction process. One example of the complexity of hardware required for real time error correction with RS codes is U.S. Pat. No. 4,494,234 to Patel. In the prior approach described in the Patel patent, literally thousands of discrete logic circuit elements were required in order for the dedicated hardware apparatus to carry out error correction on the fly. A related Patel patent directed to the syndrome processing unit of the on the fly system patented by the referenced U.S. Pat. No. 4,494,234, is U.S. Pat. No. 4,504,948 which provides further useful background information relating to the processing required to correct errors based on Reed Solomon correction codes employing finite field theory. It, too, is extremely complicated and expensive, although effective for multi-byte error correction within the finite field data block.

One hitherto unsolved need has arisen for an effective RS error correction code system in which the special hardware requirements imposed by the process have been minimized.

One recognized phenomenon in rotating disk data storage devices is the tendency of data errors to cluster. An electrical transient condition, for example, may cause two or three adjacent bytes to become corrupted with errors. One known approach for minimizing the impact of cluster errors in error correction processing is to divide a data block into several subfields and to develop error syndromes based upon the interleave of the subfields. In this way, if error clusters occur, they will likely be spread over the several subfields. If each subfield of a particular block or sector is denominated an RS frame, the number of bytes t to be corrected for the frame may be made low, and the consequent error correction overhead (2t) per frame may also be kept low, while overall corrected error rates are extremely low. A need has arisen for RS error correction code apparatus which makes use of an interleave approach in order thereby to simplify and minimize the hardware required.

Since error correction is an occasional, as opposed to a constant, process, and the calculations required to perform RS error correction involve complex mathematics, a need has arisen to employ minimized logic to generate an error correction value or "syndrome" for each RS frame during data write operations, and to recover and check its "syndrome" during data read operations; and, to employ a general purpose digital microprocessor with a program subroutine for carrying out the intermittant and complex RS calculations necessitated when a detected non-zero syndrome reveals the presence of one or more errors in the RS frame.

SUMMARY OF THE INVENTION WITH OBJECTS

A general object of the present invention is to provide a simplified rotating disk data storage device including apparatus and methods for carrying out error correction coding operations in a manner which overcomes limitations and drawbacks of the prior art.

A more specific object of the present invention is to provide an improved apparatus for generating and recovering Reed-Solomon error correction code syndromes which employs a minimized logic, unitary encoder/decoder structure.

Another specific object of the present invention is to provide a rotating disk data storage subsystem which includes improved apparatus for carrying out error correction calculations and manipulations with the aid of a programmed digital microprocessor in a manner which enables the microprocessor to be available to perform a wide variety of other useful tasks in the data storage subsystem environment.

One more specific object of the present invention is to provide a Galois field for Reed-Solomon error correction processing and a symmetrical syndrome generator polynomial which enables the minimization of hardware elements of a unitized error correction code syndrome generator and decoder.

Yet another specific object of the present invention is to provide a logic-reduced single error correction code syndrome state machine which functions to generate Reed Solomon error correction code syndromes during an encoding process and which functions to decode and check such syndromes during a decoding process.

One more specific object of the present invention is to transfer to a programmed digital microprocessor calculational tasks required for Reed-Solomon error correction processing thereby enabling a dedicated logic encoder/decoder to be implemented with minimized hardware complexity and cost.

In accordance with the invention, a rotating disk data storage subsystem for storing useful data includes a rotating disk having a storage surface in which the data is recorded in blocks of predetermined finite length, a positionable data transducer for reading the data of selected data blocks from the surface, a transducer actuator structure for moving the data transducer among data block locations available on the surface in response to data retrieval commands from a host system and for maintaining the data transducer accurately positioned at each data block location in response to servo information obtained from the data surface, a data controller for managing retrieval of data from the surface via the transducer, a buffer memory for temporarily storing each block of data retrieved from the surface, an interface communicating with the host for sending each data block and status commands to the host and for receiving operational commands from the host, and a single microprocessor controller for controlling the actuator structure in order to position the transducer in order to read and write selected data blocks.

Each block of data includes an error correction code syndrome portion calculated in accordance with a predetermined Galois field error correction algorithm.

The data controller includes a cyclic error correction code syndrome generator for processing each incoming byte of the block in accordance with the said error correction algorithm in a manner which tests for the presence of any errors and which generates error values from which the errors may be located and corrected.

The microprocessor has access to the data controller for testing to determine if the generator has determined the presence of an error for an incoming block, and if so, for obtaining the error values, The microprocessor is programmed to process the error values to determine the location and nature of at least one error, and has access to the buffer memory whereby a data byte of the block including an error may be removed and a corrected byte substituted in its place.

In one aspect of the present invention, the access by the microprocessor to the buffer memory is via registers of the data controller.

In another aspect of the present invention, the cyclic error correction code syndrome generator comprises a hardware logic apparatus including:

an input/output summing junction for receiving each incoming data block from the tranducer as a clocked data stream of serial bytes, an error correction code feedback path leading from the summing junction and carring feedback values, multiplier apparatus for multiplying the feedback values by a first predetermined constant to yield first product values, for multiplying the feedback values by a second predetermined constant to yield second product values, and for multiplying the feedback values by a third predetermined constant to yield third product values, a first clocked latch stage for latching the feedback values present on the feedback path, a first summing junction for summing the latched feedback values from the first latch stage with the first product values to yield first sum values, a second clocked latch stage for latching the first sum values, a second summing junction for summing the first sum values and the second product values to yield second sum values, a third clocked latch stage for latching the second sum values, a third summing junction for summing the second sum values and the third product values to yield sum values, a fourth clocked latch stage for latching the third sum values, the input-output summing junction for summing the third sum values with the incoming clocked stream of serial bytes to generate the feedback values, the first, second, third and fourth latch stages being clocked in synchronism with the incoming data stream of serial bytes, and a testing circuit for enabling the microprocessor to test for the presence of zero values held in the first, second, third and fourth latch stages at the end of processing of each block thereby to determine that an error has occurred if a non-zero value is present, and wherein the microprocessor has direct access to the values held in the first, second third and fourth latch stages at the end of processing of each block in order to obtain the values therein if an error is present.

In one more aspect of the present invention, each data block is divided inside the generator into three interleaved parts, wherein each of the first, second, third and fourth latch stages includes three synchronously clocked serial latches, and wherein the syndrome generator calculates three syndromes, each syndrome corresponding to a said interleave.

In yet another aspect of the present invention, each data block includes five hundred twelve data bytes followed by twelve error correction code syndrome bytes, there being four syndrome bytes provided for each said interleave part, and the Galois field $GF(2^8)$ is generated by the following field generator polynomial:

$$x^8+x^4+x^3+x^2+1$$

and wherein the first term thereof is:

$$x^5+x^3+x+1 \text{ (or 00101011 binary)}.$$

In one more aspect of the present invention, the first interleave begins with the first data byte and includes every third byte thereafter, the second interleave begins with the second data byte and includes every third byte thereafter, and the third interleave begins with the third byte and includes every third byte thereafter, and wherein the twelve syndrome bytes are appended immediately following the last data byte of the block in the order S3A, S1A, S2A, S3B, S1B, S2B, S3C, S1C, S2C, S3D, S1D, S2D, where S denotes syndrome byte, the numeral denotes the interleave number and the letters A, B, C and D denote respectively the first, second, third and fourth bytes of the syndrome, so that a single block having one burst of 17 bits incorrect may be corrected and up to three bursts of 17 bits incorrect may be detected.

In a still further aspect of the present invention, the error correction algorithm enables an error correction syndrome to be generated by a symmetric syndrome generator polynomial and wherein the third predetermined constant is equal to the first predetermined constant and wherein the multiplier apparatus generates the first product values and the third product values with the same circuit logic elements.

In still another aspect of the present invention, the symmetric syndrome generator polynomial is:

$$X^4 + Alpha^{18}X^3 + Alpha^{87}X^2 + Alpha^{18}X + 1$$

In one further aspect of the present invention, the first, second, third and fourth latch stages include addressable, enablable bus drivers for enabling syndrome values contained therein at the end of processing of a data block to be obtained and analyzed by a correction computer thereby for locating and correcting at least one data byte determined to be in error.

In one additional aspect of the present invention, a single bus driver is connected to the fourth stage output and a clocking circuit responds to an addressing signal from the microprocessor in order to clock all of the latch stages, so that the microprocessor may thereby obtain all of the syndrome error bytes in sequence.

In yet another aspect of the present invention, additional latch/drivers are attached to the first, second third and fourth stage outputs so that multiple blocks of data may be handled with minimum time loss while error correction is being carried out with respect to one of the blocks.

These and other objects, advantages and features of the present invention will be more fully realized and appreciated by considering the following detailed description of preferred embodiments, presented in conjunction with the accompanying drawings.

DETAILED DESCRIPTION OF PREFERRED EMBODIMENTS

Figure 1:
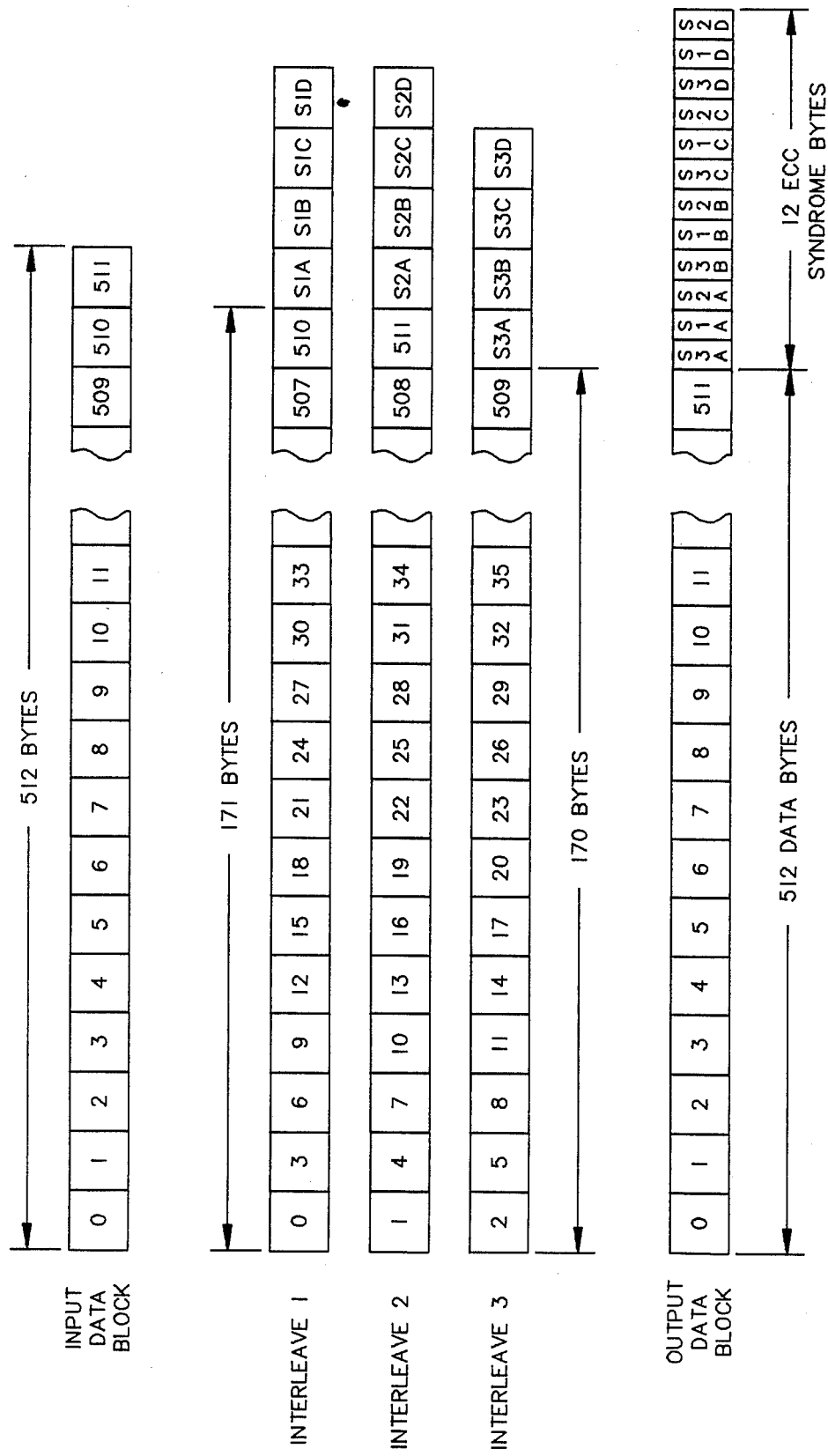
FIG. 1 is a diagram of three phases of error correction processing of a serial 512 byte data block.
Figure 2:
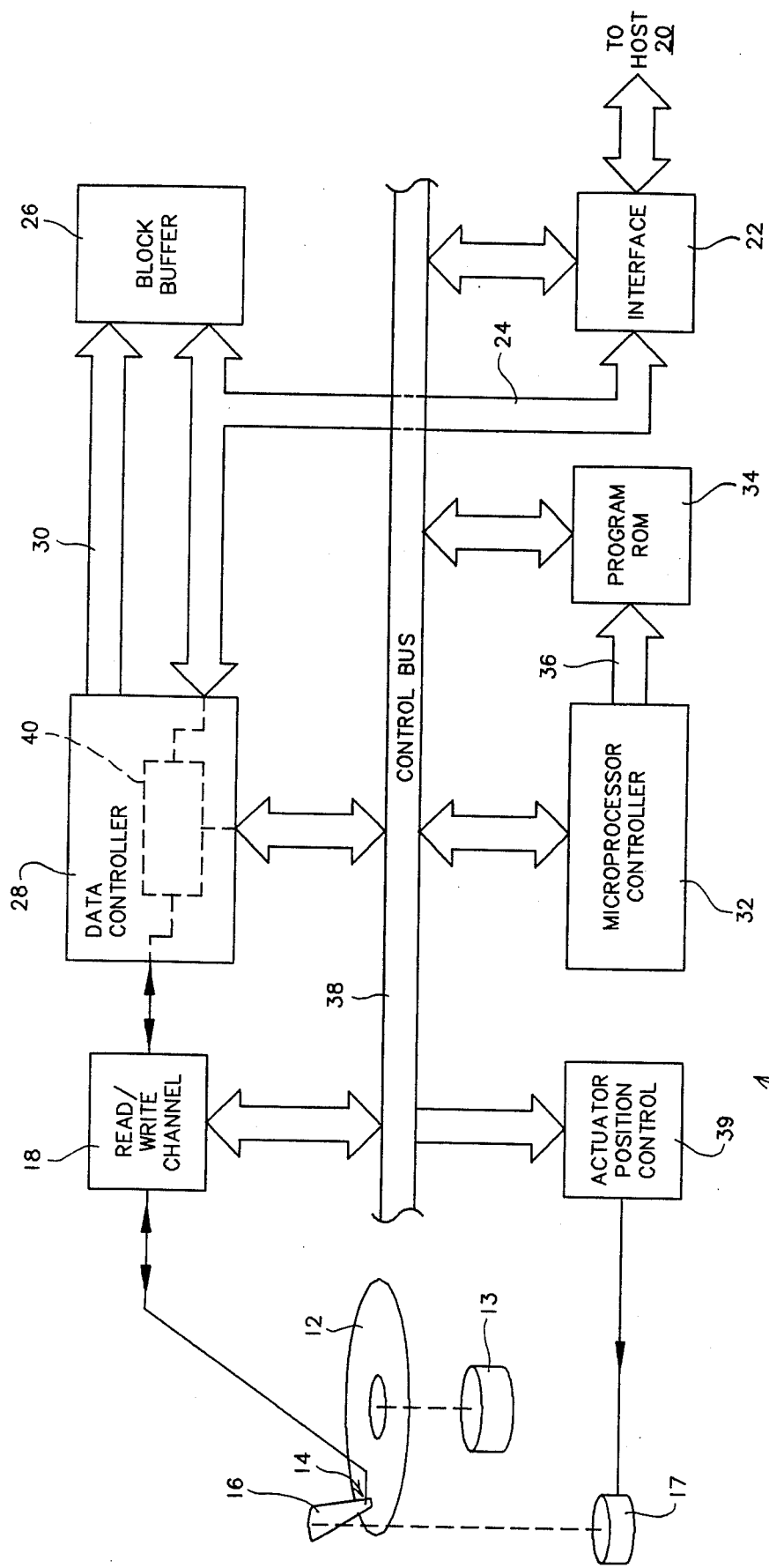
FIG. 2 is a block diagram of a rotating disk data storage subsystem employing the error correction code system of the present invention.

FIG. 1 depicts a block of data. This data may be provided from any source, one commonly encountered source being a host computing system 20 (FIG. 2). The block length is selected in relation to a number of factors, one of which is the ease with which error correction processing may be carried out. In the case of a rotating disk data storage subsystem, one important factor determining block length is the sector space available on the disk storage surface for storage of useful data.

In the FIG. 1 example, the block is 512 eight bit bytes in serial length; and, this length may correspond to one data sector (excluding servo, buffer gap and error correction syndrome byte overhead) of a concentric data track of a disk file subsystem, such as the subsystem 10 depicted in FIG. 2. In one such file with which the present invention may be advantageously employed, for example as described by a commonly assigned U.S. patent application, Ser. No. 834,009 filed on Feb. 27, 1986 and entitled "High Capacity Disk File with Embedded Sector Servo" now U.S. Pat. No. 4,669,004, there are thirty two sectors in each concentric data track, each sector containing 512 data bytes.

During the encoding process for RS error correction in accordance with the principles of the present invention, the 512 byte block is divided into three interleaves as shown by the middle portion of FIG. 1, the two interleaves numbered 1 and 2 being 171 bytes in length and the one numbered 3 being 170 bytes in length. The RS syndrome is simultaneously calculated for each interleave, there being four error correction syndrome bytes calculated for each interleave, bytes S1A, S1B, S1C and S1D for Interleave 1; bytes S2A, S2B, S2C and S2D for Interleave 2; and bytes S3A, S3B, S3C and S3D for Interleave 3. At the completion of the encoding process, the twelve error correction bytes are immediately appended to the end of the data field without any byte gaps, as indicated by the lower portion of FIG. 1, and in the example of disk storage, the block is then recorded onto a selected surface, track and sector of the storage disk.

A generalized summary overview of the rotating disk data storage system 10 incorporating the principles of the present invention is provided by FIG. 2. Therein, the system 10 includes a rotating data storage disk 12 which is rotated at a constant predetermined angular velocity by e.g. a brushless DC direct drive spindle motor 13, and supports at least one data transducer 14 by air bearing effect over the data storage surface thereof, during disk rotation. The transducer 14 is controllably moveable by an actuator structure 16 between concentric data tracks of the data surface of the disk 12. The structure 16 is powered by an electromechanical mover 17 such as a rotary voice coil motor. The magnetic transducer head 14 translates electrical currents into magnetic flux transitions and conversely during write and read operations. These currents are typically converted from and to binary level transitions by conventional read/write channel signal processing circuitry 18.

Incoming data from a source 20, such as a host computing system with which the disk storage subsystem 10 is associated, enters the system 10 through an interface 22. The interface separates data and control signals and decodes commands from the host so that appropriate data storage and retrieval operations may be accomplished by the subsystem 10. The raw incoming data from the host 20 passes through the interface 22 and onto a bus 24 which carries the data to a temporary block buffer storage memory 26. In practice, the memory 26 will have enough storage space to contain at least one block, and often in the case of a disk file, it will hold all of the blocks of an entire concentric data track on the surface 12 (32 blocks in this preferred example).

The buffer 26 is controlled by a data controller 28 which commands read and write operations from and to the buffer 26 and which generates and supplies address and read/write control signals thereto over a special address bus 30. When raw incoming data reaches the interface 22, it signals this arrival to the data controller 28, and the controller 28 thereupon causes the buffer 26 to enter a write mode and generates storage location addresses in proper sequence for each byte of incoming raw data of the block.

A microprocessor controller 32 (such as a type 8031 microprocessor made by Intel Corporation, Santa Clara, Calif., or equivalent) has suitable control programs stored in a read only memory 34 which it addresses over an address bus 36. The controller 32 supervises the operation of the subsystem 10 by communicating over a common data and control bus 38 with the interface 22, the data controller 28 and the read only program memory 34. The microprocessor controller 32 also coordinates and correlates head position and sector location with data in the buffer 26 by obtaining servo head position information from embedded sectors of the disk via the read/write channel 18 and logical block location information from the data controller 28, and thereupon controlling a servo control circuit 39 which in turn operates the actuator motor 17 in a manner described in the referenced co-pending patent application, Ser. No. 834,009, now U.S. Pat. No. 4,669,004, for example. When the correct data sector location is about to pass by the transducer 14, the microprocessor 32 signals the data controller 28, and the raw data block stored in the block buffer 26 passes in serial byte fashion through the data controller 28 wherein it is encoded and bit-serialized, and wherein an RS error correction code syndrome is generated in accordance with the principles of the present invention. The encoding and bit serializing process is described, for example, in a commonly assigned co-pending U.S. patent application, Ser. No. 850,850 filed on Apr. 11, 1986 and entitled "Integrated Encoder Decoder for Variable Length Zero Run Length Limited Codes", now U.S. Pat. No. 4,675,652.

As part of the encoding and decoding process carried out by the data controller 28, the data, whether it be raw data from the buffer 26, or data read from the storage disk 12 by the transducer 14, is passed through an error correction code syndrome generator 40 contained inside the data controller 28. This generator 40, depicted in overview in FIG. 3 and in structural detail in FIGS. 4A, 4B, 4C and 4D, calculates Reed-Solomon ECC syndrome bytes for the three interleaves depicted in FIG. 1 and appends them to the data stream during disk write operations. The particular Galois Field for this preferred RS generator 40 is generated by the following Galois field $GF(2^8)$ field generator polynomial:

$$x^8 + x^4 + x^3 + x^2 + 1$$

and wherein the first term thereof is:

$$X^5 + x^3 + x + 1 \text{ (or 00101011 binary)}.$$

The syndrome bytes are generated in the generator 40 by the following symmetric syndrome generator polynomial:

$$X^4 + Alpha^{18}X^3 + Alpha^{87}X^2 + Alpha^{18}X + 1.$$

This syndrome generator polynomial is constructed around the Galois Field $GF(2^8)$ described immediately above.

During disk read operations, the same generator 40 receives the data read from the data surface and calculates Reed-Solomon syndromes for the three interleaves depicted in FIG. 1. The calculation goes on during the transit of the entire block of data between the data surface 12 and the buffer memory 26. At the end of the data controller process for the particular data block, it is now temporarily stored in the buffer memory 26, and the twelve ECC syndrome bytes are latched in twelve single byte latches of the generator 40. Due to the very nature of the particular Reed-Solomon code (described hereinafter) employed in the system 10, at the end of the block read operation, if there are no errors in the recovered data block, all of the syndrome values in the twelve register locations therein will be zero. This no-error/error binary condition is present on a line 127 and its state is then tested by the microprocessor 32. In the event of a tested no-error condition, the microprocessor 32 thereupon commands the data controller 28 to send the present block (sector) through the interface 22 to the host 20 and obtain the next data block in proper logical order from the data surface 12.

In the event that one or more of the twelve syndrome bytes in the twelve register locations are not equal to zero at the end of the data block, an error condition has been detected, and this condition is tested and known by the microprocessor 32. It may command a retry in order to avoid error correction code processing of soft (non-recurrent) errors. Assuming a hard error, the microprocessor 32 then suspends data transfer operations and calls its error correction processing routines and values (such as the Table 1 and Table 2 values hereinafter) which are stored in the read only memory 34.

First, the twelve values held in the twelve syndrome byte registers of the generator 40 are sequenced onto the control bus 38 and loaded into internal registers of the microprocessor 32.

Second, these values are processed in accordance with error location and correction algorithms contained in error correction program routines executed by the microprocessor 32 in order to determine the location of the error and in order to determine the byte value correction in accordance with the error correction coding scheme. These routines are set forth in the source code listing presented hereinafter, reference to which is made for further particulars.

Once the location of the byte in error is discovered, that byte is obtained by the microprocessor 32 from the buffer 26 via special registers of the data controller 28. The microprocessor 32 analyzes the suspect byte and corrects it in accordance with the results of the calculations it has carried out. The corrected byte is then sent back over the control bus 38 and through the data controller 28 to its proper place in the buffer 26.

The calculations performed by the microprocessor 32 upon the syndrome bytes obtained from the generator 40 determine if the error has been successfully corrected or is detectable but uncorrectable. Upon determining that a successful correction has been carried out, the microprocessor 32 commands normal data transfer operations to resume. If an error remains, the microprocessor 32 may command that the data be reread from the data surface, and the correction process repeated. If an error is detectable but is not correctable (as in the case of multiple errors within a single interleave), an appropriate error message is generated and signalled from the microprocessor 32 to the host 20 over the interface 22.

Table 1 which follows sets forth the log table Galois field GF($2^8$) which is used by the generator 40 and which is stored in the read only program memory 34 and used by the microprocessor 32 in executing its program routines for locating and correcting errors.

| | | | | | | | | |
|---|---|---|---|---|---|---|---|---|
| 01[001] = | A^00[000] | 38[056] = | A^DE[222] | 6F[111] = | A^D4[212] | A6[166] = | A^54[084] | DD[221] = | A^99[153] |
| 02[002] = | A^3E[062] | 39[057] = | A^71[113] | 70[112] = | A^1D[029] | A7[167] = | A^D7[215] | DE[222] = | A^13[019] |
| 03[003] = | A^14[020] | 3A[058] = | A^30[048] | 71[113] = | A^DA[218] | A8[168] = | A^03[003] | DF[223] = | A^E1[225] |
| 04[004] = | A^7C[124] | 3B[059] = | A^2D[045] | 72[114] = | A^AF[175] | A9[169] = | A^D2[210] | E0[224] = | A^5B[091] |
| 05[005] = | A^28[040] | 3C[060] = | A^B8[184] | 73[115] = | A^A8[168] | AA[170] = | A^B6[182] | E1[225] = | A^A3[163] |
| 06[006] = | A^52[082] | 3D[061] = | A^6F[111] | 74[116] = | A^6E[110] | AB[171] = | A^47[071] | E2[226] = | A^19[025] |
| 07[007] = | A^24[036] | 3E[062] = | A^B7[183] | 75[117] = | A^1B[027] | AC[172] = | A^7D[125] | E3[227] = | A^CA[202] |
| 08[008] = | A^BA[186] | 3F[063] = | A^5C[092] | 76[118] = | A^6B[107] | AD[173] = | A^45[069] | E4[228] = | A^ED[237] |
| 09[009] = | A^38[056] | 40[064] = | A^75[117] | 77[119] = | A^74[116] | AE[174] = | A^32[050] | E5[229] = | A^17[023] |
| 0A[010] = | A^66[102] | 41[065] = | A^70[112] | 78[120] = | A^F6[246] | AF[175] = | A^95[149] | E6[230] = | A^E6[230] |
| 0B[011] = | A^DD[221] | 42[066] = | A^CB[203] | 79[121] = | A^8B[139] | B0[176] = | A^D6[214] | E7[231] = | A^B1[177] |
| 0C[012] = | A^90[144] | 43[067] = | A^D3[211] | 7A[122] = | A^AD[173] | B1[177] = | A^E8[232] | E8[232] = | A^AC[172] |
| 0D[013] = | A^49[073] | 44[068] = | A^CC[204] | 7B[123] = | A^D1[209] | B2[178] = | A^4D[077] | E9[233] = | A^91[145] |
| 0E[014] = | A^62[098] | 45[069] = | A^BB[187] | 7C[124] = | A^F5[245] | B3[179] = | A^93[147] | EA[234] = | A^59[089] |
| 0F[015] = | A^3C[060] | 46[070] = | A^AB[171] | 7D[125] = | A^15[021] | B4[180] = | A^DC[220] | EB[235] = | A^23[035] |
| 10[016] = | A^F8[248] | 47[071] = | A^83[131] | 7E[126] = | A^9A[154] | B5[181] = | A^36[054] | EC[236] = | A^A9[169] |
| 11[017] = | A^50[080] | 48[072] = | A^F2[242] | 7F[127] = | A^27[039] | B6[182] = | A^9C[156] | ED[237] = | A^72[114] |
| 12[018] = | A^76[118] | 49[073] = | A^F4[244] | 80[128] = | A^B3[179] | B7[183] = | A^6A[106] | EE[238] = | A^B2[178] |
| 13[019] = | A^67[103] | 4A[074] = | A^FE[254] | 81[129] = | A^3B[059] | B8[184] = | A^18[024] | EF[239] = | A^46[070] |
| 14[020] = | A^A4[164] | 4B[075] = | A^85[133] | 82[130] = | A^AE[174] | B9[185] = | A^96[150] | F0[240] = | A^35[053] |
| 15[021] = | A^48[072] | 4C[076] = | A^E3[227] | 83[131] = | A^0E[014] | BA[186] = | A^DB[219] | F1[241] = | A^4E[078] |
| 16[022] = | A^1C[028] | 4D[077] = | A^41[065] | 84[132] = | A^0A[010] | BB[187] = | A^2E[046] | F2[242] = | A^C9[201] |
| 17[023] = | A^5D[093] | 4E[078] = | A^44[068] | 85[133] = | A^1F[031] | BC[188] = | A^43[067] | F3[243] = | A^A6[166] |
| 18[024] = | A^CE[195] | 4F[079] = | A^11[017] | 86[134] = | A^12[018] | BD[189] = | A^80[129] | F4[244] = | A^EB[235] |
| 19[025] = | A^EC[236] | 50[080] = | A^21[033] | 87[135] = | A^29[041] | BE[190] = | A^CD[205] | F5[245] = | A^2A[042] |
| 1A[026] = | A^87[135] | 51[081] = | A^92[146] | 88[136] = | A^0B[011] | BF[191] = | A^63[099] | F6[246] = | A^10[016] |
| 1B[027] = | A^4C[076] | 52[082] = | A^FB[251] | 89[137] = | A^FD[253] | C0[192] = | A^89[137] | F7[247] = | A^68[104] |
| 1C[028] = | A^A0[160] | 53[083] = | A^16[022] | 8A[138] = | A^F9[249] | C1[193] = | A^F0[240] | F8[248] = | A^34[052] |
| 1D[029] = | A^F1[241] | 54[084] = | A^C4[196] | 8B[139] = | A^F9[159] | C2[194] = | A^4A[074] | F9[249] = | A^08[008] |
| 1E[030] = | A^7A[122] | 55[085] = | A^78[120] | 8C[140] = | A^E9[233] | C3[195] = | A^84[132] | FA[250] = | A^53[083] |
| 1F[031] = | A^79[121] | 56[086] = | A^3F[063] | 8D[141] = | A^E5[229] | C4[196] = | A^7E[126] | FB[251] = | A^E4[228] |
| 20[032] = | A^37[055] | 57[087] = | A^F3[243] | 8E[142] = | A^C1[193] | C5[197] = | A^E7[231] | FC[252] = | A^D8[216] |
| 21[033] = | A^8D[141] | 58[088] = | A^98[152] | 8F[143] = | A^D5[213] | C6[198] = | A^DF[223] | FD[253] = | A^73[115] |
| 22[034] = | A^8E[142] | 59[089] = | A^0F[015] | 90[144] = | A^31[049] | C7[199] = | A^B0[176] | FE[254] = | A^65[101] |
| 23[035] = | A^6D[109] | 5A[090] = | A^9E[158] | 91[145] = | A^1E[030] | C8[200] = | A^A7[167] | FF[255] = | A^8C[140] |
| 24[036] = | A^B4[180] | 5B[091] = | A^5E[094] | 92[146] = | A^33[051] | C9[201] = | A^97[151] | | |
| 25[037] = | A^C0[192] | 5C[092] = | A^D9[217] | 93[147] = | A^EE[238] | CA[202] = | A^BF[191] | | |
| 26[038] = | A^A5[165] | 5D[093] = | A^9D[157] | 94[148] = | A^3D[061] | CB[203] = | A^61[097] | | |
| 27[039] = | A^06[006] | 5E[094] = | A^05[005] | 95[149] = | A^BC[188] | CC[204] = | A^E0[224] | | |
| 28[040] = | A^E2[226] | 5F[095] = | A^8F[143] | 96[150] = | A^C3[195] | CD[205] = | A^EA[234] | | |
| 29[041] = | A^BD[189] | 60[096] = | A^4B[073] | 97[151] = | A^26[038] | CE[206] = | A^FC[252] | | |
| 2A[042] = | A^86[134] | 61[097] = | A^0C[012] | 98[152] = | A^22[034] | CF[207] = | A^CF[207] | | |
| 2B[043] = | A^01[001] | 62[098] = | A^40[064] | 99[153] = | A^88[136] | D0[208] = | A^42[066] | | |
| 2C[044] = | A^5A[090] | 63[099] = | A^A1[161] | 9A[154] = | A^7F[127] | D1[209] = | A^25[037] | | |
| 2D[045] = | A^60[096] | 64[100] = | A^69[105] | 9B[155] = | A^C2[194] | D2[210] = | A^58[088] | | |
| 2E[046] = | A^9B[155] | 65[101] = | A^81[129] | 9C[156] = | A^82[130] | D3[211] = | A^EF[239] | | |
| 2F[047] = | A^C6[198] | 66[102] = | A^A2[162] | 9D[157] = | A^C7[199] | D4[212] = | A^F7[247] | | |
| 30[048] = | A^0D[013] | 67[103] = | A^BE[190] | 9E[158] = | A^4F[079] | D5[213] = | A^2C[044] | | |
| 31[049] = | A^02[002] | 68[104] = | A^04[004] | 9F[159] = | A^2F[047] | D6[214] = | A^AA[170] | | |
| 32[050] = | A^2B[043] | 69[105] = | A^1A[026] | A0[160] = | A^5F[095] | D7[215] = | A^55[085] | | |
| 33[051] = | A^64[100] | 6A[106] = | A^B9[185] | A1[161] = | A^51[081] | D8[216] = | A^07[007] | | |
| 34[052] = | A^C5[197] | 6B[107] = | A^6C[108] | A2[162] = | A^D0[208] | D9[217] = | A^57[087] | | |
| 35[053] = | A^7B[123] | 6C[108] = | A^C8[200] | A3[163] = | A^20[032] | DA[218] = | A^94[148] | | |
| 36[053] = | A^8A[138] | 6D[109] = | A^56[086] | A4[164] = | A^3A[058] | DB[219] = | A^09[009] | | |
| 37[055] = | A^FA[250] | 6E[110] = | A^39[057] | A5[165] = | A^B5[181] | DC[220] = | A^77[119] | | |

In Table 1, A represents Alpha to the power which follows it. The numbers to the left of the equal sign equal the Alpha value to the left thereof, first in Hex, and then in decimal values enclosed by the brackets.

Table 2 which follows sets forth the anti-log table Galois field GF($2^8$) which is stored in the program read only memory 34 and used by the microprocessor 32 in executing its program routines for locating and correcting errors, based on non-zero syndrome bytes.

| | | | | | |
|---|---|---|---|---|---|
| A^00[000] = 01[001] | A^37[055] = 20[032] | A^6E[110] = 74[116] | A^A5[165] = 26[038] | A^DC[220] = B4[180] |
| A^01[001] = 2B[043] | A^38[056] = 09[009] | A^6F[111] = 3D[064] | A^A6[166] = F3[243] | A^DD[221] = 0B[011] |
| A^02[002] = 31[049] | A^39[057] = 6E[110] | A^70[112] = 41[065] | A^A7[167] = C8[200] | A^DE[222] = 38[056] |
| A^03[003] = A8[168] | A^3A[058] = A4[164] | A^71[113] = 39[057] | A A8[168] = 73[115] | A^DF[223] = C6[198] |
| A^04[004] = 68[104] | A^3B[059] = 81[129] | A^72[114] = ED[237] | A^A9[169] = EC[236] | A^E0[224] = CC[204] |
| A^05[005] = 5E[094] | A^3C[060] = 0F[015] | A^73[115] = FD[253] | A^AA[170] = D6[214] | A^E1[225] = DF[223] |
| A^06[006] = 27[039] | A^3D[061] = 94[148] | A^74[116] = 77[119] | A^AB[171] = 46[070] | A^E2[226] = 28[040] |
| A^07[007] = D8[216] | A^3E[062] = 02[002] | A^75[117] = 40[064] | A^AC[172] = E8[232] | A^E3[227] = 4C[076] |
| A^08[008] = F9[249] | A^3F[063] = 56[086] | A^76[118] = 12[018] | A^AD[173] = 7A[122] | A^E4[228] = FB[251] |
| A^09[009] = DB[219] | A^40[064] = 62[098] | A^77[119] = DC[220] | A^AE[174] = 82[130] | A^E5[229] = 8D[141] |
| A^0A[010] = 84[132] | A^41[065] = 4D[077] | A^78[120] = 55[085] | A^AF[175] = 72[114] | A^E6[230] = E6[230] |
| A^0B[011] = 88[136] | A^42[066] = D0[208] | A^79[121] = 1F[031] | A^B0[176] = C7[199] | A^E7[231] = C5[197] |
| A^0C[012] = 61[097] | A^43[067] = BC[188] | A^7A[122] = 1E[030] | A^B1[177] = E7[231] | A^E8[232] = B1[177] |
| A^0D[013] = 30[048] | A^44[068] = 4E[078] | A^7B[123] = 35[053] | A^B2[178] = EE[238] | A^E9[233] = 8C[140] |
| A^0E[014] = 83[133] | A^45[069] = AD[173] | A^7C[124] = 04[004] | A^B3[179] = 80[128] | A^EA[234] = CD[205] |
| A^0F[015] = 59[089] | A^46[070] = EF[239] | A^7D[125] = AC[172] | A^B4[180] = 24[036] | A^EB[235] = F4[244] |
| A^10[016] = F6[246] | A^47[071] = AB[171] | A^7E[126] = C4[196] | A^B5[181] = A5[165] | A^EC[236] = 19[025] |
| A^11[017] = 4F[079] | A^48[072] = 15[021] | A^7F[127] = 9A[145] | A^B6[182] = AA[170] | A^ED[237] = E4[228] |
| A^12[018] = 86[134] | A^49[073] = 0D[013] | A^80[128] = BD[189] | A^B7[183] = 3E[062] | A^EE[238] = 93[147] |
| A^13[019] = DE[222] | A^4A[074] = C2[194] | A^81[129] = 65[101] | A^B8[184] = 3C[060] | A^EF[239] = D3[211] |
| A^14[020] = 03[003] | A^4B[075] = 60[096] | A^82[130] = 9C[156] | A^B9[185] = 6A[106] | A^F0[240] = C1[193] |
| A^15[021] = 7D[125] | A^4C[076] = 1B[027] | A^83[131] = 47[071] | A^BA[186] = 08[008] | A^F1[241] = 1D[029] |
| A^16[022] = 53[083] | A^4D[077] = B2[178] | A^84[132] = C3[195] | A^BB[187] = 45[069] | A^F2[242] = 48[072] |
| A^17[023] = E5[229] | A^4E[078] = F1[241] | A^85[133] = 4B[074] | A^BC[188] = 95[149] | A^F3[243] = 57[087] |
| A^18[024] = B8[184] | A^4F[079] = 9E[158] | A^86[134] = 2A[042] | A^BD[189] = 29[041] | A^F4[244] = 49[073] |
| A^19[025] = E2[226] | A^50[080] = 11[017] | A^87[135] = 1A[026] | A^BE[190] = 67[103] | A^F5[245] = 7C[124] |
| A^1A[026] = 69[105] | A^51[081] = A1[161] | A^88[136] = 99[153] | A^BF[191] = CA[202] | A^F6[246] = 78[120] |
| A^1B[027] = 75[117] | A^52[082] = 06[006] | A^89[137] = C0[192] | A^C0[192] = 25[037] | A^F7[247] = D4[212] |
| A^1C[028] = 16[022] | A^53[083] = FA[250] | A^8A[138] = 36[054] | A^C1[193] = 8E[141] | A^F8[248] = 10[016] |
| A^1D[029] = 70[112] | A^54[084] = A6[166] | A^8B[139] = 79[121] | A^C2[194] = 9B[155] | A^F9[249] = 8A[138] |
| A^1E[030] = 91[145] | A^55[085] = D7[215] | A^8C[140] = FF[ ] | A^C3[195] = 96[150] | A^FA[250] = 37[055] |
| A^1F[031] = 85[113] | A^56[086] = 6D[109] | A^8D[141] = 21[033] | A^C4[196] = 54[083] | A^FB[251] = 52[082] |
| A^20[032] = A3[163] | A^57[087] = D9[217] | A^8E[142] = 22[034] | A^C5[197] = 34[052] | A^FC[252] = CE[206] |
| A^21[033] = 50[080] | A^58[088] = D2[210] | A^8F[143] = 5F[095] | A^C6[198] = 2F[047] | A^FD[253] = 89[237] |
| A^22[034] = 98[152] | A^59[089] = EA[234] | A^90[144] = 0C[012] | A^C7[199] = 9D[157] | A^FE[254] = 4A[074] |
| A^23[035] = EB[235] | A^5A[090] = 2C[044] | A^91[145] = E9[233] | A^C8[200] = 6C[108] | |
| A^24[036] = 07[007] | A^5B[091] = E0[224] | A^92[146] = 51[081] | A^C9[201] = F2[242] | |
| A^25[037] = D1[209] | A^5C[092] = 3F[063] | A^93[147] = B3[179] | A^CA[202] = E3[227] | |
| A^26[038] = 97[151] | A^5D[093] = 17[023] | A^94[148] = DA[218] | A^CB[203] = 42[066] | |
| A^27[039] = 7F[127] | A^5E[094] = 5B[091] | A^95[149] = AF[175] | A^CC[204] = 44[068] | |
| A^28[040] = 05[005] | A^5F[095] = A0[160] | A^96[150] = B9[185] | A^CD[205] = BE[190] | |
| A^29[041] = 87[135] | A^60[096] = 2D[045] | A^97[151] = C9[201] | A^CE[206] = 18[024] | |
| A^2A[042] = F5[245] | A^61[097] = CB[203] | A^98[152] = 58[088] | A^CF[207] = CF[207] | |
| A^2B[043] = 32[050] | A^62[098] = 0E[014] | A^99[153] = DD[221] | A^D0[208] = A2[162] | |
| A^2C[044] = D5[213] | A^63[099] = BF[191] | A^9A[154] = FE[126] | A^D1[209] = 7B[123] | |
| A^2D[045] = 3B[059] | A^64[100] = 33[051] | A^9B[155] = 2E[076] | A^D2[210] = A9[169] | |
| A^2E[046] = BB[187] | A^65[101] = FE[254] | A^9C[156] = B6[182] | A^D3[211] = 43[067] | |
| A^2F[047] = 9F[159] | A^66[102] = 0A[010] | A^9D[157] = 5D[093] | A^D4[212] = 6F[111] | |
| A^30[048] = 3A[058] | A^67[103] = 13[019] | A^9E[158] = 5A[090] | A^D5[213] = 8F[143] | |
| A^31[049] = 90[144] | A^68[104] = F7[247] | A^9F[159] = 8B[139] | A^D6[214] = B0[176] | |
| A^32[050] = AE[174] | A^69[105] = 64[100] | A^A0[160] = 1C[028] | A^D7[215] = A7[167] | |
| A^33[051] = 92[146] | A^6A[106] = B7[183] | A^A1[161] = 63[099] | A^D8[216] = FC[252] | |
| A^34[052] = F8[248] | A^6B[107] = 76[118] | A^A2[162] = 66[102] | A^D9[217] = 5C[092] | |
| A^35[053] = F0[240] | A^6C[108] = 6B[107] | A^A3[163] = E1[225] | A^DA[218] = 71[113] | |
| A^36[054] = B5[181] | A^6D[109] = 23[035] | A^A4[164] = 14[020] | A^DB[219] = BA[186] | |

In Table 2, A represents Alpha to the power which follows it. The numbers to the right of the equal sign equal the Alpha value to the left thereof, first in Hex, and then in decimal values enclosed by the brackets.

Figure 3:
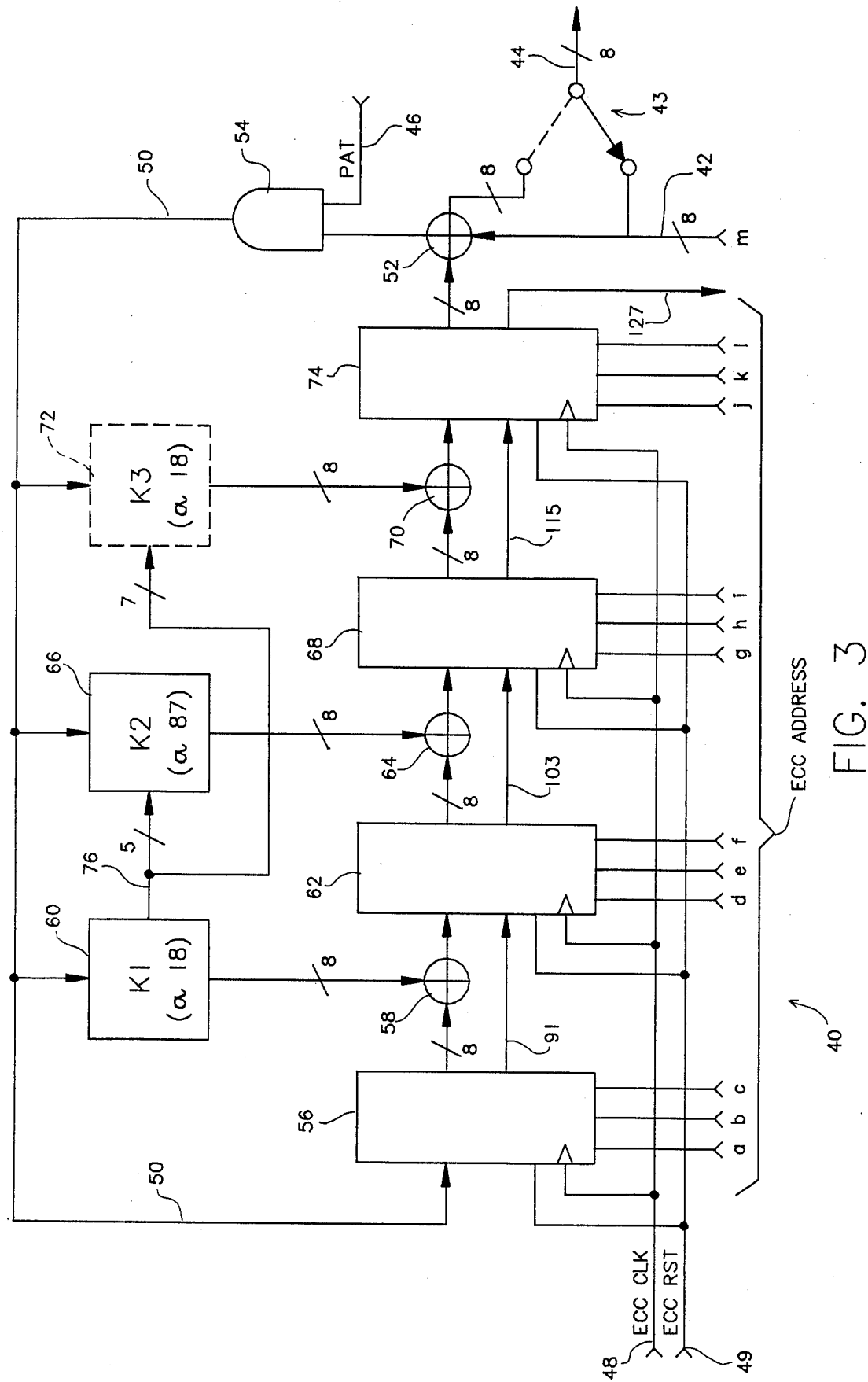
FIG. 3 is a detailed block diagram of an error correction code syndrome generator and detector included within the data controller element depicted in FIG. 2.

The error correction code syndrome generator 40, depicted in overview in FIG. 3 and in structural and electrical detail in the FIGS. 4a–i schematic. The generator 40 computes a byte-based syndrome or remainder based upon a Reed-Solomon polynomial. A four byte syndrome is calculated for each interleave row depicted in FIG. 1. Thus, the generator processes incoming data bytes in groups of three.

Conceptually, the multipliers 60, 66, 72 of the syndrome generator 40 function as three table look-up read only memories: each maps eight bits in to eight bits out. However, by use of a symmetrical Reed-Solomon code with minimized logic equations, instead of three read only memories, the circuitry 40 has been compacted so that only fifty two exclusive OR gates are required, together with twelve data byte latches, and a syndrome recovery circuit. In fact, the multiplier 72 is not required to be implemented as its function is provided by the multiplier 60.

In the encode process, a block of eight bit data bytes in serial format is read out of the block buffer 26 over the data bus 24 and enters the syndrome generator via a selectable internal bus 42. The incoming data passes through an input/output multiplying junction 52 where it is multiplied by values already resident in the last latch 141 of the stage 74 of the generator 40.

An AND gate 54 enables the product of the incoming data and least stage data to be multiplied by zero and thereby have a zero value. By cycling zero values on an error correction feedback path 50 the multiplication function of the generator 40 may be halted.

The incoming data, as multiplied, then becomes a cyclically recirculating error correction code feedback byte stream on the path 50. The feedback bytes circulate to a three byte latch 56 and to three multipliers 60, 66 and 72. Three bytes are successively clocked into the latch 56 by clocking signals on an ECC clock line 48. As the three bytes are clocked sequentially through the latch 56 each is added in turn at a first summing junction 58 to the product generated by a first multiplier 60. The first multiplier multiplies the present byte value on the ECC feedback path 50 by a predetermined constant, Alpha 18 (which is B8 in HEX and 184 in decimal base). The resultant first sum values are then latched in turn into and through a second three byte latch 62.

The latched first sums clock through the second latch 62 in synchronism with the operations of the first latch 56, and each byte value is added in turn at a second summing junction 64 to a second product generated by a second multiplier 66. The second multiplier 66 multiplies the present byte value on the ECC feedback path 50 by a second predetermined constant, Alpha 87 (which is 1A in Hex and 026 in decimal notation). The resultant second sum values are then latched in turn into and through a third three byte latch 68.

The latched second sum values are clocked through the third latch 68 in synchronism with the operations of the first 56 and second 62 latches. Each byte value is summed in turn at a third summing junction 70 with a third product generated by a third multiplier 72. The third product is generated by multiplying the present byte value on the ECC feedback path with a predetermined constant. In the preferred embodiment 40 of the ECC syndrome generator, since the RS code is generated by a symmetrical generator polynomial, the product entering the third summing junction 70 is the same value as is calculated at the same time by the first multiplier 60 (present byte value times Alpha 18) Thus, in the preferred generator 40 there are no logic elements required for implementation of the multiplier 70 beyond those required for the first multiplier 60 (and the third multiplier 72 is thus shown in FIG. 3 in phantom). The resultant third sum values are then latched in turn into and through a fourth three byte latch 74.

The latched third sum values are then clocked through the fourth latch 74 in synchronism with the operations of the latches 56, 62, and 68. Each third sum value is added in turn at the input/output multiplying junction 52 to the incoming data on the internal bus 42. Thus, it is seen that the feedback signal on the line 50 is a function of incoming data summed with the third sum values. The entire byte stream of the data block recirculates cyclically through the syndrome generator 40 in accordance with its encoding algorithm, until the end of the block is reached.

As the last data byte of the current data block (byte number 511) has passed through the generator 40, the next twelve bytes comprise the error correction code syndrome bytes for this current data block, and they are present in the latches 56, 62, 68 and 74. The syndrome bytes are then clocked in turn through a two input, single output data bus multiplexer 43 and onto an output bus 44 inside the data controller 28 and thereby become appended to the end data block as it passes through the subsequent variable length, run length limited (e.g., 1, 7) encoding process carried out inside the data controller as, for example, in accordance with the disclosure of the referenced co-pending patent application Ser. No. 850,850. A block counter inside of the data controller 28 counts the number of bytes and switches the multiplexer 43 when 512 data bytes of the block have appeared on the bus 42.

With reference now to the specific implementation of the syndrome generator 40 as depicted in FIGS. 4a-i, each latch 56, 62, 68, and 74 is virtually identical with the others, and each summing junction 58, 64, 70 and 52 is virtually identical with the others. The first latch 56 and summing junction 58 depicted in FIGS. 4a, b and c will now be described in some detail, with the understanding being that this description applies to each of the other latches 62, 68 and 74 and summing junctions 64, 70 and 52. The multipliers 60, 66 and 72 are different and will be explained.

The eight bit lines of the error correction feedback path 50 enter eight inputs of an eight bit D register 130 configured as a latch. The register 130, as is true with all eleven other D registers 131, 132, 133, 134, 135, 136, 137, 138, 139, 140 and 141, is clocked by a clocking signal on the ECC clock line 48 and is reset by a reset signal on an ECC reset line 49. When the register 130 is clocked, the values appearing on the path 50 become latched internally and appear on an eight bit output bus 80 which leads to the next register 131 and which also leads to a tri-state bus buffer 81 and to a logic array 82. The logic array 82 is provided in order to test if all eight of the bit values are zero during data recovery from the disk and after a block of data and its twelve syndrome bytes have circulated through the syndrome generator. (When there is no error in the recovered data, the bit values on the bus 80 will be zero). This zero condition is fed forward to a ninth input of the next array 86 via a line 83. There are twelve zero-check arrays 82, 86, 90, 94, 98, 102, 106, 110, 114, 118, 122, and 126, each being associated respectively with registers 130 through 141. The output of each register feeds forward to a ninth input of the next register, so that the last register 126 accumulates the zero states of every preceding register, i.e. all preceding registers must be zero before the last register 126 can be zero, and it will be zero only if all bit positions of the last D register 141 with which it is associated are also zero when the test is made. In this manner, the single bit line 127 indicates the zero/non-zero status of the syndrome bytes.

In the event that an error is present and that one or more of the arrays 82, 86, 90, 94, 98, 102, 106, 110, 114, 118, 122, 126 has an output which is not zero, this condition will be detected by the microprocessor 32 by its periodic scanning of the control line 127; and it will thereupon collect all of the byte values present in each of the latches 130, 131, 132, 133, 134, 135, 136, 137, 138, 139, 140, 141 and 142, via its respective tri-state bus buffer/driver 81, 85, 89, 93, 97, 101, 105, 109, 113, 117, 121, and 125.

An output from the tri-state buffer 81 extends to the control bus 38. When the microprocessor 32 desires to examine the contents of the tri-state register 81, an address signal is delivered over an address line ADREG 36 to the register 81 and it causes it to latch the bit values present on the bus 80 and to push those values onto the control bus 38 where they are obtained by the microprocessor 32 and entered into one of its internal eight bit registers. A separate address line extends to each of the other tri-state buffers, and the microprocessor 32 enables each address line in a predetermined order, so that all of the byte values held in the twelve latches are delivered to the microprocessor 32 which thereupon uses these values to locate one or more errors in the data block and to correct those errors.

An output bus 84 of the next latch 131 extends to the inputs of a third latch 132 and to a tri-state bus buffer 85 and to a logic array 86 which has nine inputs, eight from the bus 84, and the output line 83 from the preceding logic array 82. If all of the bit values on the bus 84 and the bit value on the line 83 are zero, then the output line 87 of the array 86 is also zero.

An output bus 88 of the third latch extends to the first summing junction 58. The eight bit lines of the bus 88 connect to one of the two inputs of eight exclusive OR gates 150, 151, 152, 153, 154, 155, 156, and 157 which make up the first summing junction 58. Each of the other of the two inputs for each of the gates is a line leading from the first multiplier 60.

The first multiplier 60 multiplies the byte value on the feedback path by the predetermined constant ALPHA 18, to yield a first product value, and this first product is then applied to the other inputs of the eight gates 150–157 making up the first summing junction 58.

Figure 4A:
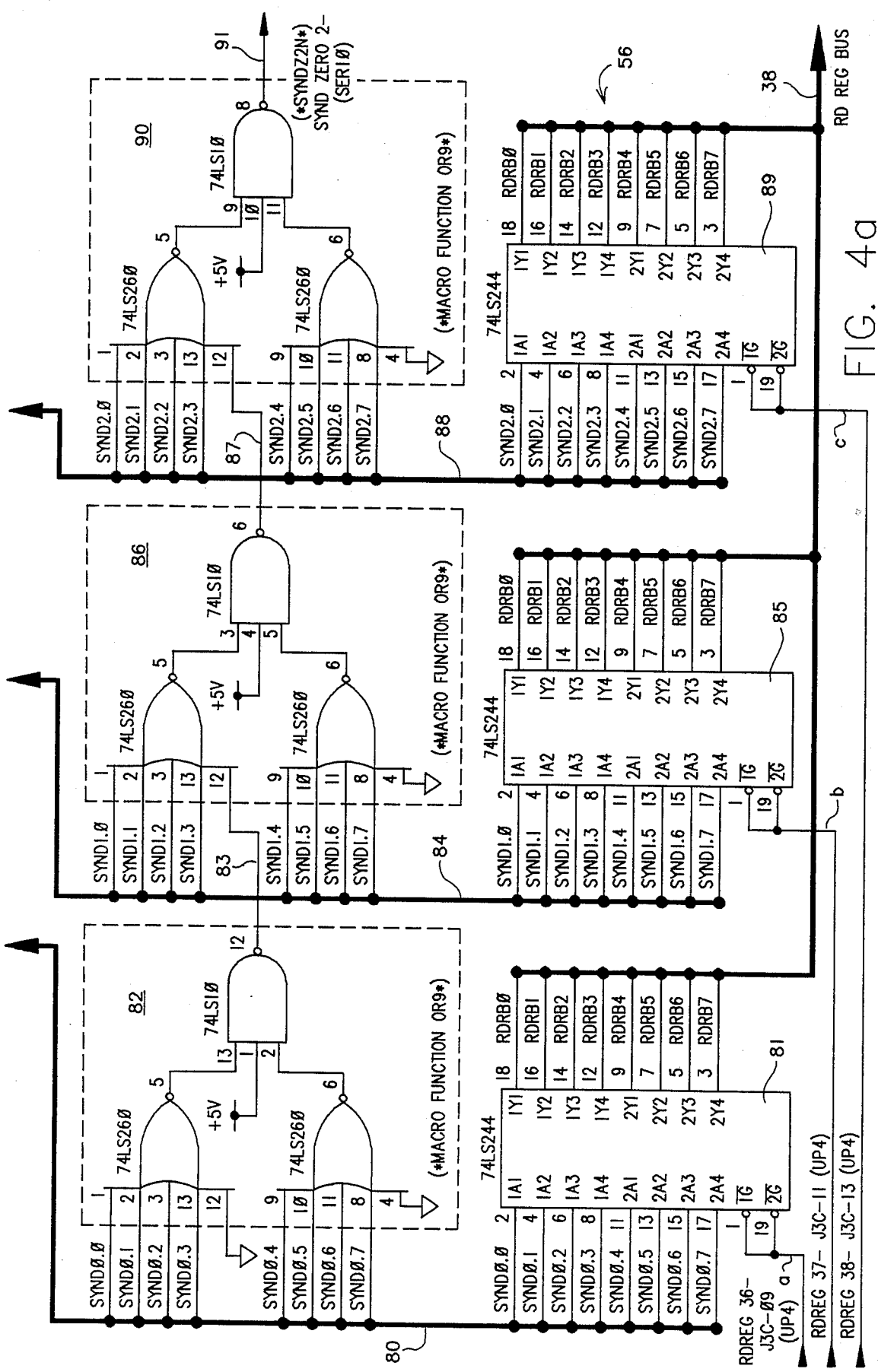
FIG. 4 is a layout diagram for a series of sheets of schematic circuit drawings of the error correction code syndrome generator and detector depicted in FIG. 3 and labelled FIGS. 4a, 4b, 4c, 4d, 4e, 4f, 4g, 4h, and 4i. These schematic circuit drawings should be arranged as shown in FIG. 4 and further arranged as four groups to be read from left to right, the first group being FIGS. 4a, 4b and 4c; the second group being FIGS. 4d and 4e; the third group being FIGS. 4f and 4g; and, the fourth group being FIGS. 4h and 4i. Signal buses extending throughout the FIG. 4 circuit bear the same reference numerals.
Figure 4B:
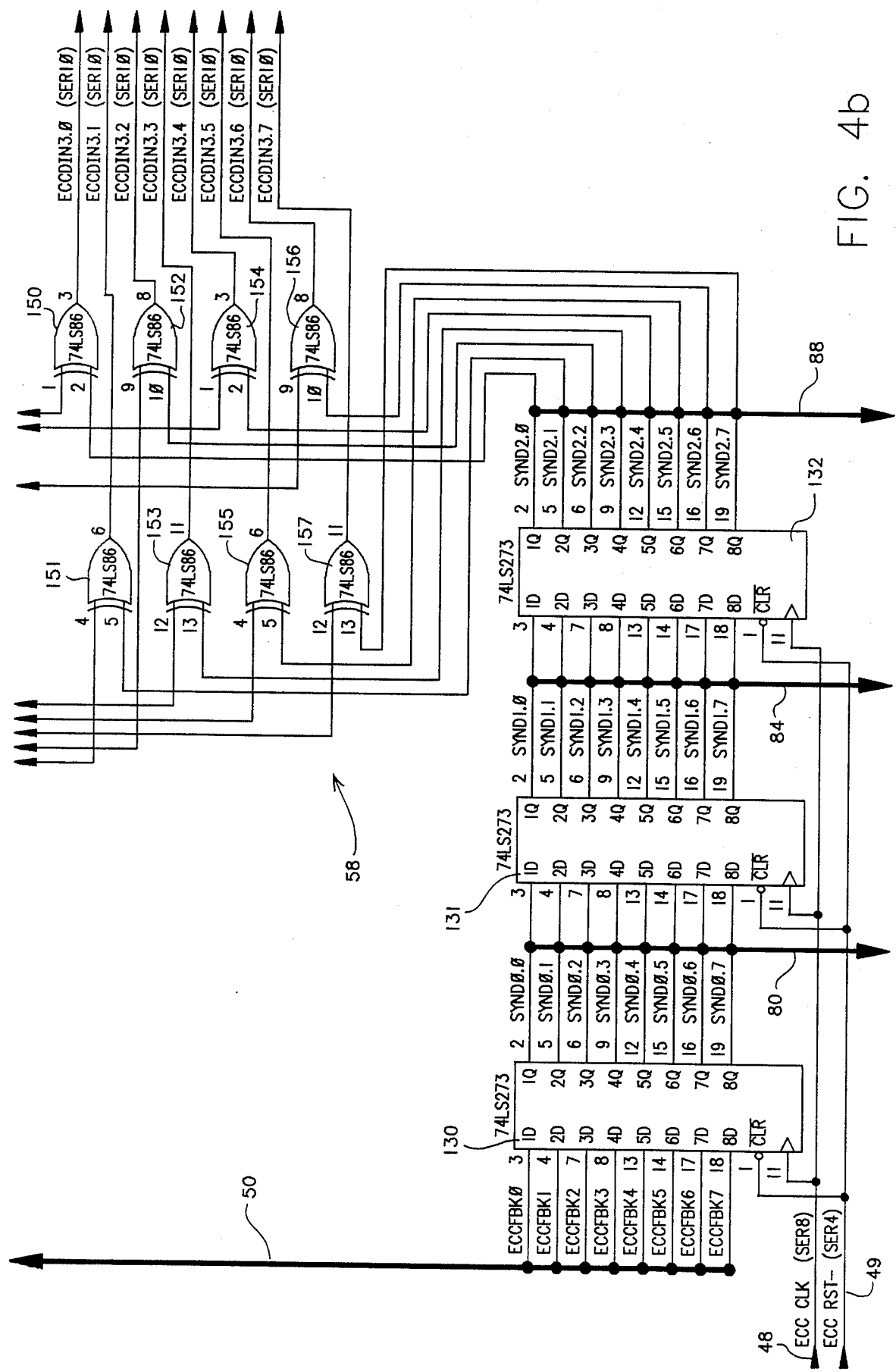
Figure 4C:
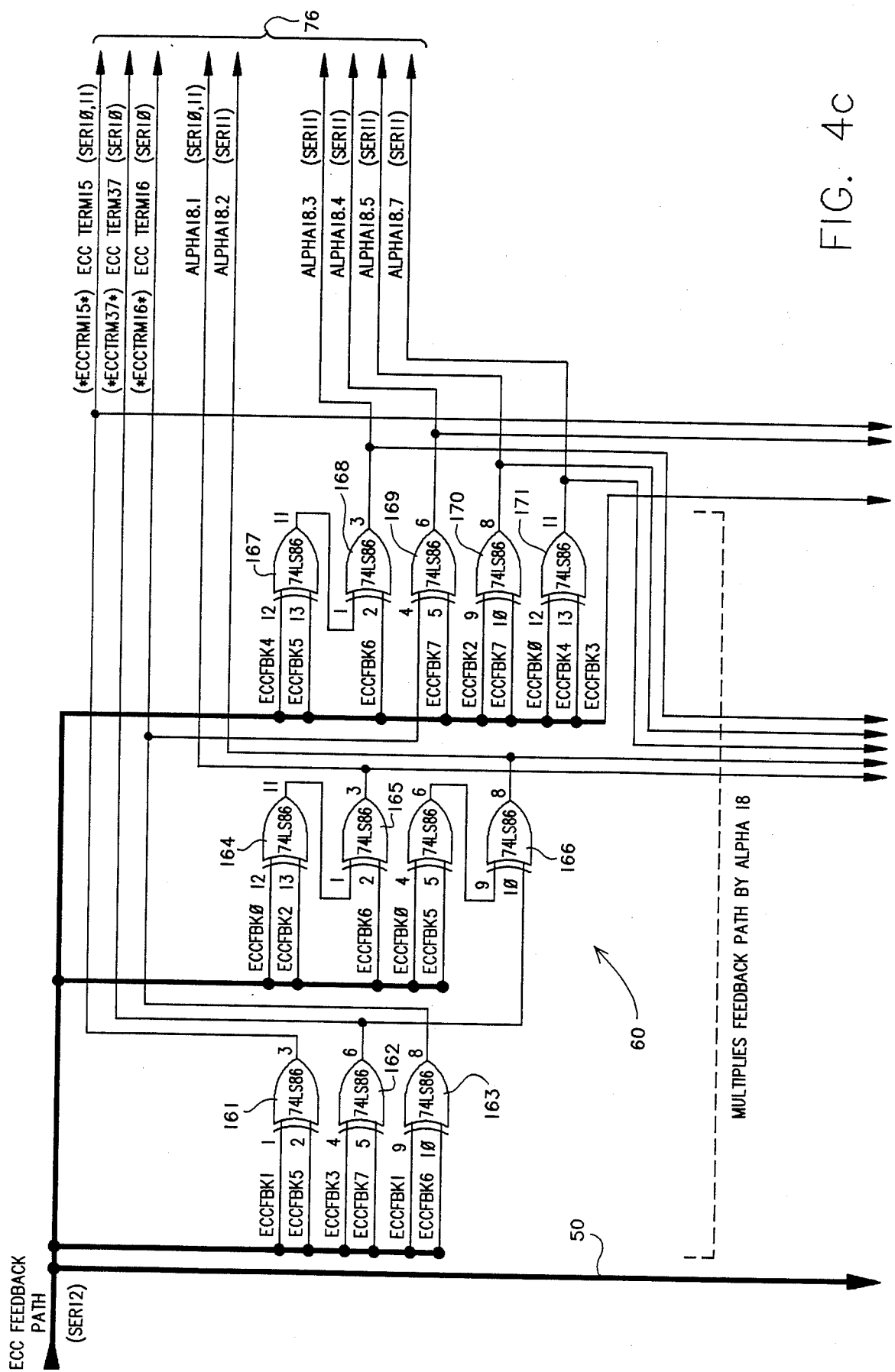

The first multiplier 60 includes 12 exclusive OR gates 161, 162, 163, 164, 165, 166, 167, 168, 169, 170, and 171, connected as shown in FIGS. 4b and c. Single bit values are generated and sent out over the nine bit lines comprising the bus 76, five of them leading to the second multiplier 66 and seven of them leading to the third multiplier 72. Eight selected single bit values are applied to the first summing junction 58 in the arrangement shown in FIG. 4b, the bit value entering the Exclusive-OR 156 coming directly from the third bit position of the ECC feedback path 50, rather than the multiplier 60. The same eight bit lines connect to the third summing junction 70 as shown in FIG. 4g, thereby avoiding the need for any circuitry for the third multiplier 72 in this preferred embodiment 40.

Figure 4D:
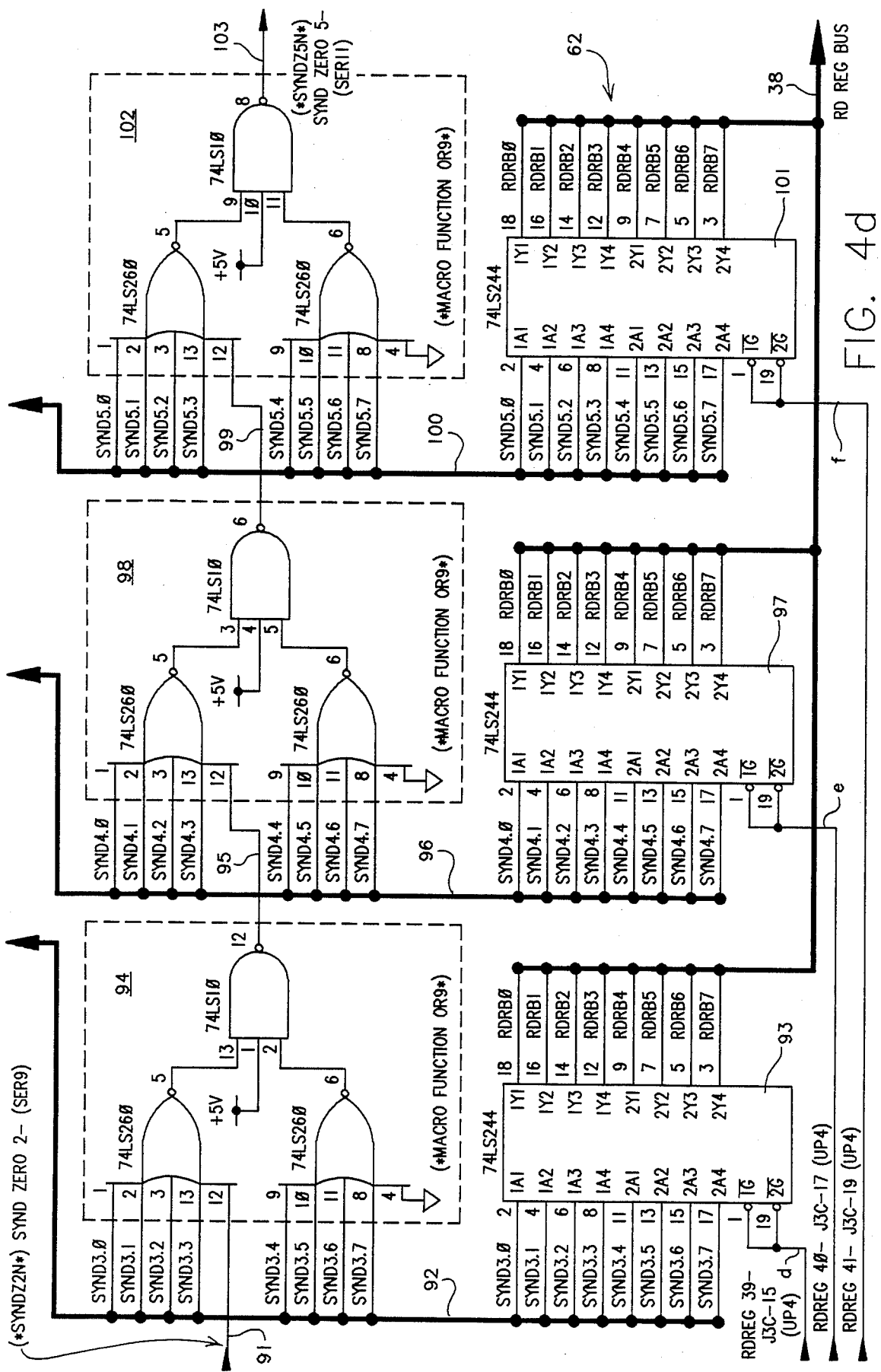
Figure 4E:
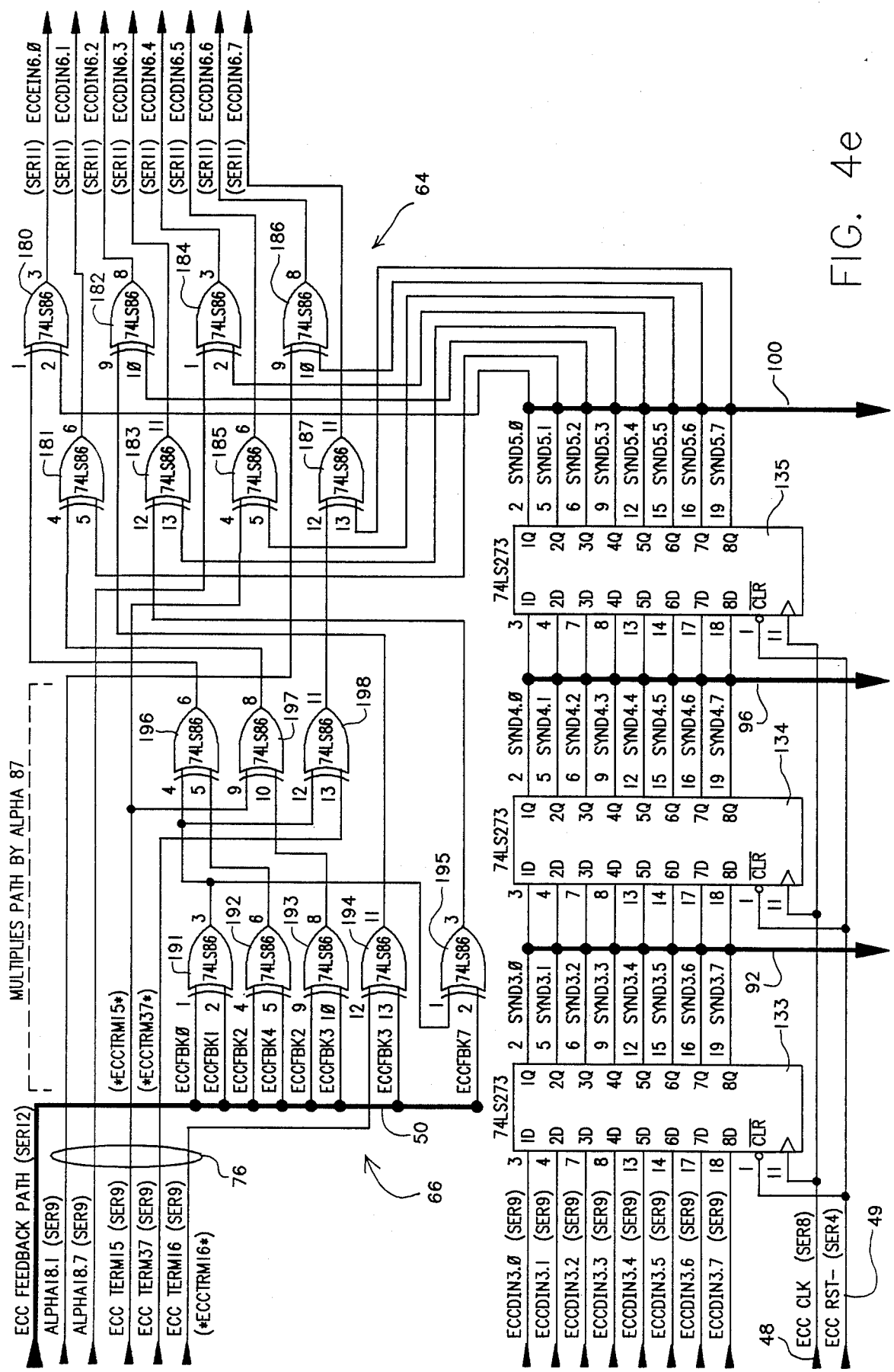
Figure 4F:
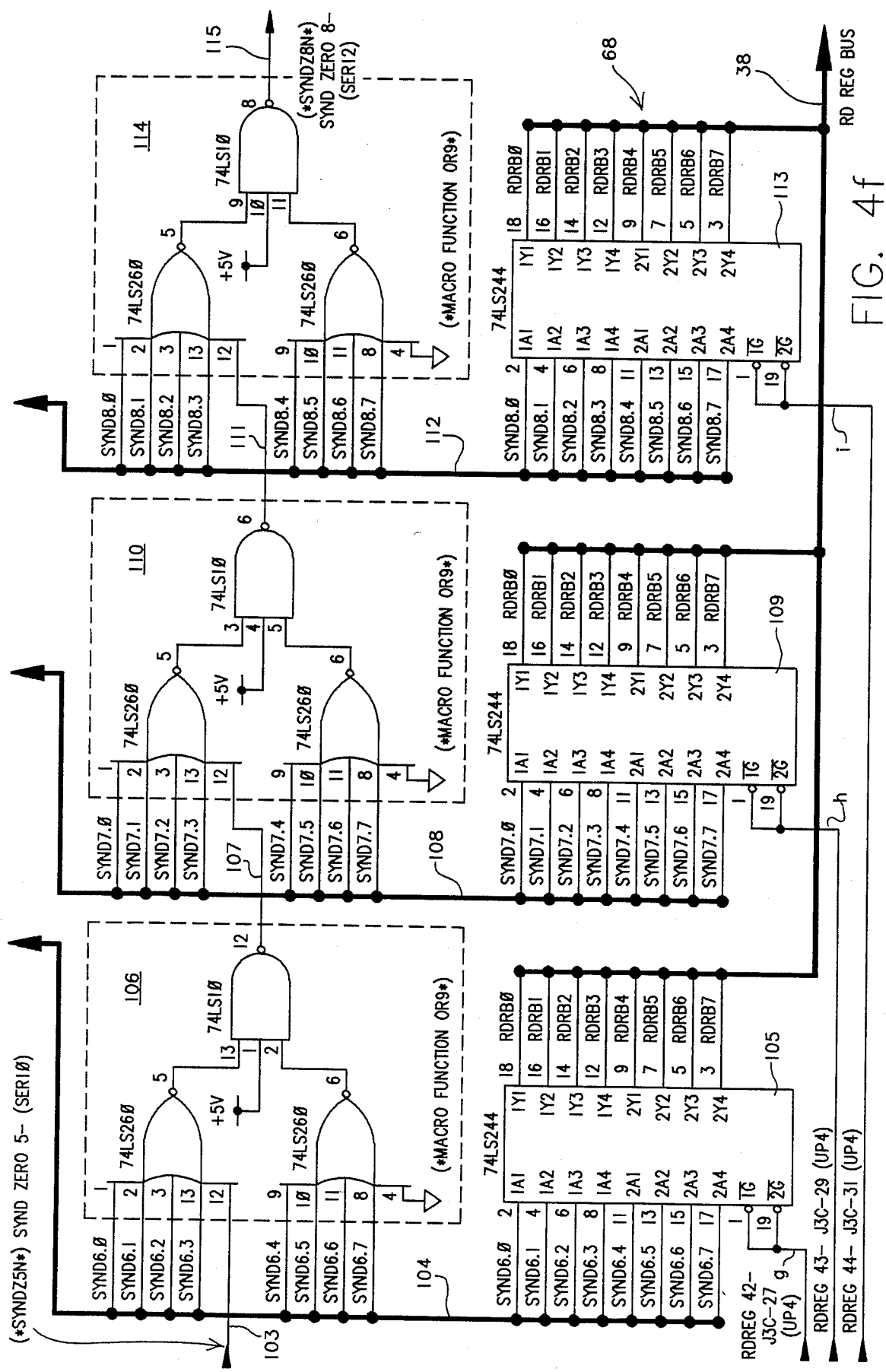

The second latch 62, second multiplier 66 and second summing junction are depicted in FIGS. 4d and e. The second multiplier 66 includes eight exclusive OR gates 191, 192, 193, 194, 195, 196, 197 and 198, each having its two inputs connected to the ECC feedback bus 50 and to the bus 76 in a connection arrangement as shown in FIG. 4e. The multiplier 66 multiplies each byte value on the ECC feedback path 50 by a constant, ALPHA 87, to yield the second product, and this eight bit value is applied to the other inputs of eight exclusive OR gates 180, 181, 182, 183, 184, 185, 186, and 187, making up the second summing junction 64.

Figure 4G:
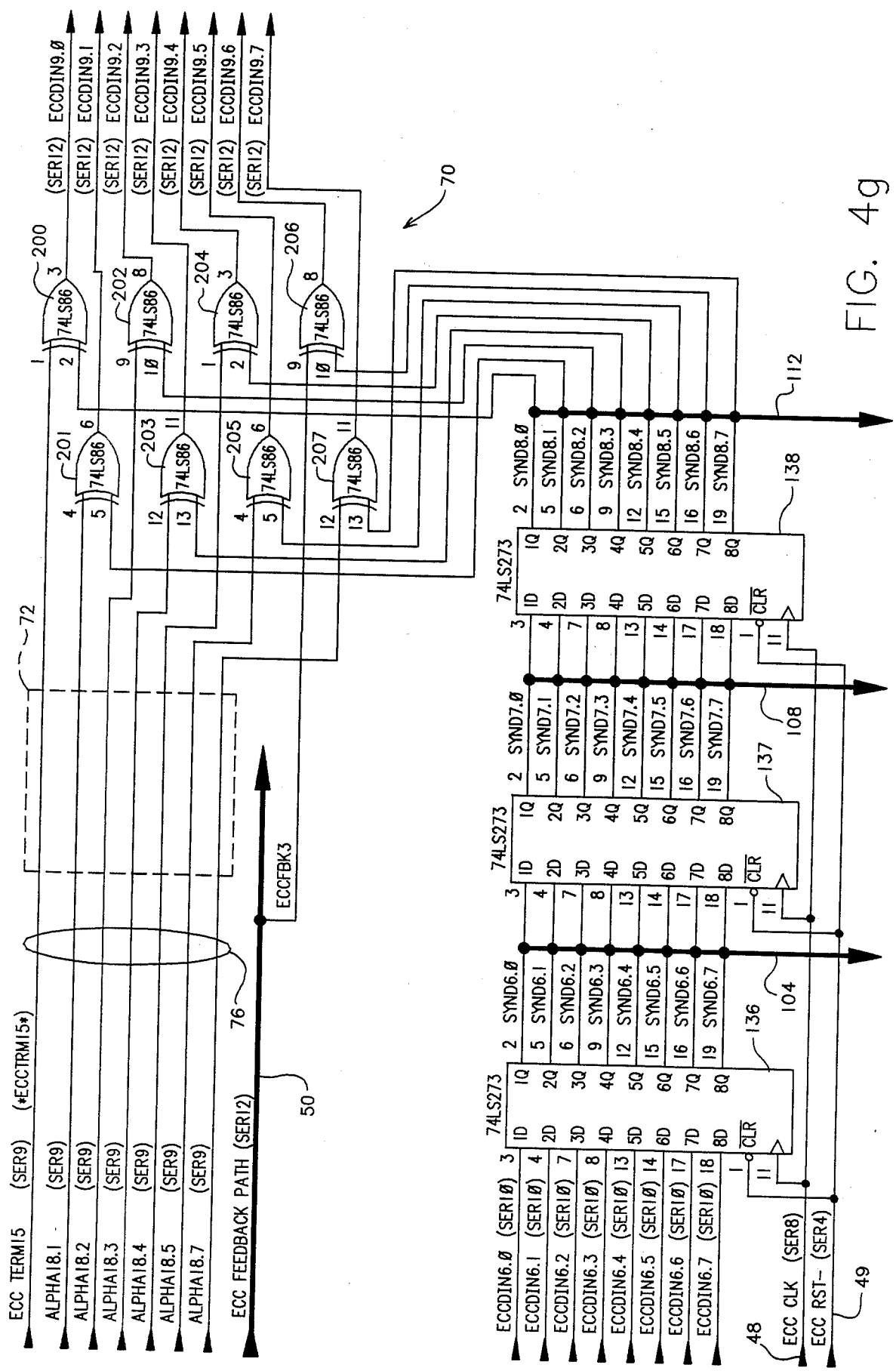
Figure 4H:
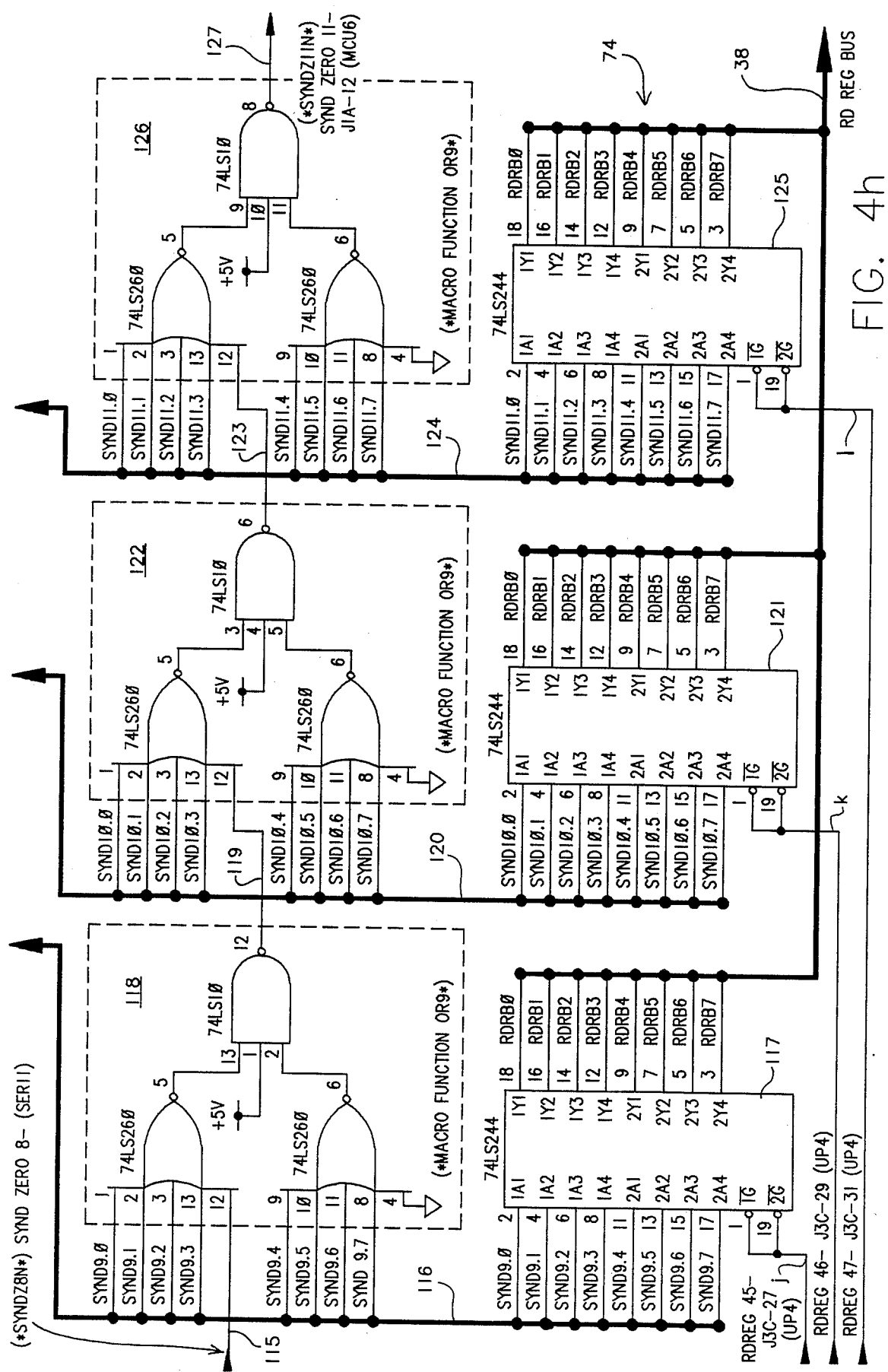
Figure 4I:
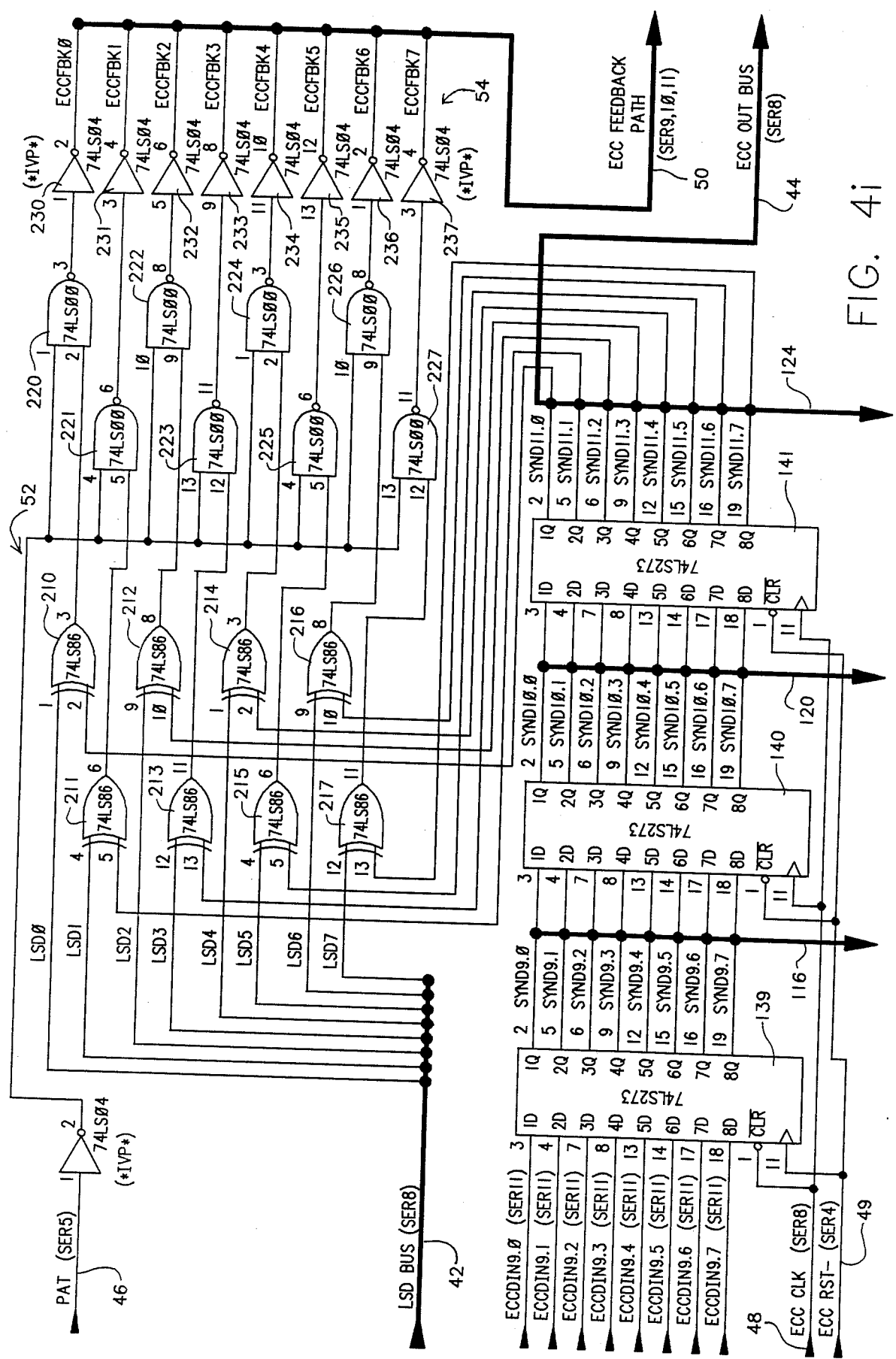

As already mentioned, because of the symmetrical nature of the Reed Solomon code selected, the third multiplier 72 is not required and, as seen in FIG. 4g, it does not exist. The third summing junction 70 comprising eight exclusive OR gates 200, 201, 202, 203, 204, 205, 206 and 207, combines the bytes clocked from the latch 138 by the first product generated by the first multiplier 60. The bit values of each serial byte put into the generator 40 on the internal bus 42 are applied to the other of the inputs of each of the array of eight exclusive OR gates 200, 201, 202, 203, 204, 205, 206, and 207 forming the input/output multiplying junction 52. An array of eight AND gates 220, 221, 222, 223, 224, 225, 226 and 227 and serial inverters 230, 231, 232, 233, 234, 235, 236, and 237 form the AND gate 54 which leads directly to the ECC feedback bus 50.

With the circuitry illustrated and with the particular RS error correction code, it is possible to correct any data block (sector) with one burst of 17 bits incorrect, and to detect any sector with up to three bursts of 17 bits incorrect.

Figure 5:
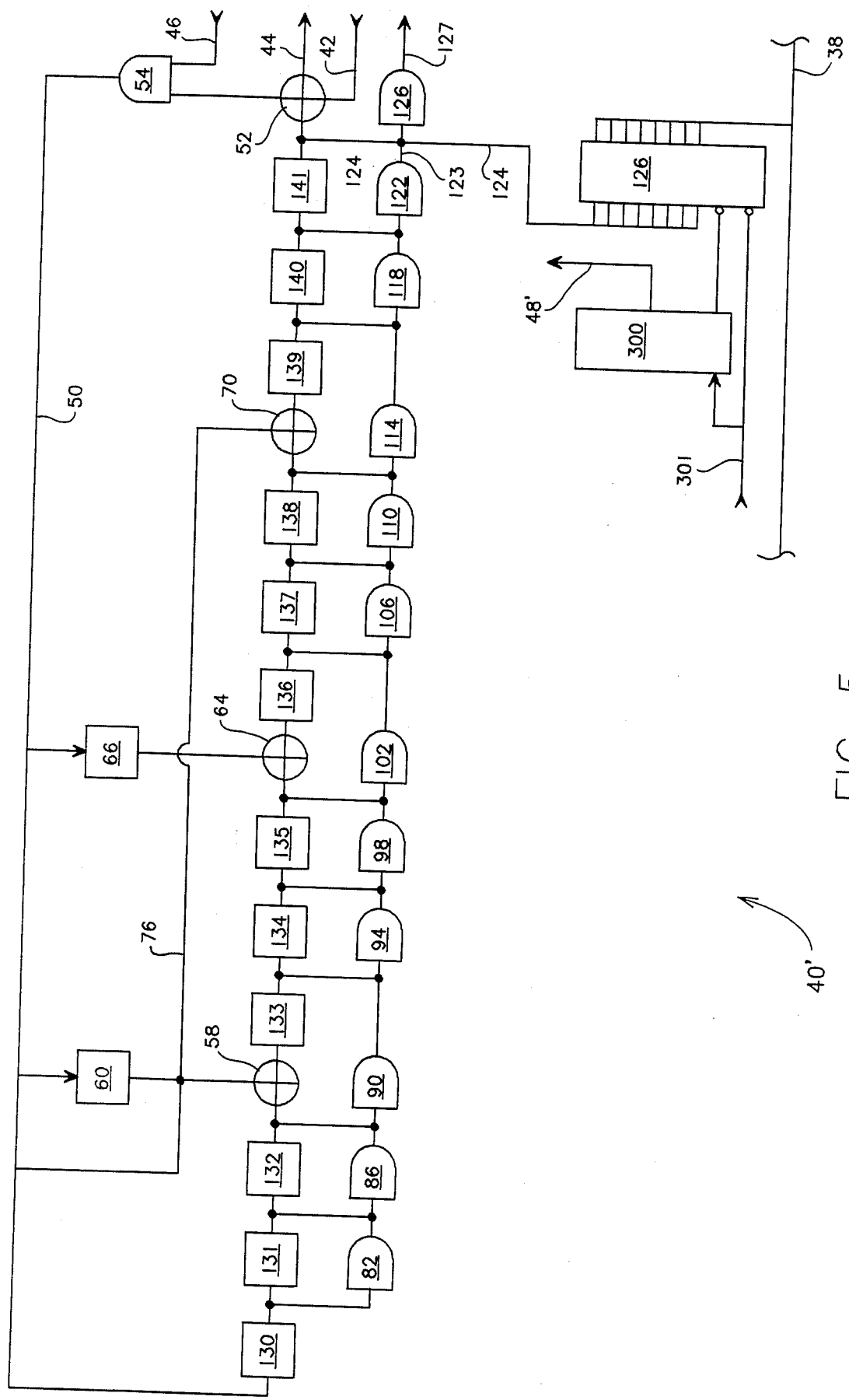
FIG. 5 depicts an alternative preferred latching circuit for the error correction code syndrome generator and detector of the present invention which enables further reduction of circuitry.

In FIG. 5, the number of tri-state bus drivers has been reduced from 12 to one, namely the driver 126 connected to the last latch 141. In this alternative preferred embodiment of the generator 40', a simple logic circuit 300 is responsive to a single address enable line 301 controlled by the microprocessor 32. Every time that the microprocessor addresses the driver 126 via the line 301, the circuit 300, after a suitable time delay, generates a clock signal which is put out to all of the latches over the line 48'. Thus, with each clock pulse on the line 48, the syndrome byte values shift one latch to the right, in lock step. Finally, each syndrome byte reaches the last latch 141 and is then sent out over the control bus by the tri-state driver 126. Thus, in this alternative, the microprocessor 32 addresses the buffer 126 over a single address line 301 twelve times in order to cause the buffer 126 to place each syndrome byte onto the control bus 38. Each byte of the error syndrome is then taken into and stored in internal registers of the microprocessor 32 in its proper turn over the control bus 38.

Figure 6:
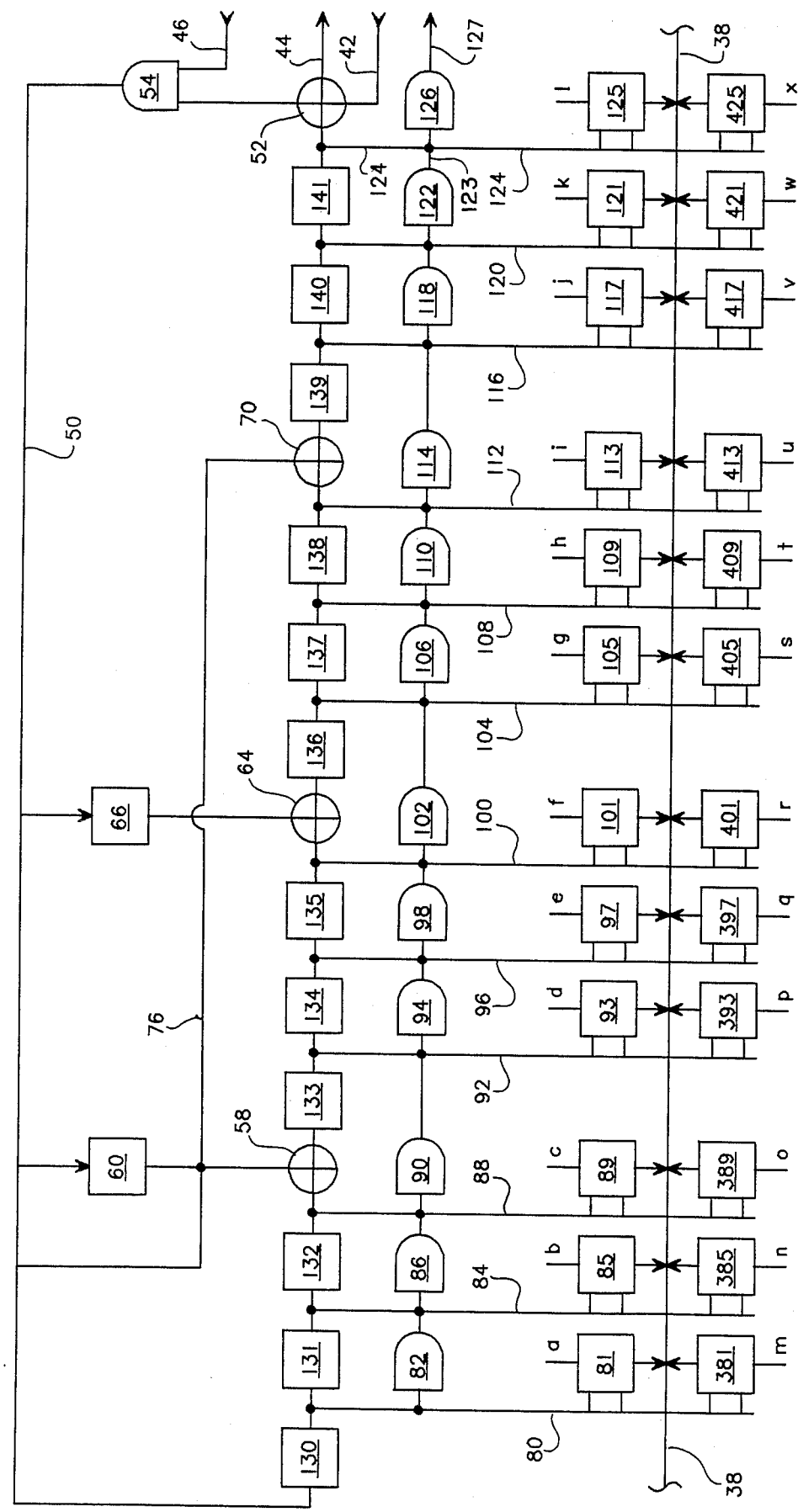
FIG. 6 depicts a second alternative preferred latching circuit for the error correction code syndrome generator and detector of the present invention which enables subsequent data blocks to be read, tested for errors and stored in the buffer if no errors are present while a presently read block is undergoing error correction processing.

In the FIG. 6 alternative embodiment 40'' of the error correction syndrome generator of the present invention, the twelve tri-state drivers 81, 85, 89, 93, 97, 101, 105, 109, 113, 117, 121 and 125, addressed respectively by address lines a, b, c, d, e, f, g, h, i, j, k and l, are mirrored by twelve additional latch-drivers 381, 385, 389, 393, 397, 401, 405, 409, 413, 417, 421, and 425, each of which is connected in parallel across the driver having in common the last two digits of the reference numerals. These additional latch-drivers 381 through 425 are commonly enabled by a suitable control line in order to capture the twelve syndrome bytes of a data block determined to contain one or more errors. The latch drivers 381 through 425 are addressed respectively by address lines m, n, o, p, q, r, s, t, u, v, w and x. All of the address lines a–x are under the control of the microprocessor 32. With the FIG. 6 arrangement, the microprocessor 32 may be addressing the latch set of the driver 381 through 425 in order to obtain error correction syndrome bytes of a sector determined to have an error, while the next sector is being circulated through the error correction syndrome generator 40'' which is otherwise identical to the generator 40.

In this manner, multiple blocks of data, as many as 32 blocks per concentric data track on the surface 12 may be checked by the generator 40 and loaded into the block buffer memory 26 (which is appropriately sized to contain multiple blocks, preferably all of the data blocks of a concentric data track) while the microprocessor 32 performs error correction on one of the blocks determined to be in error. With this slightly greater logic overhead, multiple passes (revolutions) over the data track by the transducer 14 are kept to a minimum, thereby increasing the data throughout of the system 10 while still providing full error correction capability.

Here follows a source code listing of control program routines by which the microprocessor 32 may carry out Reed-Solomon error correction procedures in the disk drive subsystem 10 depicted in FIGS. 1–3 and 4a–4:

```
1535  *********************************************************************
1536  *                   REGISTER USEAGE, RAM USEAGE
1537  *********************************************************************
1538  *
1539  *                                                          DATA BYTE    ECC INTERLEAVE
1540  *   R0   - POINTER TO RAM, TEMPORARY                         [ 0 ]           1
1541  *   R1   - INTERLEAVE (0,1 OR 2)                             [ 1 ]           0
1542  *   R2   - COUNT OF ZERO-SYNDROME                            [ 2 ]           2
1543  *   R6   - ALPHA (126,127 OR 128)                            [ 3 ]           1
1544  *   R7   - TEMPORARY                                         [ 4 ]           0
1545  *   B    - TEMPORARY (LOG(S3))                               [ 5 ]           2
1546  *   DPTR - USED FOR TABLE LOOKUP                             [ 6 ]           1
1547  *   DPL  - TEMPORARY (X)                                     [ 7 ]           0
1548  *   DPH  - TEMPORARY (LOG(S2))
1549  *
1550  *   ECC_WRK_SPC = 03F20H (DEFINED IN Q200)
1551  *
1552  *   ECC_WRK_SPC + 0 - SYNDROME MS BYTE
1553  *   ECC_WRK_SPC + 1 - SYNDROME
1554  *   ECC_WRK_SPC + 2 - SYNDROME
1555  *   ECC_WRK_SPC + 3 - SYNDROME LS BYTE
1556  *   ECC_WRK_SPC + 4 - LOG(S1), TEMPORARY FOR DCPLS           [506]           2
1557  *   ECC_WRK_SPC + 5 - LOG(S2), TEMPORARY FOR DCPMID          [507]           1
1558  *   ECC_WRK_SPC + 6 - LOG(S3), TEMPORARY FOR DCPMS           [508]           0
1559  *   ECC_WRK_SPC + 7 - X0 LS BYTE OF ERROR ADDRESS IN INTERLEAVE 0  [509]     2
1560  *   ECC_WRK_SPC + 8 - X0 MS BYTE                             [510]           1
1561  *   ECC_WRK_SPC + 9 - Y0 CORRECTION MASK FOR INTERLEAVE 0    [511]           0
1562  *   ECC_WRK_SPC + A - X1 LS BYTE
1563  *   ECC_WRK_SPC + B - X1 MS BYTE OF ERROR ADDRESS IN INTERLEAVE 1
1564  *   ECC_WRK_SPC + C - Y1 CORRECTION MASK FOR INTERLEAVE 1
1565  *   ECC_WRK_SPC + D - X2 LS BYTE
1566  *   ECC_WRK_SPC + E - X2 MS BYTE OF ERROR ADDRESS IN INTERLEAVE 2
1567  *   ECC_WRK_SPC + F - Y2 CORRECTION MASK FOR INTERLEAVE 2
1568  *
1569  *-------------------------------------------------------------------
1570  *
1571  * RETURN HERE ACCUMULATOR WILL REFLECT STATUS OF CORRECTION AS FOLLOWS:
1572  *
1573  *
1574  *             A = 80H         (Z:1) - UNCORRECTABLE
1575  *             A = 81H         (Z:1) - DISC POINTERS ARE NOT MODULO OF 512 (DICEY HARDWARE PROBLEM)
1576  *             A = 01H         (Z:1) - FALSE ECC ERROR
1577  *             A = 00H         (Z:0) - ECC CORRECTABLE
1578  *
1579  *
1580  *********************************************************************
1581  *       SET UP THE UPPER TWO BYTES OF THE DYNAMIC RAM ADDRESS
1582  *       ALSO SET UP DICEY SO THAT IT AUTO INCREMENTS
```

```
1583 ****************************************************
1584 *
1585 *
3280 B10C    1586 ECC      ACALL     SETWORK    ; SET UP WORKING ADDRESS
         1587 *
         1588 *
         1589 ****************************************************
         1590 *     SET X0, X1 AND X2 TO AN ILLEGAL VALUE TO INDICATE NO ERROR IN THAT INTERLEAVE
         1591 ****************************************************
              1592 *
              1593 *
3282 7FFF    1594          MOV       R7,#0FFH        ; SET THE VALUE TO FF
3284 7427    1595          MOV       A,#LOW X0LO     ; GET ADDRESS OF LOW BYTE OF X0
3286 B121    1596          ACALL     WRITERAM        ; WRITE X0LO = FFH
3288 F2      1597          MOVX      @R0,A           ; WRITE X0HI = FFH
3289 C5F0    1598          XCH       A,B
328B E4      1599          CLR       A
328C F2      1600          MOVX      @R0,A           ; WRITE Y0 = 00H
328D C5F0    1601          XCH       A,B
328F F2      1602          MOVX      @R0,A           ; WRITE X1LO = FFH
3290 F2      1603          MOVX      @R0,A           ; WRITE X1HI = FFH
3291 C5F0    1604          XCH       A,B
3293 F2      1605          MOVX      @R0,A           ; WRITE Y1 = 00H
3294 C5F0    1606          XCH       A,B
3296 F2      1607          MOVX      @R0,A           ; WRITE X2LO = FFH
3297 F2      1608          MOVX      @R0,A           ; WRITE X2HI = FFH
3298 C5F0    1609          XCH       A,B
329A F2      1610          MOVX      @R0,A           ; WRITE Y2 = 00H
         1611 ****************************************************
         1612 *     SET UP A LOOP TO GO THROUGH ALL 3 INTERLEAVES AND CHECK EACH FOR AN ERROR
         1613 ****************************************************
              1614 *
              1615 *
329B 7A00    1617          MOV       R2,#0           ; RESET COUNT OF ZERO-SYNDROMES
329D 7900    1618          MOV       R1,#0           ; SET INTERLEAVE TO 0
         1619 *
         1620 *
         1621 ****************************************************
         1622 *     SET UP A LOOP TO READ IN THE SYNDROME FOR THIS INTERLEAVE AND PROCESS IT
         1623 ****************************************************
              1624 *
              1625 *
329F 7E7E    1626 INTLVLP  MOV       R6,#126         ; SET ALPHA TO 126
         1627 *
         1628 *
         1629 ****************************************************
         1630 *     COMPUTE THE ADDRESS OF THE SYNDROME FOR THIS INTERLEAVE
         1631 ****************************************************
              1632 *
              1633 *
```

```
                                  GET THE SYNDROME BYTE AND STORE IT IN THE DYNAMIC RAM
                                  ***************************************************

STEP TO THE NEXT SYNDROME BYTE AND CHECK IF ALL 4 HAVE BEEN WRITTEN
                                  *******************************************************************

CHECK FOR AN ERROR IN THIS INTERLEAVE IF ALL 4 BYTES ARE 0, THERE IS NO ERROR
                                  *****************************************************************************

32A1 E4        1634 COMPSYN    CLR    A                    ; CLEAR ACC
32A2 F5F0      1635 GETSYN     MOV    B,A                  ; SET SYNDROME BYTE OFFSET TO 0
32A4 23        1636            RL     A                    ; MULTIPLY BY 2
32A5 25F0      1637            ADD    A,B                  ; MULTIPLY BY 3
32A7 29        1638            ADD    A,R1                 ; ADD IN THE INTERLEAVE
32A8 2400      1639            ADD    A,#SYND0             ; ADD TO STARTING ADDRESS OF SYNDROME IN DICEY
32AA F8        1640            MOV    R0,A                 ; SAVE THE ADDRESS
               1641 *
               1642 *
               1643 *
               1644 *
               1645 *
               1646 *
               1647 *
32AB E2        1648            MOVX   A,@R0                ; GET THE SYNDROME BYTE
32AC FF        1649            MOV    R7,A                 ; SAVE TEMPORARILY
32AD E5F0      1650            MOV    A,B                  ; GET THE BYTE OFFSET
32AF 6403      1651            XRL    A,#03                ; STORE IN REVERSE ORDER
32B1 2420      1652            ADD    A,#LOW SYN           ; ADD IN STARTING ADDRESS OF SYNDROME
32B3 B121      1653            ACALL  WRITERAM             ; WRITE OUT THE SYNDROME BYTE TO DRAM
               1654 *
               1655 *
               1656 *
               1657 *
               1658 *
               1659 *
               1660 *
32B5 05F0      1661            INC    B                    ; INCREMENT THE BYTE OFFSET
32B7 E5F0      1662            MOV    A,B                  ; PUT IT IN A
32B9 B404E8    1663            CJNE   A,#4,GETSYN          ; CHECK IF DONE
               1665 *
               1667 *
               1669 *
32BC 7420      1670            MOV    A,#LOW SYN           ; GET ADDRESS OF SYNDROME BYTES
32BE B135      1671            ACALL  READRAM              , READ THE FIRST BYTE
32C0 FF        1672            MOV    R7,A                 , SAVE IT IN R7
32C1 E2        1673            MOVX   A,@R0                , READ IN BYTE 1
32C2 4F        1674            ORL    A,R7                 ; OR IT IN WITH BYTE 0
32C3 FF        1675            MOV    R7,A                 ; SAVE IT AGAIN
32C4 E2        1676            MOVX   A,@R0                ; READ IN BYTE 2
32C5 4F        1677            ORL    A,R7                 , OR IN WITH PREVIOUS BYTES
32C6 FF        1678            MOV    R7,A                 , SAVE IT AGAIN
32C7 E2        1679            MOVX   A,@R0                , READ IN BYE 3
32C8 4F        1680            ORL    A,R7                 ; OR IN WITH ALL PREVIOUS BYTES
32C9 7003      1681            JNZ    DIVSYN
32CB 0A        1682            INC    R2                   ; COUNT THIS ZERO SYNDROMES
32CC 616F      1683            AJMP   NEXTINTLV            ; IF 0, NO ERROR IN THIS INTERLEAVE
```

```
                ;****************************************************************
                ;*      DIVIDE THE SYNDROME BY (X+ALPHA) TO GET THE PARTIAL SYNDROME
                ;****************************************************************
                ;*
                ;*
32CE 7420  1690 DIVSYN   MOV     A,#LOW SYN      ; GET ADDRESS OF SYNDROME
32D0 B135  1691          ACALL   READRAM         ; READ IN MS BYTE
32D2 7F03  1692          MOV     R7,#3           ; SET UP A LOOP COUNTER
                ;*
                ;****************************************************************
                ;*      PERFORM A LONG DIVISION OF SYNMS=X^3 + SYN*X^2 + SYN*X + SYNLS BY (X+ALPHA)
                ;****************************************************************
                ;*
                ;*
32D4 6008  1700 SYNLP    JZ      NEXTDIV         ; IGNORE FOLLOWING CODE IF MULTIPLIER IS 0
32D6 90354B 1701         MOV     DPTR,#LOG       ; POINT TO LOG TABLE
32D9 93    1702          MOVC    A,@A+DPTR       ; GET LOG OF SYNDROME BYTE
32DA 2E    1703          ADD     A,R6            ; ADD TO ALPHA
32DB B119  1704          ACALL   MOD             ; MAKE IT MOD 255
32DD 90364B 1705         MOV     DPTR,#ANTILOG   ; POINT TO ANTILOG TABLE
32E0 93    1706          MOVC    A,@A+DPTR       ; A NOW HAS SYN*ALPHA
                ;*
                ;****************************************************************
                ;*      SUBTRACT OUT THIS PRODUCT FROM THE NEXT LEAST SIGNIFICANT TERM OF X
                ;****************************************************************
                ;*
                ;*
32E1 F5F0  1714 NEXTDIV  MOV     B,A             ; SAVE THIS TEMPORARILY
32E3 E2    1715          MOVX    A,@R0           ; GET NEXT SYNDROME BYTE
32E4 65F0  1716          XRL     A,B             ; PERFORM MOD 2 SUBTRACTION
32E6 DFEC  1717          DJNZ    R7,SYNLP        ; LOOP TILL DONE
                ;*
                ;****************************************************************
                ;*      SUBTRACT OUT 4*ALPHA FROM THE LOG OF THIS
                ;****************************************************************
                ;*
                ;*
32E8 90354B 1725         MOV     DPTR,#LOG       ; POINT TO LOG TABLE
32EB 93    1726          MOVC    A,@A+DPTR       ; GET THE LOG OF THIS VALUE
32EC 7F04  1727          MOV     R7,#4           ; SET UP A COUNTER
32EE C3    1728 LP4      CLR     C               ; PREPARE FOR DIVIDE
32EF 9E    1729          SUBB    A,R6            ; SUBTRACT OUT ALPHA
32F0 5002  1730          JNC     LP41            ; NO BORROW
32F2 24FF  1731          ADD     A,#255          ; MAKE IT POSITIVE MOD 255
32F4 DFF8  1732 LP41     DJNZ    R7,LP4          ; DO IT 4 TIMES
```

```
****************************************************************
*   THE ACCUMULATOR NOW HAS THE LOG OF THE PARTIAL SYNDROME
*   STORE IT AWAY AND CHECK IF ALL 3 PARTIAL SYNDROMES HAVE BEEN COMPUTED
****************************************************************
*
32F6 F5F0       1740        MOV     B,A             ; SAVE LOG(S3) FOR LATER
32F8 FF         1741        MOV     R7,A            ; SAVE TEMPORARILY
32F9 EE         1742        MOV     A,R6            ; GET ALPHA
32FA C3         1743        CLR     C               ; COMPUTE ADDRESS IN BUFFER RAM
32FB 947E       1744        SUBB    A,#126
32FD 2424       1745        ADD     A,#LOW LOGS1
32FF B121       1746        ACALL   WRITERAM        ; STORE PARTIAL SYNDROME IN RAM
3301 0E         1747        INC     R6              ; STEP TO NEXT ALPHA
3302 BE819C     1748        CJNE    R6,#129,COMPSYN ; DO FOR ALPHA = 126,127,128
                1749    *
                1750    ****************************************************************
                1751    *   COMPUTE S1*S3 BY ADDING EXPONENTS AND TAKING THE ANTILOG
                1752    ****************************************************************
                1753    *
3305 7424       1756        MOV     A,#LOW LOGS1    ; GET ADDRESS OF LOG(S1)
3307 B135       1757        ACALL   READRAM         ; GET IT IN A
3309 2F         1758        ADD     A,R7            ; ADD IN LOG(S3)
330A B119       1759        ACALL   MOD             ; GET IT MOD 255
330C 903648     1760        MOV     DPTR,#ANTILOG   ; POINT TO ANTILOG TABLE
330F 93         1761        MOVC    A,@A+DPTR       ; GET S1*S3
3310 FF         1762        MOV     R7,A            ; SAVE IT IN R7 FOR NOW
                1763    *
                1764    ****************************************************************
                1765    *   COMPUTE S2^2 THE SAME WAY
                1766    ****************************************************************
                1767    *
3311 E2         1770        MOVX    A,@R0           ; GET LOG(S2)
3312 F8         1771        MOV     R0,A            ; SAVE TEMPORARILY
3313 28         1772        ADD     A,R0            ; MULTIPLY BY 2
3314 B119       1773        ACALL   MOD             ; GET IT MOD 255 ALSO
3316 93         1774        MOVC    A,@A+DPTR       ; A NOW HAS S2^2
3317 8883       1775        MOV     DPH,R0          ; TEMPORARILY SAVE LOG(S2)
                1776    *
                1777    ****************************************************************
                1778    *   CHECK FOR MORE THAN 1 ERROR.  IF S1*S3 =S2^2 THEN THERE IS ONLY 1 ERROR
                1779    ****************************************************************
                1780    *
3319 6F         1783        XRL     A,R7            ; COMPARE THE TWO
```

```
331A 6002            1787           JZ      COMPX       ; THERE IS ONLY 1 ERROR
331C 8175            1788           AJMP    UNCOR       ; THERE IS MORE THAN 1 ERROR
                     1789   ***********************************************************
                     1790   *       COMPUTE X = S3/S2 = LOG(S3) - LOG(S2)
                     1791   *       THIS X STARTS AT 0 AT THE END OF THE ECC BYTES AND INCREASES AS YOU
                     1792   *       GO TOWARDS THE START OF THE DATA FIELD
                     1793   ***********************************************************
331E E5F0            1794   COMPX   MOV     A,B         ; GET LOG(S3)
3320 C3              1795           CLR     C           ; PREPARE FOR SUBTRACT
3321 9583            1796           SUBB    A,DPH       ; SUBTRACT OUT LOG(S2)
3323 5002            1797           JNC     SAVEX       ; NO BORROW
3325 24FF            1798           ADD     A,#255      ; KEEP POSITIVE MOD 255
3327 F582            1799   SAVEX   MOV     DPL,A       ; SAVE X
                     1800   *
                     1801   ***********************************************************
                     1802   *       COMPUTE THE REAL POSITION, I.E. FORWARD DISPLACEMENT FROM THE START OF THE SECTOR
                     1803   *       P = 524 - INTERLEAVE - (3*X)
                     1804   *
                     1805   ***********************************************************
                     1806   *
                     1807   *
3329 75F002          1808           MOV     B,#2        ; SET MS BYTE TO 524
332C 740B            1809           MOV     A,#0BH      ; LO BYTE
332E C3              1810           CLR     C           ; PREPARE FOR SUBTRACT
332F 99              1811           SUBB    A,R1        ; SUBTRACT FROM INTERLEAVE
3330 7F03            1812           MOV     R7,#3       ; SET UP A LOOP COUNTER
                     1813   *
3332 C3              1814   SUBLP   CLR     C           ; PREPARE FOR A SUBTRACT
3333 9582            1815           SUBB    A,DPL       ; SUBTRACT OUT X
3335 5002            1816           JNC     SUBL        ; NO BORROW
3337 15F0            1817           DEC     B           ; IF BORROW, COUNT DOWN MSB
3339 DFF7            1818   SUBL    DJNZ    R7,SUBLP    ; DO 3 TIMES
                     1819   *
                     1820   ***********************************************************
                     1821   *       STORE AWAY THE REAL X IN THE DYNAMIC RAM
                     1822   *
                     1823   ***********************************************************
                     1824   *
                     1825   *
333B FF              1826           MOV     R7,A        ; SAVE THE LS BYTE
333C E9              1827           MOV     A,R1        ; GET THE INTERLEAVE
333D 29              1828           ADD     A,R1        ; MULTIPLY BY 2
333E 29              1829           ADD     A,R1        ; MULTIPLY BY 3
333F 2427            1830           ADD     A,#LOW XOLO ; ADD IN STARTING ADDRESS OFFSET
3341 B121            1831           ACALL   WRITERAM    ; WRITE LS BYTE OUT
3343 E5F0            1832           MOV     A,B         ; GET MS BYTE
3345 F2              1833           MOVX    @R0,A       ; WRITE IT OUT TOO
```

```
                    ************************************************
                    *                 COMPUTE (X*127) MOD 255       *
                    ************************************************
3346 E582     1840           MOV    A,DPL        ; GET ORIGINAL X
3348 75F07F   1841           MOV    B,#127       ; GET MULTIPLIER
334B A4       1842           MUL    AB           ; MULTIPLY IT OUT
334C 05F0     1843  MODLP    INC    B            ; NEED TO CHECK FOR MS BYTE = 0
334E D5F002   1844           DJNZ   B,MSNOTO     ; AND THIS IS A KLUDGY WAY TO DO IT
3351 8009     1845           SJMP   MS0          ; THE MS BYTE IS 0
3353 C3       1846  MSNOTO   CLR    C            ; PREPARE FOR SUBTRACT
3354 94FF     1847           SUBB   A,#255       ; DO A MOD
3356 50F4     1848           JNC    MODLP        ; NO BORROW
3358 15F0     1849           DEC    B            ; DECREMENT MS BYTE ON BORROW
335A 80F0     1850           SJMP   MODLP
335C B4FF01   1851  MS0      CJNE   A,#255,LSOK  ; CHECK LS BYTE FOR 255
335F E4       1852           CLR    A            ; IF SO, MOD IT TOO
              1853  *
                    ************************************************
                    * SUBTRACT THIS FROM LOG(S2) AND TAKE THE ANTILOG TO GIVE US Y
                    *   THEN STORE IT AWAY IN THE DYNAMIC RAM ALSO
                    ************************************************
3360 C583     1861  LSOK     XCH    A,DPH        ; GET LOG(S2) IN A
3362 C3       1862           CLR    C
3363 9583     1863           SUBB   A,DPH        ; LOG(S2) - (X*127) MOD 255
3365 5002     1864           JNC    GOTY         ; NO BORROW
3367 24FF     1865           ADD    A,#255       ; GET IT POSITIVE MOD 255
3369 903648   1866  GOTY     MOV    DPTR,#ANTILOG ; POINT TO ANTILOG TABLE (REV 03 FIXED)
336C 93       1867           MOVC   A,@A+DPTR    ; GET THE ANTILOG OF THIS
336D B131     1868           ACALL  WRR          ; WRITE IT OUT
              1869  *
                    ************************************************
                    *  GO TO THE NEXT INTERLEAVE AND CHECK IF DONE WITH ALL 3
                    ************************************************
336F 09       1876  NEXTINTLV INC   R1           ; STEP TO NEXT INTERLEAVE
3370 B90308   1877           CJNE   R1,#3,INTLP  ; LOOP TILL DONE
3373 BA0307   1878           CJNE   R2,#03,CHKCONS ; IF SYNDROME ALL NOT ZERO: CONTINUE
3376 7401     1879           MOV    A,#01H       ; ELSE FLAG FALSE ECC
3378 023477   1880           LJMP   ECCRET       ; AND SKIP THE ECC CORRECTION
337B 419F     1881  INTLP    AJMP   INTLVLP      ; GO BACK
              1883  *   REGISTER USEAGE, RAM USEAGE
                    ************************************************
```

```
1886  *
1887  *
1888  *            R0    - USED TO ADDRESS RAM
1889  *            R1    - LOW ADDRESS FOR INTERLEAVE 2             DATA BYTE    ECC INTERLEAVE
1890  *            R2    - MID ADDRESS FOR INTERLEAVE 2                [ 0 ]           1
1891  *            R3    - LOW ADDRESS FOR INTERLEAVE 1             DATA BYTE    ECC INTERLEAVE
1892  *            R4    - MID ADDRESS FOR INTERLEAVE 1                [ 0 ]           1
1893  *            R5    - COUNTER FOR SPAN_CHECK
1894  *            R6    - LOW ADDRESS FOR INTERLEAVE 0             DATA BYTE    ECC INTERLEAVE
1895  *            R7    - MID ADDRESS FOR INTERLEAVE 0                [ 0 ]           1
1896  *            B     - TEMPORARY                                   [ 4 ]           0
1897  *
1898  ******************************************************************************
                       337D 7927    1899 CHKCONS    MOV       R1,#LOW X0L0       ; SWAP X0 AND X1 TO RE-ORDER
                       337F 7E2A    1900            MOV       R6,#LOW X1L0       ; THE INTERLEAVE SEQUENCE FROM
                       3381 91E2    1901            ACALL     SWAP               ; FROM X1-X0-X2 TO X0-X1-X2
1902  ******************************************************************************
1903  *         WE NOW NEED TO CHECK FOR CONSECUTIVE ERRORS. THIS IS DONE BY
1904  *         CHECKING THE ERROR LOCATIONS AND ADJUSTING THE LOCATIONS OF ANY 1
1905  *         INTERLEAVES WHICH DO NOT CONTAIN ERRORS. THERE ARE SEVEN TYPES
1906  *         OF ERRORS, CORRESPONDING TO THE INTERLEAVES WHICH CONTAIN ERRORS.
1907  *         SINGLE BYTE ERRORS MAY OCCUR ANYWHERE, AND ARE FULLY CONTAINED
1908  *         IN A SINGLE INTERLEAVE. TWO BYTE ERRORS SPAN TWO INTERLEAVES WHICH
1909  *         MUST BE TESTED FOR CONTIGUITY. THREE BYTE ERRORS SPAN ALL THREE
1910  *         INTERLEAVES, AND MUST ALSO BE TESTED FOR CONTIGUITY.
1911  *
1912  *                X0  X1  X2      TYPE OF ADJUSTMENT
1913  *  0 BYTE ERROR   0   0   0      NOT AN ERROR
1914  *
1915  *  1 BYTE ERRORS  1   0   0      X0=ERROR LOCATION                [ 1 ]    X0
1916  *                 0   1   0      X1=ERROR LOCATION                [ 2 ]    X1
1917  *                 0   0   1      X2=ERROR LOCATION                [ 3 ]    X2
1918  *
1919  *  2 BYTE ERRORS  1   1   0      X0, X1=ERROR LOCATIONS           [509]    X0
1920  *                 1   0   1      X0, X2=ERROR LOCATIONS           [510]    X1
1921  *                 0   1   1      X1, X2=ERROR LOCATIONS
1922  *
1923  *  3 BYTE ERRORS  1   1   1      X0, X1, X2=ERROR LOCATIONS       [511]    X1
1924  *
1925  ******************************************************************************
1926  *
1927  *
                       3383 7427    1928            MOV       A,#LOW X0L0       ; GET ADDRESS OF X0
                       3385 B135    1929            ACALL     READRAM           ; READ X0L0
                       3387 FE      1930            MOV       R6,A              ; AND STORE IN R6
                       3388 E2      1931            MOVX      A,@R0             ; READ X0HI
                       3389 FF      1932            MOV       R7,A              ; AND STORE IN R7
                       338A B4FF1E  1933            CJNE      A,#0FFH,IL_1XX
1934
                       338D E2      1935 IL_0XX     MOVX      A,@R0             ; THROW OUT X0
```

```
33BE  E2          1936                MOVX    A,@R0       ; READ X1LO
33BF  F9          1937                MOV     R1,A        ; AND STORE IN R1
3390  E2          1938                MOVX    A,@R0       ; READ X1HI
3391  FA          1939                MOV     R2,A        ; AND STORE IN R2
3392  B4FF0B      1940                CJNE    A,#0FFH,IL_01X
              1941
3395  E2          1942  IL_00X        MOVX    A,@R0       ; THROW OUT Y1
3396  E2          1943                MOVX    A,@R0       ; READ X2LO
3397  FB          1944                MOV     R3,A        ; AND STORE IN R3
3398  E2          1945                MOVX    A,@R0       ; READ X2HI
3399  FC          1946                MOV     R4,A        ; AND STORE IN R4
339A  B4FF2C      1947                CJNE    A,#0FFH,IL_001
339D  02347C      1948  IL_000        JMP     CORRECT     ; NOT AN ERROR
              1949
33A0  E2          1950  IL_01X        MOVX    A,@R0       ; THROW OUT Y1
33A1  E2          1951                MOVX    A,@R0       ; READ X2LO
33A2  FB          1952                MOV     R3,A        ; AND STORE IN R3
33A3  E2          1953                MOVX    A,@R0       ; READ X2HI
33A4  FC          1954                MOV     R4,A        ; AND STORE IN R4
33A5  B4FF65      1955                CJNE    A,#0FFH,IL_011
33AB  0233C9      1956                JMP     IL_010
              1957
33AB  E2          1958  IL_1XX        MOVX    A,@R0       ; THROW OUT Y0
33AC  E2          1959                MOVX    A,@R0       ; READ X1LO
33AD  F9          1960                MOV     R1,A        ; AND STORE IN R1
33AE  E2          1961                MOVX    A,@R0       ; READ X1HI
33AF  FA          1962                MOV     R2,A        ; AND STORE IN R2
33B0  B4FF0B      1963                CJNE    A,#0FFH,IL_101
              1964
33B3  E2          1965  IL_10X        MOVX    A,@R0       ; THROW OUT Y1
33B4  E2          1966                MOVX    A,@R0       ; READ X2LO
33B5  FB          1967                MOV     R3,A        ; AND STORE IN R3
33B6  E2          1968                MOVX    A,@R0       ; READ X2HI
33B7  FC          1969                MOV     R4,A        ; AND STORE IN R4
33B8  B4FF11      1970                CJNE    A,#0FFH,IL_101
33BB  0233C9      1971                JMP     IL_100
              1972
33BE  E2          1973  IL_11X        MOVX    A,@R0       ; THROW OUT Y1
33BF  E2          1974                MOVX    A,@R0       ; READ X2LO
33C0  FB          1975                MOV     R3,A        ; AND STORE IN R3
33C1  E2          1976                MOVX    A,@R0       ; READ X2HI
33C2  FC          1977                MOV     R4,A        ; AND STORE IN R4
33C3  B4FF69      1978                CJNE    A,#0FFH,IL_111
33C6  0233EE      1979                JMP     IL_110
              1980
              1981  *
              1982  *   SINGLE BYTE ERRORS
              1983  *
33C9          1984  IL_100:
```

```
33C9                    1985  IL_010:
33C9                    1986  IL_001:
33C9  02347C            1987          JMP     CORRECT
                        1988  ;***********************************************************
                        1989  ;                TWO BYTE ERRORS
                        1990  ;
                        1991  *       TWO BYTE ERRORS MUST BE CONTAINED IN A SINGLE SEVENTEEN BIT BURST
                        1992  *       IN ORDER TO BE CORRECTABLE. A TWO BYTE ERROR IN BYTES 501,502 OF
                        1993  *       DATA IS CORRECTABLE; AN ERROR IN BYTES 501,505 IS UNCORRECTABLE.
                        1994  *       NOTE THAT AN ERROR IN BYTES 501,503 IS CORRECTABLE IF IT CAN BE
                        1995  *       CONTAINED IN A SEVENTEEN BIT BURST
                        1996  *
                        1997  ;***********************************************************
33CC  8CF0              1998  IL_101:  MOV    B,R4           ; CHECK FOR CONTIGUITY
33CE  EB                1999           MOV    A,R3           ;   X2 - X0 MUST = 1, OR -2
33CF  C3                2000           CLR    C
33D0  9E                2001           SUBB   A,R6           ; SUBTRACT X2LO - X0LO
33D1  C5F0              2002           XCH    A,B            ;   AND STORE RESULT IN B
33D3  9F                2003           SUBB   A,R7           ; SUBTRACT X2HI - X0HI
33D4  400D              2004           JC     IL_101C        ; JUMP IF NEGATIVE RESULT
33D6  C5F0              2005           XCH    A,B
33D8  7003              2006           JNZ    IL_101B
33DA  02342C            2007           JMP    UNCOR_2B       ; JUMP AND REPORT ERROR IF ZERO RESULT
                        2008
                        2009
33DD  B4024C            2010  IL_101B: CJNE   A,#02,UNCOR_2B ; CHECK FOR X2-X0 = 1
33E0  02347C            2011           JMP    CORRECT        ;   AND CORRECT IF TRUE
                        2012
33E3  B4FF46            2013  IL_101C: CJNE   A,#-1,UNCOR_2B ; CHECK FOR X2-X0 < 0
33E6  C5F0              2014           XCH    A,B
33E8  B4FF41            2015           CJNE   A,#-1,UNCOR_2B ; CHECK FOR X2-X0 = -2
33EB  02347C            2016           JMP    CORRECT
                        2017
33EE  8AF0              2018  IL_110:  MOV    B,R2           ; CHECK FOR CONTIGUITY
33F0  E9                2019           MOV    A,R1           ;   X1 - X0 MUST = 1, OR -2
33F1  C3                2020           CLR    C
33F2  9E                2021           SUBB   A,R6           ; SUBTRACT X1LO - X0LO
33F3  C5F0              2022           XCH    A,B            ;   AND STORE RESULT IN B
33F5  9F                2023           SUBB   A,R7           ; SUBTRACT X1HI - X0HI
33F6  400A              2024           JC     IL_110C        ; JUMP IF NEGATIVE RESULT
33F8  C5F0              2025           XCH    A,B
33FA  6030              2026           JZ     UNCOR_2B       ; JUMP AND REPORT ERROR IF ZERO RESULT
33FC  B4012D            2027           CJNE   A,#01,UNCOR_2B ; CHECK FOR X1-X0 = 1
33FF  02347C            2028           JMP    CORRECT        ;   AND CORRECT IF TRUE
                        2029
3402  B4FF27            2030  IL_110C: CJNE   A,#-1,UNCOR_2B ; CHECK FOR X1-X0 < 0
3405  C5F0              2031           XCH    A,B
3407  B4FE22            2032           CJNE   A,#-2,UNCOR_2B ; CHECK FOR X1-X0 = -2
340A  02347C            2033           JMP    CORRECT
                        2034
```

```
3400 BCF0   2036 IL_011:  MOV   B,R4            ; CHECK FOR CONTIGUITY
340F EB     2037          MOV   A,R3            ; X2 - X1 MUST = 1,OR -2
3410 C3     2038          CLR   C
3411 99     2039          SUBB  A,R1            ; SUBTRACT X2LO - X1LO
3412 C5F0   2040          XCH   A,B             ;   AND STORE RESULT IN B
3414 9A     2041          SUBB  A,R2            ; SUBTRACT X2HI - X1HI
3415 400A   2042          JC    IL_011C         ; JUMP IF NEGATIVE RESULT
3417 C5F0   2043          XCH   A,B
3419 6011   2044          JZ    UNCOR_2B        ; JUMP AND REPORT ERROR IF ZERO RESULT
341B B4010E 2045          CJNE  A,#01,UNCOR_2B  ; CHECK FOR X2-X1 = 1
341E 02347C 2046          JMP   CORRECT         ;   AND CORRECT IF TRUE
            2047
3421 B4FF08 2048 IL_011C: CJNE  A,#-1,UNCOR_2B  ; CHECK FOR X2-X1 < 0
3424 C5F0   2049          XCH   A,B
3426 B4FE03 2050          CJNE  A,#-2,UNCOR_2B  ; CHECK FOR X2-X1 = -2
3429 02347C 2051          JMP   CORRECT
            2052
342C 023475 2053 UNCOR_2B: JMP  UNCOR           ; REPORT ERROR AS UNCORRECTABLE
            2054 ;***************************************************************
            2055 *
            2056 *      THREE BYTE ERRORS
            2057 *
            2058 *      THERE ARE THREE POSSIBLE TYPES OF THREE BYTE ERROR, DEPENDING ON THE ORDERING
            2059 *      OF THE SYNDROMES.
            2060 *                      SYNDROME ORDER       CHECKS FOR CONTIGUOUS ERROR
            2061 *                        X0 X1 X2            (X1 - X0) = 1 ;  (X2 - X1) = 1
            2062 *                        X1 X2 X0            (X1 - X0) = -2 ; (X2 - X1) = 1
            2063 *                        X2 X0 X1            (X1 - X0) = 1 ;  (X2 - X1) = -2
            2064 *
            2065 *****************************************************************
342F BAF0   2067 IL_111:  MOV   B,R2
3431 E9     2068          MOV   A,R1            ; CHECK FOR CONTIGUITY
3432 C3     2069          CLR   C               ; X1 - X0 MUST = 1,OR -2
3433 9E     2070          SUBB  A,R6            ; SUBTRACT X1LO - X0LO
3434 C5F0   2071          XCH   A,B             ;   AND STORE RESULT IN B
3436 9F     2072          SUBB  A,R7            ; SUBTRACT X1HI - X0HI
3437 4019   2073          JC    IL_111_120      ; JUMP IF NEGATIVE RESULT
3439 C5F0   2074          XCH   A,B
343B 6038   2075          JZ    UNCOR           ; JUMP AND REPORT ERROR IF ZERO RESULT
343D B40135 2076          CJNE  A,#01,UNCOR     ; CHECK FOR X1-X0 = 1
            2077                                ;   AND CORRECT IF TRUE
3440 BCF0   2078 IL_111B: MOV   B,R4            ; CHECK FOR CONTIGUITY
3442 EB     2079          MOV   A,R3            ; X2 - X1 MUST = 1,OR -2
3443 C3     2080          CLR   C
3444 99     2081          SUBB  A,R1            ; SUBTRACT X2LO - X1LO
3445 C5F0   2082          XCH   A,B             ;   AND STORE RESULT IN B
3447 9A     2083          SUBB  A,R2            ; SUBTRACT X2HI - X1HI
3448 4020   2084          JC    IL_111_201      ; JUMP IF NEGATIVE RESULT
            2085 *
```

```
                        2086  *    ERROR SPANS   X2 X0 X1 X2 X0 X1
                        2087  *                  ;----!
344A C5F0               2088  IL_111_012:  XCH    A,B
344C B40126             2089  *            CJNE   A,#01,UNCOR        ; CHECK FOR X2-X1 = 1
                        2090  *            MOV    A,#Y0              ; LOAD MOST SIGNIFICANT MASK BYTE
                        2091  *            CALL   READRAM            ; READ FROM BUFFER RAM
                        2092  *            XCH    A,B                ; AND STORE IN B
                        2093  *            MOV    A,#Y2              ; LOAD LEAST SIGNIFICANT MASK BYTE
                        2094  *            CALL   READRAM            ; READ FROM BUFFER RAM
                        2095  *            CALL   SPAN_CHECK         ; COMPARE CORRECTION SPAN TO ECC_SPAN
                        2096  *            JC     UNCOR              ; SPAN > ECC_SPAN, UNCORRECTABLE ERROR
344F 02347C             2097              JMP    CORRECT             ; SPAN <= ECC=SPAN, CORRECTABLE ERROR
                        2098  *
                        2099  *    ERROR SPANS   X2 X0 X1 X2 X0 X1
                        2100  *                  ;----!
3452 B4FF20             2101  IL_111_120:  CJNE   A,#-1,UNCOR        ; CHECK FOR X1-X0 < 0
3455 C5F0               2102              XCH    A,B
3457 B4FE1B             2103              CJNE   A,#-2,UNCOR        ; CHECK FOR X1-X0 = -2
345A BCF0               2104              MOV    B,R4               ; CHECK FOR CONTIGUITY
345C EB                 2105              MOV    A,R3               ; X2 - X1 MUST = 1, OR -2
345D C3                 2106              CLR    C
345E 99                 2107              SUBB   A,R1               ; SUBTRACT X2L0 - X1L0
345F B40113             2108              CJNE   A,#01,UNCOR        ; AND STORE RESULT IN B
3462 C5F0               2109              XCH    A,B                ; SUBTRACT X2HI - X1HI
3464 9A                 2110              SUBB   A,R2
3465 400E               2111              JC     UNCOR              ; JUMP IF NEGATIVE RESULT
                        2112  *           MOV    A,#LOW Y1          ; LOAD MOST SIGNIFICANT MASK BYTE
                        2113  *           CALL   READRAM            ; READ FROM BUFFER RAM
                        2114  *           XCH    A,B                ; AND STORE IN B
                        2115  *           MOV    A,#LOW Y0          ; LOAD LEAST SIGNIFICANT MASK BYTE
                        2116  *           CALL   READRAM            ; READ FROM BUFFER RAM
                        2117  *           CALL   SPAN_CHECK         ; COMPARE CORRECTION SPAN TO ECC_SPAN
                        2118  *           JC     UNCOR              ; SPAN > ECC_SPAN, UNCORRECTABLE ERROR
3467 02347C             2119              JMP    CORRECT             ; AND CORRECT IF TRUE
                        2120  *
                        2121  *    ERROR SPANS   X2 X0 X1 X2 X0 X1
                        2122  *                  ;----!
346A B4FF08             2123  IL_111_201:  CJNE   A,#-1,UNCOR        ; CHECK FOR X1-X0 < 0
346D C5F0               2124              XCH    A,B
346F B4FE03             2125              CJNE   A,#-2,UNCOR        ; CHECK FOR X1-X0 = -2
                        2126  *           MOV    A,#LOW Y2          ; LOAD MOST SIGNIFICANT MASK BYTE
                        2127  *           CALL   READRAM            ; READ FROM BUFFER RAM
                        2128  *           XCH    A,B                ; AND STORE IN B
                        2129  *           MOV    A,#LOW Y1          ; LOAD LEAST SIGNIFICANT MASK BYTE
                        2130  *           CALL   READRAM            ; READ FROM BUFFER RAM
                        2131  *           CALL   SPAN_CHECK         ; COMPARE CORRECTION SPAN TO ECC_SPAN
                        2132  *           JC     UNCOR              ; SPAN > ECC_SPAN, UNCORRECTABLE ERROR
3472 02347C             2133              JMP    CORRECT             ; CORRECT IF TRUE
                        2134  *
```

```
2135  ****************************************************************
2136  *                  SET UP UNCORRECTABLE ECC ERROR FOR SENSE INFORMATION
2137  ****************************************************************
2138  *
3475 7480      2140 UNCOR     MOV      A,#80H            ; SET UNCORRECTABLE
3477 22        2141 ECCRET    RET
               2142  *
               2143  ****************************************************************
               2144  *            WHEN THE DISK CHANNEL ADDRESS REGISTER IS NOT 0 MOD 512
               2145  *            WE HAVE A PROBLEM
               2146  *
               2147  ****************************************************************
               2148  *
               2149  *
3478 7481      2150 ADRSERR   MOV      A,#81H
347A 80FB      2151           SJMP     ECCRET            ; REPORT UNCORRECTABLE
               2152
               2154  ****************************************************************
               2155  *          NOW PERFORM THE CORRECTION IN THE DYNAMIC RAM
               2156  *          FIRST READ OUT THE CURRENT VALUE OF THE DISK CHANNEL POINTER AND SAVE IT
               2157  ****************************************************************
               2158  *
               2159  *
347C 7900      2160 CORRECT   MOV      R1,#DCPLO         ; GET ADDRESS OF DISK CHANNEL POINTER
347E E3        2161           MOVX     A,@R1             ; READ IN THE LS BYTE
347F FF        2162           MOV      R7,A              ; SAVE IN R7 TEMPORARILY
3480 70F6      2163           JNZ      ADRSERR           ; LS BYTE SHOULD BE 0
3482 7424      2164           MOV      A,#LOW LOGS1      ; GET ADDRESS OF HOLDING REGISTER
3484 B121      2165           ACALL    WRITERAM          ; WRITE IT OUT
3486 09        2166           INC      R1                ; POINT TO THE MIDDLE BYTE
3487 E3        2167           MOVX     A,@R1             ; READ IT IN
3488 F2        2168           MOVX     @R0,A             ; WRITE IT OUT
3489 20E0EC    2169           JB       ACC.0,ADRSERR     ; THE 256 BIT SHOULD ALSO BE 0
348C 09        2170           INC      R1                ; POINT TO THE MS BYTE
348D E3        2171           MOVX     A,@R1             ; READ IT IN
348E F2        2172           MOVX     @R0,A             ; WRITE IT OUT
               2173  *
               2174  ****************************************************************
               2175  *           SET UP A LOOP TO GO THROUGH ALL 3 INTERLEAVES AND PERFORM
               2176  *           THE CORRECTIONS WHEN NECESSARY
               2177  ****************************************************************
               2178  *
               2179  *
               2180  *
348F 7900      2181           MOV      R1,#0             ; START WITH INTERLEAVE 0
3491 B10C      2182 CORRECTLP ACALL    SETWORK           ; SET UP MICRO CHANNEL POINTER
3493 7425      2183           MOV      A,#LOW LOGS2      ; GET ADDRESS OF DISK CHANNEL POINTER
3495 B135      2184           ACALL    READRAM           ; READ OUT MIDDLE BYTE
3497 F583      2185           MOV      DPH,A             ; SAVE IT
```

```
2186 *
2187 *****************************************************
2188 *     CHCEK IF THE DISK CHANNEL POINTER IS 0. IF SO, SET IT
2189 *     TO THE ROLLOVER VALUE
2190 *
2191 *****************************************************
2192 *
3499 4583    2193           ORL     A,DPH
349B 7003    2194           JNZ     SUB512              ; CHECK FOR 0
349D 758300  2195           MOV     DPH,#HIGH SYS_AREA  ; WE DIDN'T ROLL OVER
             2196                                       ; GET VALUE OF TOB
             2197 *
             2198 *****************************************************
             2199 *     SUBTRACT 512 FROM THE DISK CHANNEL POINTER TO GET TO
             2200 *     THE START OF THE SECTOR
             2201 *
             2202 *****************************************************
             2203 *
34A0 E583    2205 SUB512    MOV     A,DPH               ; GET THE MIDDLE VALUE
34A2 C3      2206           CLR     C                   ; PREPARE FOR SUBTRACT
34A3 9402    2207           SUBB    A,#2                ; SUBTRACT OUT 512 WORTH (REV 03 FIXED)
34A5 F583    2208           MOV     DPH,A               ; SAVE THE VALUE
             2209 *
             2210 *****************************************************
             2211 *     COMPUTE THE ADDRESS OF THE X & Y FOR THIS INTERLEAVE
             2212 *
             2213 *****************************************************
             2214 *
34A7 E9      2216           MOV     A,R1                ; GET THE INTERLEAVE
34A8 23      2217           RL      A                   ; MULTIPLY BY 2
34A9 29      2218           ADD     A,R1                ; MULTIPLY BY 3
34AA 2427    2219           ADD     A,#LOW XOLD         ; GET STARTING ADDRESS OF X&Y
             2220 *
             2221 *****************************************************
             2222 *     ADD THE X (ERROR OFFSET) TO THE STARTING ADDRESS OF THE
             2223 *     SECTOR IN ERROR TO GET THE ACTUAL ADDRESS OF THE ERROR
             2224 *     IF THE OFFSET IS >=512, IGNORE IT
             2225 *
             2226 *****************************************************
             2227 *
             2228 *
34AC B135    2229           ACALL   READRAM
34AE F582    2230           MOV     DPL,A               ; READ THE LOW BYTE OF THE X
34B0 E2      2231           MOVX    A,@R0               ; SAVE IN LOW BYTE (WHICH PREVIOUSLY HAD TO BE 0
34B1 20E114  2232           JB      ACC.1,NEXT_INT      ; READ IN HIGH BYTE
34B4 2583    2233           ADD     A,DPH               ; IF 512 BIT IS SET, SKIP TO NEXT INTERLEAVE
34B6 F583    2234           MOV     DPH,A               ; ADD TO MIDDLE BYTE
             2235 *
```

```
2236  *****************************************************************
2237  *             READ IN THE Y BYTE (THE CORRECTION MASK) AND SAVE IT.
2238  *             THEN SET THE MCRO CHANNEL POINTER REGISTERS TO THE ERROR
2239  *             ADDRESS AND READ IN THE BYTE IN ERROR.
2240  *
2241  *****************************************************************
2242  *
2243  *
34B8 E2        2244           MOVX    A,@R0           ; READ IN THE Y BYTE
34B9 FE        2245           MOV     R6,A            ; SAVE TEMPORARILY
34BA B10F      2246           ACALL   SETDRAMAD       ; SET UP THE DYNAMIC RAM ADDRESS
34BC E582      2247           MOV     A,DPL           ; GET LS BYTE OF DRAM ADDRESS
34BE B135      2248           ACALL   READRAM         ; READ IN THE BYTE IN ERROR
2249  *
2250  *****************************************************************
2251  *             PERFORM THE CORRECTION AND REWRITE THE BYTE
2252  *****************************************************************
2253  *
2254  *
2255  *
34C0 6E        2256           XRL     A,R6            ; XOR WITH Y (CORRECTION MASK)
34C1 FF        2257           MOV     R7,A            ; SAVE IN R7
34C2 B10F      2258           ACALL   SETDRAMAD       ; SET UP THE LOCATION POINTERS
34C4 E582      2259           MOV     A,DPL           ; GET LS BYTE OF DRAM ADDRESS
34C6 B121      2260           ACALL   WRITERAM        ; RE-WRITE THE CORRECTED BYTE
2261  *
2262  *****************************************************************
2263  *             STEP TO THE NEXT INTERLEAVE AND CHECK IF DONE
2264  *****************************************************************
2265  *
2266  *
2267  *
34C8 09        2268  NEXT_INT INC     R1              ; STEP TO THE NEXT INTERLEAVE
34C9 B903C5    2269           CJNE    R1,#3,CORRECTLP ; CHECK IF DONE
2270  *
2271  *****************************************************************
2272  *             RESTORE THE DISK CHANNEL ADDRESS POINTER
2273  *****************************************************************
2274  *
2275  *
2276  *
34CC 89F0      2277  DONE:    MOV     B,R1            ; SAVE INTERLEAVE IN B
34CE B10C      2278           ACALL   SETWORK         ; SET UP WORKING ADDRESS
34D0 7424      2279           MOV     A,#LOW LOGS1    ; GET SAVING ADDRESS OF DCPLS
34D2 B135      2280           ACALL   READRAM         ; READ IN THE LS BYTE
34D4 7900      2281           MOV     R1,#DCPLO       ; POINT TO DISK POINTER LS
34D6 F3        2282           MOVX    @R1,A           ; RESTORE DCPLS
34D7 E2        2283           MOVX    A,@R0           ; GET MIDDLE BYTE
34D8 09        2284           INC     R1              ; POINT TO DCPMID
34D9 F3        2285           MOVX    @R1,A           ; RESTORE DCPMID
```

```
34DA 09              2286                    INC      R1              ; POINT TO DCPMS
34DB E2              2287                    MOVX     A,@R0           ; GET MS BYTE
34DC F3              2288                    MOVX     @R1,A           ; RESTORE DCPMS
                     2289              *     MOV      A,B             ; GET BACK INTERLEAVE
                     2290              *     CJNE     A,#0,DONE1      ; IF ECC ERROR IN ECC FIELD: DONT REPORT ERROR
                     2291
                     2292              *     MOV      A,#00H          ; SET ECC ERROR IN ECC FIELD
                     2293              *     LJMP     ECCRET          ; REPORT AS CORRECTABLE ECC ERROR
                     2294
34DD 7400            2295      DONE1         MOV      A,#00H          ; SET CORRECTABLE SENSE
34DF 023477          2296                    LJMP     ECCRET
                     2297
                     2298      ;*********************************************************
                     2299      *           SWAP THE INTERLEAVES POINTED TO BE R1, R6
                     2300      *
                     2301      ;*********************************************************
                     2302      *
                     2303      *
34E2 75F003          2304      SWAP          MOV      B,#3            ; SET UP A BYTE COUNTER
34E5 E9              2305      SWAPLP        MOV      A,R1            ; GET ADDRESS OF FIRST X
34E6 B135            2306                    ACALL    READRAM         ; READ IT IN
34E8 F582            2307                    MOV      DPL,A           ; SAVE TEMPORARILY
34EA EE              2308                    MOV      A,R6            ; GET ADDRESS OF 2ND X
34EB B135            2309                    ACALL    READRAM         ; READ IT IN
34ED FF              2310                    MOV      R7,A            ; SAVE IN ORDER TO WRITE IT
34EE E9              2311                    MOV      A,R1            ; GET ADDRESS OF 1ST
34EF B121            2312                    ACALL    WRITERAM        ; WRITE IT
34F1 AF82            2313                    MOV      R7,DPL          ; GET THE FIRST BYTE
34F3 EE              2314                    MOV      A,R6            ; GET THE ADDRESS
34F4 B121            2315                    ACALL    WRITERAM        ; WRITE IT OUT
34F6 09              2316                    INC      R1              ; BUMP THE POINTERS
34F7 0E              2317                    INC      R6
34F8 D5F0EA          2318                    DJNZ     B,SWAPLP        ; DO 3 TIMES
34FB 22              2319      SORTRET       RET
                     2320      ;*********************************************************
                     2321      *           SPAN_CHECK
                     2322      *     CHECKS REQUIRED CORRECTION SPAN AGAINST ECC_SPAN
                     2323      *     USED TO DETERMINE IF ERROR CORRECTION SHOULD BE ATTEMPTED
                     2324      *
                     2325      *           IF CY=1 ERROR IS UNCORRECTABLE
                     2326      ;*********************************************************
                     2327      SPAN_CHECK
34FC 7D10            2328                    MOV      R5,#24-8        ; MAXIMUM THREE BYTE ERROR LENGTH
34FE 0D              2329                    INC      R5
34FF 1D              2330      SP_CHK_LP1:   DEC      R5              ; COUNT THE NUMBER OF BITS
3500 13              2331                    RRC      A               ; TO BE CORRECTED IN THE
3501 50FC            2332                    JNC      SP_CHK_LP1      ; LSB OF THE ERROR
                     2333
3503 0D              2334                    INC      R5
3504 1D              2335      SP_CHK_LP2:   DEC      R5              ; COUNT THE NUMBER OF BITS
3505 33              2336                    RLC      A               ; TO BE CORRECTED IN THE
```

```
3506 50FC              2337               JNC       SP_CHK_LP2       ; MSB OF THE ERROR
                       2338       ************************************************************
3508 BD1100            2339 SP_CHK_RET: CJNE  R5,#ECC_SPAN,SP_CHK_RET ; COMPARE TO ALLOWABLE SPAN
350B 22                2340       RET                                ; RETURN WITH CARRY FLAG
                       2342       ************************************************************
                       2343       *       SETWORK
                       2344       *       SETS UP MCRO CHANNEL POINTER TO 3FXX
                       2345       ************************************************************
                       2346       *
                       2347       *
350C 758320            2348 SETWORK     MOV    DPH,#HIGH ECC_WRK_SPC ; SET UP MIDDLE BYTE
                       2349       *
                       2350       *
                       2351       ************************************************************
                       2352       *       SETDRAMAD
                       2353       *       INPUT: DPH=MCP_MD
                       2354       ************************************************************
                       2355       *
                       2356       *
350F 7800              2357 SETDRAMAD   MOV    R0,#MCROMD    ; GET ADDRESS OF MIDDLE BYTE
3511 E583              2358               MOV    A,DPH         ; GET VALUE
3513 F2                2359               MOVX   @R0,A         ; OUTPUT IT
3514 7400              2360               MOV    A,#00
3516 08                2361               INC    R0
3517 F2                2362               MOVX   @R0,A
3518 22                2363               RET
                       2365       ************************************************************
                       2366       *       MOD
                       2367       *       INPUT: A,CY = VALUE TO BE MOD'ED
                       2368       *       OUTPUT  A = MOD
                       2369       ************************************************************
                       2370       *
                       2371       *
3519 5001              2372 MOD         JNC    MOD1          ; NO CARRY
351B 04                2373               INC    A             ; SUBTRACT OUT 255
351C B4FF01            2374 MOD1          CJNE   A,#255,MOD2   ; CHECK FOR 255
351F E4                2375               CLR    A             ; IF SO, SET TO 0
3520 22                2376 MOD2          RET
                       2378       ************************************************************
                       2379       *       WRITERAM
                       2380       *       INPUT: A = RAM ADDRESS, R7 = VALUE TO BE WRITTEN
                       2382       ************************************************************
                       2383       *
                       2384       *
3521 7800              2385 WRITERAM    MOV    R0,#MCROLO    ; GET MICP_LO
3523 CD                2386               XCH    A,R5          ; SAVE NEW MCRLO DATA IN B
3524 08                2387               INC    R0
3525 E2                2388               MOVX   A,@R0         ; READ CURRENT MCROMD
```

```
3526 CD        2389            XCH     A,R5        ; AND SAVE IN B
3527 18        2390            DEC     R0          ; UPDATE MCROLO
3528 F2        2391            MOVX    @R0,A       ; SET UP ADDRESS REGISTER
3529 08        2392            INC     R0
352A CD        2393            XCH     A,R5
352B F2        2394            MOVX    @R0,A       ; RESTORE MCROMD
352C 08        2395            INC     R0
352D 7400      2396            MOV     A,#00
352F F2        2397            MOVX    @R0,A       ; SET MCROHI = 0
               2398
3530 EF        2399            MOV     A,R7        ; GET THE DATA BYTE
3531 7800      2400    WRR     MOV     R0,#BUFREG  ; GET DICEY BUFFER REG.
3533 F2        2401            MOVX    @R0,A       ; WRITE THE RAM
3534 22        2402            RET
               2403    *
               2404    *****************************************************
               2405    *
               2406    *       READRAM
               2407    *       INPUT : A = RAM ADDRESS
               2408    *       OUTPUT: A = RAM VALUE
               2409    *
               2410    *****************************************************
               2411    *
3535 7800      2412    READRAM MOV     R0,#MCROLO  ; GET THE MICP_LO
3537 CD        2413            XCH     A,R5        ; SAVE NEW MCRLO DATA IN B
3538 08        2414            INC     R0
3539 E2        2415            MOVX    A,@R0       ; READ CURRENT MCROMD
353A CD        2416            XCH     A,R5        ; AND SAVE IN B
353B 18        2417            DEC     R0
353C F2        2418            MOVX    @R0,A       ; UPDATE MCROLO
353D 08        2419            INC     R0
353E CD        2420            XCH     A,R5
353F F2        2421            MOVX    @R0,A       ; SET ADDRESS INTO MICP_LO
3540 08        2422            INC     R0
3541 7400      2423            MOV     A,#00
3543 F2        2424            MOVX    @R0,A       ; RESTORE MCROMD
3544 7800      2425            MOV     R0,#BUFREG  ; SET MCROHI = 0
3546 E2        2426            MOV     R0,#BUFREG  ; GET DICEY BUFFER REGISTER
3547 22        2427            MOVX    A,@R0       ; READ IN THE BYTE FROM RAM
               2428            RET
               2430    *
               2431    *
               2432    *
               2433    *
               2434    *
               2435    LOG     THIS IS THE GALOIS FIELD LOG TABLE 3548 00003E147C 
354D 285224BA38
3552 66DD904962
3557 3C        2435    LOG     DB      0,0,3EH,14H,7CH,28H,52H,24H,0BAH,38H,66H,0DDH,90H,49H,62H,3CH

3558 FB507667A4 2436           DB      0FBH,50H,76H,67H,0A4H,48H,1CH,5DH,0CEH,0ECH,87H,4CH,0A0H,0F1H,7AH,79H
```

| | | | |
|---|---|---|---|
| 355D | 481C5DCEEC | | |
| 3562 | B74CA0F17A | | |
| 3567 | 79 | | |
| 3568 | 378DBE6DB4 | 2437 | DB 37H, 8DH, BEH, 6DH, 0B4H, 0C0H, 0A5H, 6, 0E2H, 0BDH, 86H, 1, 5AH, 60H, 9BH, 0C6H |
| 356D | C0A506E2BD | | |
| 3572 | 86015A609B | | |
| 3577 | C6 | | |
| 3578 | 0D022B64C5 | 2438 | DB 0DH, 2, 2BH, 64H, 0C5H, 7BH, 8AH, 0FAH, 0DEH, 71H, 30H, 2DH, 0BBH, 6FH, 0B7H, 5CH |
| 357D | 7BBAFADE71 | | |
| 3582 | 302DBB6FB7 | | |
| 3587 | 5C | | |
| 3588 | 7570CBD3CC | 2439 | DB 75H, 70H, 0CBH, 0D3H, 0CCH, 0BBH, 0ABH, 83H, 0F2H, 0F4H, 0FEH, 85H, 0E3H, 41H, 44H, 11H |
| 358D | BBAB83F2F4 | | |
| 3592 | FEB5E34144 | | |
| 3597 | 11 | | |
| 3598 | 2192FB16C4 | 2440 | DB 21H, 92H, 0FBH, 16H, 0C4H, 78H, 3FH, 0F3H, 98H, 0FH, 9EH, 5EH, 0D9H, 9DH, 5, 8FH |
| 359D | 783FF3980F | | |
| 35A2 | 9E5ED99D05 | | |
| 35A7 | 8F | | |
| 35A8 | 4B0C40A169 | 2441 | DB 4BH, 0CH, 40H, 0A1H, 69H, 81H, 0A2H, 0BEH, 4, 1AH, 0B9H, 6CH, 0CBH, 56H, 39H, 0D4H |
| 35AD | 81A2BE041A | | |
| 35B2 | B96CCB5639 | | |
| 35B7 | D4 | | |
| 35B8 | 1DDAAFAB6E | 2442 | DB 1DH, 0DAH, 0AFH, 0ABH, 6EH, 1BH, 6BH, 74H, 0F6H, 8BH, 0ADH, 0D1H, 0F5H, 15H, 9AH, 27H |
| 35BD | 1B6B74F6BB | | |
| 35C2 | ADD1F5159A | | |
| 35C7 | 27 | | |
| 35C8 | B33BAE0E0A | 2443 | DB 0B3H, 3BH, 0AEH, 0EH, 0AH, 1FH, 12H, 29H, 0BH, 0FDH, 0F9H, 9FH, 0E9H, 0E5H, 0C1H, 0D5H |
| 35CD | 1F1229OBFD | | |
| 35D2 | F99FE9E5C1 | | |
| 35D7 | D5 | | |
| 35D8 | 311E33EE3D | 2444 | DB 31H, 1EH, 33H, 0EEH, 3DH, 0BCH, 0C3H, 26H, 22H, 88H, 7FH, 0C2H, 82H, 0C7H, 4FH, 2FH |
| 35DD | BCC3262288 | | |
| 35E2 | 7FC282C74F | | |
| 35E7 | 2F | | |
| 35E8 | 5F51D0203A | 2445 | DB 5FH, 51H, 0D0H, 20H, 3AH, 0B5H, 54H, 0D7H, 3, 0D2H, 0B6H, 47H, 7DH, 45H, 32H, 95H |
| 35ED | B554D703D2 | | |
| 35F2 | B6477D4532 | | |
| 35F7 | 95 | | |
| 35F8 | D6EB4D93DC | 2446 | DB 0D6H, 0EBH, 4DH, 93H, 0DCH, 36H, 9CH, 6AH, 1BH, 96H, 0DBH, 2EH, 43H, 80H, 0CDH, 63H |
| 35FD | 369C6A1B96 | | |
| 3602 | DB2E4380CD | | |
| 3607 | 63 | | |
| 3608 | B9F04AB47E | 2447 | DB 0B9H, 0F0H, 4AH, 84H, 7EH, 0E7H, 0DFH, 0B0H, 0A7H, 97H, 0BFH, 61H, 0E0H, 0EAH, 0FCH, 0CFH |
| 360D | E7DFB0A797 | | |
| 3612 | BF61E0EAFC | | |
| 3617 | CF | | |

```
3618  422558EFF7      2448            DB    42H, 25H, 58H, 0EFH, 0F7H, 2CH, 0AAH, 55H, 7, 57H, 94H, 9, 77H, 99H, 13H, 0E1H
361D  2CAA550757
3622  9409779913
3627  E1
3628  5BA319CAED      2449            DB    5BH, 0A3H, 19H, 0CAH, 0EDH, 17H, 0E6H, 0B1H, 0ACH, 91H, 59H, 23H, 0A9H, 72H, 0B2H, 46H
362D  17E6B1AC91
3632  5923A972B2
3637  46
3638  354EC9A6EB      2450            DB    35H, 4EH, 0C9H, 0A6H, 0EBH, 2AH, 10H, 68H, 34H, 8, 53H, 0E4H, 0D8H, 73H, 65H, 0BCH
363D  2A1068340B
3642  53E4D87365
3647  BC
      2451   *
      2452   *
      2453   *
      2454   *
      2455   *
      2456   ANTILOG     THIS IS THE GALOIS FIELD ANTILOG TABLE
3648  012B31A868      2457            DB    1, 2BH, 31H, 0A8H, 68H, 5EH, 27H, 0D8H, 0F9H, 0DBH, 84H, 88H, 61H, 30H, 83H, 55H
364D  5E27D8F9DB
3652  8488613083
3657  55
3658  F64F86DE03      2458            DB    0F6H, 4FH, 86H, 0DEH, 3, 7DH, 53H, 0E5H, 0BBH, 0E2H, 69H, 75H, 16H, 70H, 91H, 85H
365D  7D53E5BBE2
3662  6975167091
3667  85
3668  A35098EB07      2459            DB    0A3H, 50H, 98H, 0EBH, 7, 0D1H, 97H, 7FH, 5, 87H, 0F5H, 32H, 0D5H, 3BH, 0BBH, 9FH
366D  D1977F0587
3672  F532D53BBB
3677  9F
3678  3A90AE92F8      2460            DB    3AH, 90H, 0AEH, 92H, 0F8H, 20H, 9, 6EH, 0A4H, 81H, 0FH, 94H, 2, 56H
367D  F0B520096E
3682  A4810F9402
3687  56
3688  624DD0BC4E      2461            DB    62H, 4DH, 0D0H, 0BCH, 4EH, 0ADH, 0EFH, 0ABH, 15H, 0DH, 0C2H, 60H, 1BH, 0B2H, 0F1H, 09EH
368D  ADEFAB150D
3692  C2601BB2F1
3697  9E
3698  11A106FAA6      2462            DB    11H, 0A1H, 6, 0FAH, 0A6H, 0D7H, 6DH, 0D9H, 0D2H, 0EAH, 2CH, 0E0H, 3FH, 17H, 5EH, 0A0H
369D  D76DD9D2EA
36A2  2CE03F175B
36A7  A0
36A8  2DCB0EBF33      2463            DB    2DH, 0CBH, 0EH, 0BFH, 33H, 0FEH, 0AH, 13H, 0F7H, 64H, 0B7H, 76H, 6BH, 23H, 74H, 3DH
36AD  FE0A13F764
36B2  B776B2374
36B7  3D
36B8  4139EDFD77      2464            DB    41H, 39H, 0EDH, 0FDH, 77H, 40H, 12H, 0DCH, 55H, 1FH, 1EH, 35H, 4, 0ACH, 0C4H, 9AH
36BD  4012DC551F
36C2  1E3504ACC4
36C7  9A
36C8  BD659C47C3      2465            DB    0BDH, 65H, 9CH, 47H, 0C3H, 4BH, 2AH, 1AH, 99H, 0C0H, 36H, 79H, 0FFH, 21H, 22H, 5FH
```

```
36CD  4B2A1A99C0
36D2  3679FF2122
36D7  5F
36D8  0CE951B3DA                    DB    0CH, 0E9H, 51H, 0B3H, 0DAH, 0AFH, 0B9H, 0C9H, 58H, 0DDH, 7EH, 2EH, 0B6H, 5DH, 5AH, 8BH
36DD  AFB9C958DD
36E2  7E2EB65D5A
36E7  8B

36E8  1C6366E114                    DB    1CH, 63H, 66H, 0E1H, 14H, 26H, 0F3H, 0CBH, 73H, 0ECH, 0D6H, 46H, 0EBH, 7AH, 82H, 72H
36ED  26F3CB73EC
36F2  D646EB7A82
36F7  72

36F8  C7E7EE8024                    DB    0C7H, 0E7H, 0EEH, 80H, 24H, 0A5H, 0AAH, 3EH, 3CH, 6AH, B, 45H, 95H, 29H, 67H, 0CAH
36FD  A5AA3E3C6A
3702  0B45952967
3707  CA 3708  25BE9B9654                    DB    25H, 8EH, 9BH, 96H, 54H, 34H, 2FH, 9DH, 6CH, 0F2H, 0E3H, 42H, 44H, 0BEH, 18H, 0CFH
370D  342F9D6CF2
3712  E34244BE18
3717  CF

3718  A27BA9436F                    DB    0A2H, 7BH, 0A9H, 43H, 6FH, 8FH, 0B0H, 0A7H, 0FCH, 5CH, 71H, 0BAH, 0B4H, 0BH, 38H, 0C6H
371D  8FB0A7FC5C
3722  71BAB40B38
3727  C6

3728  CCDF2B4CFB                    DB    0CCH, 0DFH, 2BH, 4CH, 0FBH, 8DH, 0E6H, 0C5H, 0B1H, 8CH, 0CDH, 0F4H, 19H, 0E4H, 93H, 0D3H
372D  8DE6C5B18C
3732  CDF419E493
3737  D3

3738  C11D485749                    DB    0C1H, 1DH, 48H, 57H, 49H, 7CH, 78H, 0D4H, 10H, 8AH, 37H, 52H, 0CEH, 89H, 4AH, 0
373D  7C78D4108A
3742  3752CE894A
3747  00
```

```
2472 ****************************************************************
2515 *                                                              *
2516 *                                                              *
2517 *                                                              *
2518 *************************  VERIFY  ****************************
2519 *                                                              *
2520 *                                                              *
2521 *         BIT:   7    6    5    4    3    2    1    0          *
2522 *      BYTE:                                                   *
2523 *         0      0    0    0    1    0    1    1    1          *
2524 *         1      -- LUN --     0    0    0    0    0           *
2525 *         2      LOGICAL BLOCK ADDRESS (MSB)                   *
2526 *         3      LOGICAL BLOCK ADDRESS                         *
2527 *         4      LOGICAL BLOCK ADDRESS                         *
2528 *         5      LOGICAL BLOCK ADDRESS (LSB)                   *
2529 *         6      0    0    0    0    0    0    0    0          *
2530 *         7      VERIFICATION LENGTH (MSB)                     *
2531 *         8      VERIFICATION LENGTH (LSB)                     *
2532 *         9      CONTROL                                       *
```

```
                  2533  *------------------------------------------------------------
                  2534
3748 E500         2535  VERIFY        MOV     A,CMDB1             ; LOOK AT CMND BYTE 1
374A 30E106       2536                JNB     ACC.1,VER_START     ; IF BYTE CHECK IS OFF: OK TO GO ON
                  2537
374D 900000       2538                MOV     DPTR,#EC_INV_FIELD
3750 023901       2539                LJMP    VER_BOMB_OUT        ; NOT ALLOW TO DO BYTE VERIFY
                  2540  *
                  2541  *    CHECK THAT THE COMMAND IS REASONABLE
                  2542  *
                  2543
3753 200014       2544  VER_START     JB      ILLEGAL_LUN,DONT_VER ;CHECK IF MAIN-LOOP FOUND VALID LUN
                  2545
3756 E500         2546                MOV     A,CMDB7
3758 4500         2547                ORL     A,CMDB8             ;CHECK VERIFY LENGTH
375A 600E         2548                JZ      DONT_VER            ;IF ZERO DONT READ
                  2549
375C 120000       2550                CALL    CHECK_READY
375F 7009         2551                JNZ     DONT_VER            ;CHECK IF DRIVE READY
                  2552
3761 120000       2553                CALL    LBA_CHS             ;CONVERT TO CHS ADDRESSING MODE
3764 7004         2554                JNZ     DONT_VER            ;AND TEST FOR VALID LBA
                  2555
3766 5146         2556                CALL    CHECK_XFER_LEN      ;MAKE SURE LAST BLOCK TO TRANSFER IS ON
3768 8003         2557                SJMP    VER_POS_HEAD        ;THE DISC
                  2558
376A 023BF3       2559  DONT_VER      LJMP    VERIFY_EXIT         ;EXIT VERIFY
                  2560  *
                  2561  *   POSITION HEAD FOR READING
                  2562  *
376D 120000       2563  VER_POS_HEAD  CALL    SEEK_SETUP          ;START THE SEEK
3770 120000       2564                CALL    UPDT_DEFECT_SYS     ;SEE IF THIS LBA IS MAPPED OUT
                  2565
3773 70F5         2566                JNZ     DONT_VER            ;IF DEFECT SYSTEM BROKEN, STOP
                  2567
3775 300003       2568                JNB     OFFTRK_SEC,VER_MODE_INIT ;IF NOT AN OFFTRACK DEFECT DONT UPDATE SEE
3778 120000       2569                LCALL   SEEK_SETUP
                  2570
                  2572  *
                  2573  *   DETERMINE READ BEHAVIOR (READ MODE SELECT PARAMETERS)
                  2574  *
                  2575
377B 900000       2576  VER_MODE_INIT MOV     DPTR,#MODE_BLK_SIZE ;GET BLK_SIZE FROM MODE TABLES
377F 120000       2577                CALL    SET_MICRO_ADRS
3781 E2           2578                MOVX    A,@R0
3782 C3           2579                CLR     C
3783 13           2580                RRC     A                   ;PUT BLOCKSIZE IN SECTOR UNITS
3784 F500         2581                MOV     BLK_SIZE,A          ;SAVE AWAY THE SIZE
                  2582
                  2583  *
                  2584  *   DISCONNECT IF NECESSARY
```

```
                2585  *
3786 C200       2586           CLR     DISCONNECTED            ;INITIALIZE TO OUR CURRENT STATUS
3788 30000C     2587           JNB     DISCON_OK,VER_INIT      ;DONT DISCONNECT IF NOT ALLOWED
                2588
378B 7A00       2589           MOV     R2,#MSG_DISCON          ;NOW SEND DISCONNECT MESSAGE
378D 120000     2590           LCALL   MESSAGE_IN
3790 7005       2591           JNZ     VER_INIT                ;IF MESSAGE NOT ACCEPTED, NO DISCONNECT
                2592
3792 120000     2593           LCALL   BUS_FREE
3795 D200       2594           SETB    DISCONNECTED            ;HAND_ C
                2595
                2596
                2597  ;***************************************************************
                2598  *  2; INITIALIZE FOR THE READ
                2599  ;***************************************************************
                2600
                2601
                2602  *
                2603  *     SET UP THE HARDWARE
                2604  *
                2605
3797 7800       2606  VER_INIT MOV    R0,#CONFIG              ;RESET DICEY CONFIGURATION
3799 74DE       2607           MOV    A,#11011110B            ;(BIT 7) PLL HI BW ENAB       = ON
379B F2         2608           MOVX   @R0,A                   ;(BIT 6) MICRO PNTR COUNTS    = UP
                2609                                          ;(BIT 5) RD CLK POLARITY      = NEG EDG'
                2610                                          ;(BIT 4) MEMORY REFRESH       = ON
                2611                                          ;(BIT 3) SERVOS               = ENABLED
                2612                                          ;(BIT 2) ROLL-OVER REG        = ENABLED
                2613                                          ;(BIT 1) WRITE DATA           = DISABLED
                2614                                          ;(BIT 0) WRITING TO DISK      = DISABLED
                2615
379C 7800       2616           MOV    R0,#CONFIG2             ;RESET DICEY CONFIGURATION STILL
379E 7498       2617           MOV    A,#10011000B            ;(BIT 7) RW/ABORT ON ERROR    = ON
37A0 F2         2618           MOVX   @R0,A                   ;(BIT 6) ABORT ON QUAL ERR    = OFF
                2619                                          ;(BIT 5) WRITE FAULT          = OFF
                2620                                          ;(BIT 4) WEDGE TIMER          = ON
                2621                                          ;(BIT 3) PARITY CHECK         = ENABLED
                2622                                          ;(BIT 2) ALT SER INPUTS       = DISABLED
                2623                                          ;(BIT 1) WEDGE TIMER TEST     = OFF
                2624                                          ;(BIT 0) MEMORY CONFIG        = 1 BANK X 1
                2625
37A1 900000     2626           MOV    DPTR,#0000H             ;RESET DISK POINTER TO BOTTOM OF BUFFER
37A4 515C       2627           CALL   SET_DPTR_ADRS
                2628
37A6 516B       2629           CALL   RESET_COUNTERS          ;RESET DICEY DISK AND SCSI COUNTERS
                2630
37A8 514B       2631           CALL   SAVE_STATUS             ;RESET ANY ERROR CONDITIONS
                2632
```

```
                2634  *
                2635  * INITIALIZE VARIABLES
                2636  *
37AA 900000     2637              MOV    DPTR,#MODE_MAX_RETRY      ;GET MAX_RETRY VARIABLE
37AD 120000     2638              LCALL  SET_MICRO_ADRS
                2639
                2640
37B0 E2         2641              MOVX   A,@R0
37B1 F500       2642              MOV    MAX_RETRIES,A
37B3 850000     2643              MOV    RETRY_CNT,MAX_RETRIES     ;RESET THE RETRY COUNTER
                2644
37B6 850000     2645              MOV    PBLK_CNT,BLK_SIZE         ;SET UP PARTIAL BLOCK COUNTER
                2646
37B9 E500       2647              MOV    A,SECTOR                  ;INIT PROCESSING SECTOR TO NEXT SECTOR
37BB 14         2648              DEC    A
37BC 541F       2649              ANL    A,#01FH                   ;ALWAYS USE MOD 32 ARITHMATIC ON SECTORS
37BE F500       2650              MOV    PROC_SEC,A
                2651
37C0 C200       2652              CLR    READ_PREV_FLAG            ;CLEAR READ STATUS FLAGS
37C2 C200       2653              CLR    READ_CURR_FLAG
                2654
                2655  ***************************************************************
                2656  * (3) FINISH UP INITIAL PREPARATION FOR READ
                2657  ***************************************************************
                2658
                2659
37C4 200008     2660  VER_PREP    JB     SEEK_CMPLT,VER_READY      ;WE GET ONTRACK, CONTINUE
37C7 3000FA     2661              JNB    SEEK_ERR_FLG,VER_PREP     ;WHILE WAITING, WATCH FOR SEEK ERRORS
37CA 120000     2662              CALL   QUAL_ERR_FATAL            ;IF SEEK ERRORS OCCUR, GO HANDLE THEM
37CD 80F5       2663              SJMP   VER_PREP                  ;IF WE RETURN, WE HANDLED THE SEEK ERROR
                2664
37CF C2AA       2665  VER_READY   CLR    EX1                       ;TURN OFF SCSI INTERUPT
                2666
                2667  ***************************************************************
                2668  *************** (3) READ LOOP ENTRY POINT (3) *****************
                2669  ***************************************************************
                2670
                2671
                2672
                2673
37D1 E500       2674  VER_SYNCHRONIZE MOV A,PROC_SEC                ;COMPUTE PROCESSING SECTOR - 1
37D3 14         2675              DEC    A
37D4 541F       2676              ANL    A,#1FH
                2677
37D6 300005     2678  VER_SYNC_LUP JNB   SEEK_ERR_FLG,VER_SYNC_TEST ;TEST FOR ANY SEEK ERRORS
37D9 120000     2679              CALL   QUAL_ERR_FATAL            ;IF THERE IS AN ERROR, GO FIX IT
37DC 80F3       2680              SJMP   VER_SYNCHRONIZE           ;AND RE-SYNC WHEN HANDLED
                2681
37DE B500F5     2682  VER_SYNC_TEST CJNE A,CUR_SEC,VER_SYNC_LUP     ;WAIT UNTIL WE ARE AT PROC_SEC - 1
37E1 C200       2683              CLR    RESYNC                    ;WHEN THERE WE ARE SYNCHRONIZED
                2684
```

```
                2686 ;*************************************************************
                2687 ;*************************************************************
                2688 ;* (4) ALREADY SYNCHRONOUS ENTRY POINT
                2689 ;*************************************************************
                2690 ;*************************************************************
37E3 2000EB      2691 VER_LOOP      JB      RESYNC,VER_SYNCHRONIZE
37E6 E500        2692               MOV     A,PROC_SEC                  ;SET UP TO WAIT UNTIL WE ARE AT PROC_SEC
                2693
37E8 300005      2694 VER_LUP       JNB     SEEK_ERR_FLG,VER_LUP_TEST   ;WHILE WAITING, WATCH FOR SEEK ERRORS
37EB 120000      2695               CALL    QUAL_ERR_FATAL              ;IF THERE IS A NASTY SEEK ERROR, GO RECOVE
37EE 80E1        2696               SJMP    VER_SYNCHRONIZE             ;AND RE_SYNCHRONIZE UP
                2697
37F0 B500F5      2698 VER_LUP_TEST  CJNE    A,CUR_SEC,VER_LUP           ;WAIT UNTIL WE ARE AT PROC_SEC
                2699 ;
                2700 ;* WE ARE NOW CURRENTLY OVER THE PROCESSING SECTOR
                2701 ;*
                2702 ;*
                2703
37F3 7800        2704               MOV     R0,#STATUS                  ;GET DICEY'S STATUS FOR USE THRU-OUT LOOP
37F5 E2          2705               MOVX    A,@R0
37F6 F500        2706               MOV     STATUS_SAVE,A               ;SAVE AWAY FOR FUTURE REFERENCE
                2707
37F8 30E617      2708               JNB     ACC.6,VER_CHK_ERROR         ;CHECK FOR MALFUNCTIONS
37FB 7800        2709               MOV     R0,#MALFREG
37FD E2          2710               MOVX    A,@R0
                2711
                2712 ;*>>>>>>>>>>>>>>>>>>>>> SPECIAL CODE TO IGNORE SERVO COLLISIONS FOR NOW <<<<<<<<<<<<<<
                2713 ;*
                2714 ;*
                2715
37FE 30E10E      2716               JNB     ACC.1,VER_DCY_MALF          ;TEST FOR SERVO COLLISIONS
                2717
3801 54FD        2718               ANL     A,#11111101B                ;MASK OUT THE SERVO COLLISION BIT
3803 700A        2719               JNZ     VER_DCY_MALF                ;ANY OTHER MALFUNCTION IS BAD
                2720
3805 E500        2721               MOV     A,STATUS_SAVE               ;CHECK IF DISK ACTION ABORTED
3807 30E508      2722               JNB     ACC.5,VER_CHK_ERROR         ;IF NO ABORT THEN WE'RE OKAY
                2723
380A C200        2724               CLR     READ_CURR_FLAG              ;OTHERWISE, CURRENT READ NO GOOD READS
380C 023812      2725               JMP     VER_CHK_ERROR
                2726
                2727 ;*>>>>>>>>>>>>>>>>>>>>>>>>>>>>>>>>>>>>>>>>>>>>>>>>>>>>>>>>>>>>>>
380F 02390A      2728 VER_DCY_MALF  JMP     VER_MALFUNCTION             ;HANDLE SERIOUS MALFUNCTIONS
                2729
                2730 VER_CHK_ERROR
3812 7800        2731               MOV     R0,#ERRREG                  ;GET DICEY'S ERROR STATUS FOR USE LATER
3814 E2          2732               MOVX    A,@R0
3815 F500        2733               MOV     ERROR_SAVE,A                ;SAVE IT AWAY
                2734
3817 20E006      2735               JB      ACC.0,VER_PAR_ERR           ;CHECK FOR FATAL RAM PARITY ERRORS
```

```
381A 20E103      2736            JB         ACC.1,VER_PAR_ERR
                 2737
3B1D 30E203      2738            JNB        ACC.2,VER_PREV
                 2739
                 2740
3820 023937      2741 VER_PAR_ERR JMP       VER_PARITY_ERR             ;GO HANDLE THE RAM PARITY ERROR
                 2742
                 2743 ;***************************************************************************
                 2744 ;*
                 2745 ;*     (5)    HANDLE THE READS OF THE PREVIOUS SECTOR   (5)    *
                 2746 ;*
                 2747 ;***************************************************************************
                 2748
                 2749
3823 30004A      2750 VER_PREV   JNB        READ_PREV_FLAG,VER_CURR    ;(5.1) CHECK IF WE READ THE PREV SECTOR
3826 C200        2751            CLR        READ_PREV_FLAG             ;IF WE DID, INDICATE WE WENT THRU THIS COD
                 2752
                 2753 ;*
                 2754 ;*   CHECK FOR ERRORS WHILE READING PREVIOUS SECTOR
                 2755 ;*
                 2756
3828 E500        2757            MOV        A,ERROR_SAVE               ;CHECK FOR DATA ERRORS
382A 20E70B      2758            JB         ACC.7,VER_DATA_ERR         ;NO DATA ERROR ==> PREV READ WAS OK
                 2759
382D E500        2760            MOV        A,STATUS_SAVE              ;CHECK FOR ILLEGAL ABORTS
382F 30E519      2761            JNB        ACC.5,VER_OK
                 2762
3832 900000      2763            MOV        DPTR,#EC_FALSE_ABORT
3835 023901      2764            JMP        VER_BOMB_OUT
                 2765
3838 E500        2766 VER_DATA_ERR MOV      A,STATUS_SAVE              ;DATA ERROR
383A 300009      2767            JNB        READ_CURR_FLAG,VER_ECC_ERR ;IF WE ARE CURRENTLY READING
                 2768
383D 20E506      2769            JB         ACC.5,VER_ECC_ERR          ;MAKE SURE CURRENT READ WAS ABORTED
                 2770
3840 900000      2771            MOV        DPTR,#EC_ABORT_FAIL
3843 023901      2772            JMP        VER_BOMB_OUT
                 2773
3846 C200        2774 VER_ECC_ERR CLR      READ_CURR_FLAG              ;ABORT CURRENT READ
3848 023964      2775            JMP        VER_DATA_ERROR             ;AND HANDLE THE ERROR
                 2776
                 2777
                 2778 ;***************************************************************************
                 2779 ;*
                 2780 ;*************** WE HAVE CORRECTLY READ A SECTOR ***************
                 2781 ;*
                 2782 ;***************************************************************************
                 2783
                 2784
384B E500        2785 VER_OK     MOV        A,MAX_RETRIES              ;READ A SECTOR OK
384D 6500        2786            XRL        A,RETRY_CNT                ;SEE IF WE HAD TO TRY MORE THAN ONCE
384F 6006        2787            JZ         VER_COUNT_SECT             ;IF RETRY COUNT = MAX RETRIES, NO RETRIES
```

```
3851  900000           2788          MOV    DPTR,#EC_RETRIES
3854  023901           2789          LJMP   VER_BOMB_OUT
                       2790
3857  D50016           2791 VER_COUNT_SECT  DJNZ  PBLK_CNT,VER_CURR  ;COUNT THIS READ & SEE IF WE'VE READ A BL
                       2792
                       2793  *
                       2794  * WE HAVE READ A COMPLETE BLOCK
                       2795  *
                       2796
                       2797
385A  850000           2798          MOV    PBLK_CNT,BLK_SIZE    ;RESET THE PARTIAL BLOCK COUNTER
385D  123232           2799          CALL   INC_LBA              ;THE BLOCK IS OK. POINT AT NEXT LBA
3860  E500             2800          MOV    A,BLK_CNT_LO         ;DECREMENT THE BLOCK COUNTER
3862  7002             2801          JNZ    VER_DEC_LO_BYT       ;IF LOW BYTE <> ZERO, ONLY DEC LOW BYTE
                       2802
3864  1500             2803          DEC    BLK_CNT_HI           ;OTHERWISE DEC BOTH BYTES
3866  14               2804 VER_DEC_LO_BYT  DEC    A
3867  F500             2805          MOV    BLK_CNT_LO,A
                       2806
3869  4500             2807          ORL    A,BLK_CNT_HI         ;CHECK IF BLOCK COUNT IS ZERO
386B  7003             2808          JNZ    VER_CURR             ;IF IT IS THEN WE ARE DONE
                       2809
386D  0238F3           2810          JMP    VER_COMPLETE
                       2811
                       2813  ***********************************************************
                       2814  ***********************************************************
                       2815  ******* (7) HANDLE READS OF THE CURRENT SECTOR (7) *********
                       2816  ***********************************************************
                       2817  ***********************************************************
                       2818
3870  30002E           2819 VER_CURR        JNB    READ_CURR_FLAG,VER_NEXT  ;IF NOT CURRENTLY READING, DONT SET FLAGS
3873  C200             2820          CLR    READ_CURR_FLAG                  ;UPDATE FLAGS
                       2821
3875  E500             2822          MOV    A,ERROR_SAVE         ;CHECK FOR SYNC ERRORS (THE ONLY ERROR
3877  20E40B           2823          JB     ACC.4,VER_SYNC_ERR   ;WE CAN WORRY ABOUT THIS EARLY)
                       2824
387A  20E50B           2825          JB     ACC.5,VER_SYNC_ERR
                       2826
387D  6009             2827          JZ     VER_CURR_OK
                       2828
387F  900000           2829          MOV    DPTR,#EC_DCY_IMPOS   ;ANY OTHER ERROR IMPOSSIBLE
3882  023901           2830          JMP    VER_BOMB_OUT
                       2831
3885  02394F           2832 VER_SYNC_ERR    JMP    VER_SYNC_ERROR
                       2833
3888  D200             2834 VER_CURR_OK     SETB   READ_PREV_FLAG
                       2835
388A  E4               2836          CLR    A                    ;TEST TO SEE IF WE HAVE MORE LEFT TO TRANS
388B  B5000E           2837          CJNE   A,BLK_CNT_HI,VER_MORE_LEFT  ;UPPER BYTE <> 0 ===> MORE LEFT
                       2838
```

```
3BBE E500        2839                 MOV     A,BLK_CNT_LO
3BB0             2840                 JZ      VER_NEXT          ;LOWER BYTE = 0   ===>  NO MORE LEFT
                 2841
3B92 14          2842                 DEC     A
3B93 7007        2843                 JNZ     VER_MORE_LEFT     ;NOW CHECK FOR BLK_CNT = 1
                 2844                                           ;BLK_CNT > 1  ===> MORE LEFT
3B95 7401        2845                 MOV     A,#01H            ;BLK_CNT = 1   ===>  DEPENDS ON FBLK_CNT
3B97 B50002      2846                 CJNE    A,PBLK_CNT,VER_MORE_LEFT  ;PBLK_CNT <> 1   ===> MORE LEFT
                 2847
3B9A 8005        2848                 SJMP    VER_NEXT          ;PBLK_CNT = 1 & READ'N CURR ===> NO MORE
                 2849
3B9C 120000      2850 VER_MORE_LEFT   CALL    NEXT_CHS          ;POINT AT NEXT SECTORE
3B9F 7052        2851                 JNZ     VER_COMPLETE      ;IF WE ARE PAST THE END OF THE MEDIA,
                 2852                                           ;INDICATE ERROR.  THIS SHOULD BE MADE A
                 2853                                           ;CODE MALFUNCTION LATER AS THE TEST FOR
                 2854                                           ;OVERFLOW WILL OCCUR IN THE INIT ROUTINE.
                 2855
                 2856 ;***********************************************************************
                 2857 ;***********************************************************************
                 2858 ;************       (8)  HANDLE READS OF THE NEXT SECTOR (8)  *********
                 2859 ;***********************************************************************
                 2860 ;***********************************************************************
                 2861
                 2862 *
                 2863 *  CHECK THAT ITS ALL RIGHT TO READ THE NEXT SECTOR
                 2864 *
                 2865
3BA1 300033      2867 VER_NEXT        JNB     SEEK_CMPLT,VER_END  ;DON'T READ IF NOT ON TRACK
                 2868
3BA4 200030      2869                 JB      OFFTRK_SEC,VER_END
                 2870
3BA7 20002D      2871                 JB      RESYNC,VER_END      ;DON'T READ EITHER IF NOT SYNCED UP
                 2872
3BAA E4          2873                 CLR     A
3BAB B5000F      2874                 CJNE    A,BLK_CNT_HI,VER_SECTOR_CHK  ;TEST TO SEE IF WE HAVE MORE LEFT TO TRANS
                 2875                                             ;UPPER BYTE <> 0   ===> MORE LEFT
3BAE E500        2876                 MOV     A,BLK_CNT_LO
3BB0 6025        2877                 JZ      VER_END             ;LOWER BYTE = 0   ===>  NO MORE LEFT
                 2878
3BB2 14          2879                 DEC     A
3BB3 7008        2880                 JNZ     VER_SECTOR_CHK      ;NOW CHECK FOR BLK_CNT = 1
                 2881                                             ;BLK_CNT > 1  ===> MORE LEFT
3BB5 7401        2882                 MOV     A,#01H              ;BLK_CNT = 1   ===>  DEPENDS ON FBLK_CNT
3BB7 B50003      2883                 CJNE    A,PBLK_CNT,VER_SECTOR_CHK ;PBLK_CNT <> 1   ===> MORE LEFT
                 2884
3BBA 20001A      2885                 JB      READ_PREV_FLAG,VER_END    ;PBLK_CNT = 1 ===> DEPENDS ON RE_PREV_FLG
                 2886
3BBD E500        2887 VER_SECTOR_CHK  MOV     A,PROC_SEC          ;COMPARE PROC_SEC + 1 = SECTOR
3BBF 04          2888                 INC     A
3BC0 541F        2889                 ANL     A,#1FH
```

```
3BC2 B50012              2890              CJNE        A,SECTOR,VER_END
                         2891
                         2892 *
                         2893 * ALL SYSTEMS ARE GO, SET READ NEXT
                         2894 *
                         2895
3BC5                     2896              STOREX      #DCNTRL,#81H             ;TURN ON THE TRANSFER FOR NEXT SECTOR
                              +
3BC5 7800                     +             MOV        R0,#DCNTRL
3BC7 7481                     +             MOV        A,#81H
3BC9 F2                       +             MOVX       @R0,A
                         2897
                                                                                 ;DISK ==> BUFFER WITH ECC ON
3BCA D200                2898              SETB        READ_CURR_FLAG            ;INDICATE WE ARE READING FOR NEXT PASS
                         2899
3BCC E500                2900              MOV         A,PROC_SEC
3BCE 6500                2901              XRL         A,CUR_SEC                 ;CHECK TO MAKE SURE WE ARE STILL OVER PROC
3BD0 6005                2902              JZ          VER_END
                         2903
3BD2 900000              2904              MOV         DPTR,#EC_SCSI_FRMWR       ;INDICATE AN IMPOSSIBLE CODE SYNCRONIZATIO
3BD5 802A                2905              SJMP        VER_BOMB_OUT              ;ERROR
                         2906
                         2908 *********************************************************************************
                         2909 *********************************************************************************
                         2910 *************** (9) WRAP UP THE READ LOOP (9) ************************************
                         2911 *********************************************************************************
                         2912 *********************************************************************************
                         2913
                         2914
3BD7 300008              2915 VER_END       JNB        OFFTRK_SEC,VER_INTRP_CHK  ;IF OFFTRACK SECTOR BUT NOT READING THEN
                         2916
3BDA 200005              2917              JB          READ_PREV_FLAG,VER_INTRP_CHK ;GO SEEK, ELSE GO CHECK IF SCSI COUNTER
                         2918
3BDD 120000              2919              LCALL       SEEK_SETUP                ;NEEDS UPDATEING
3BE0 C200                2920              CLR         OFFTRK_SEC
                         2921
3BE2 30BB06              2922 VER_INTRP_CHK JNB        IE1,VER_PROC_SEC          ;IF INTERRUPT NOT PENDING, FINISH UP
                         2923
3BE5 D2AA                2924              SETB        EX1
3BE7 C2AA                2925              CLR         EX1                       ;OTHERWISE ALLOW INTERRUPT TO OCCUR
3BE9 D200                2926              SETB        RESYNC                    ;AND INDICATE WE SHOULD RESYNCRONIZE LATER
                         2927
3BEB 0500                2928 VER_PROC_SEC  INC        PROC_SEC                  ;POINT PROC_SEC TO NEXT SECTOR
3BED 53001F              2929              ANL         PROC_SEC,#01FH            ;KEEP THE VALUE MOD 32
                         2930
3BF0 0237E3              2931              LJMP        VER_LOOP
                         2932
                         2934 *********************************************************************************
                         2935 *************** (10) END OF READ COMMAND (10) ***********************************
                         2936 *********************************************************************************
```

```
2937  ***********************************************************
2938  ***********************************************************
2939
2940        VER_COMPLETE
3BF3        VERIFY_EXIT
3BF3 D2AA   2941              SETB    EX1                          ;LET MAIN LOOP FINISH UP COMMAND
3BF5 D200   2942              SETB    ADRS_VALID                   ;MAKE SURE SCSI INTERRUPT BE TURN ON
3BF7 300006 2943              JNB     DISCONNECTED,VERIFY_RET      ;ALWAYS VALID ADDRESS
                                                                   ;IF NOT DISCONNECTED, DONT RECONNECT
2944
3BFA 120000 2945              LCALL   INIT_RECONNECT
3BFD 3000FD 2946 WAIT_RECONNECT JNB   RECONNECTED,WAIT_RECONNECT
2947
3900 22     2948 VERIFY_RET   RET
2949
2950
2951  ***********************************************************
2952  ***********************************************************
2953  ************ FATAL ERROR AND END ROUTINE ******************
2954  ***********************************************************
2955  ***********************************************************
2956
2957  *
2958  * THIS ROUTINE IS JUMPED TO WHEN A FATAL ERROR HAS OCCURRED AND NO FURTHER READING IS DESIRED.  THE END_FA
2959  * ROUTINE WILL TRANSFER OUT THE REMAINDER OF THE BUFFER (BUT NOT CHECK FOR RAM PARITY ERRORS.)  BEFORE JUM
2960  * TO THIS ROUTINE, THE CALLER SHOULD SET UP THE ERROR CONDITION HE WISHES REPORTED TO THE INITIATOR. THE
2961  * CALLER DOES THIS BY SETTING THE DATA POINTER TO THE COMPOSITE ERROR CODE DESCRIBING THE ERROR EVENT.
2962  * THIS WILL PUT THE SENSE KEY IN THE DATA POINTER HIGH BYTE AND THE SENSE CODE IN THE DATA POINTER LOW BYT
2963  *
2964
3901 858300 2965 VER_BOMB_OUT MOV    SENSE_KEY,DPH                 ;SAVE SENSE INFO TO YIELD CORRECT ERROR
3904 858200 2966              MOV    SENSE,DPL
2967
3907 0238F3 2968              LJMP   VERIFY_EXIT
2969
2970
2972  ***********************************************************
2973  ***********************************************************
2974  ************* (9) DICEY MALFUNCTION HANDLER ***************
2975  ***********************************************************
2976  ***********************************************************
2977
2978  *
2979  * THIS ROUTINE IS JUMPED TO WHEN THE READ CODE DETECTS A DICEY MALFUNCTION.  THERE IS NO ESCAPE
2980  *
2981
390A 30E005 2982 VER_MALFUNCTION JNB  ACC.0,VER_NOT_DC             ;CHECK FOR DATA COLLISION
390D 900000 2983              MOV    DPTR,#EC_DATA_COL
3910 80EF   2984              SJMP   VER_BOMB_OUT
2985
```

```
3912 30E105    2986 VER_NOT_DC        JNB    ACC.1,VER_NOT_COL          ;CHECK FOR SERVO COLLISION
3915 900000    2987                   MOV    DPTR,#EC_SERVO_COL
3918 80E7      2988                   SJMP   VER_BOMB_OUT
               2989
391A 30E205    2990 VER_NOT_COL       JNB    ACC.2,VER_NOT_OVRLP        ;CHECK FOR WRITE OVERLAP ERRORS
391D 900000    2991                   MOV    DPTR,#EC_WR_OVRLP
3920 80DF      2992                   SJMP   VER_BOMB_OUT
               2993
3922 30E305    2994 VER_NOT_OVRLP     JNB    ACC.3,VER_NOT_WR_PROB      ;CHECK FOR WRITE FAULT (CANT HAPPEN ')
3925 900000    2995                   MOV    DPTR,#EC_DCY_IMPOS         ;IF SO, THAT IS AN IMPOSSIBLE ERROR
3928 80D7      2996                   SJMP   VER_BOMB_OUT
               2997
392A 30E405    2998 VER_NOT_WR_PROB   JNB    ACC.4,VER_MALF_OOPS        ;CHECK FOR WEDGE TIME OUTS
392D 900000    2999                   MOV    DPTR,#EC_FYLO_WTO          ;IF SO, REPORT IT AS A FYLO FAILURE
3930 80CF      3000                   SJMP   VER_BOMB_OUT
               3001
3932 900000    3002 VER_MALF_OOPS     MOV    DPTR,#EC_DCY_IMPOS         ;WE ARE OUT OF POSSIBLE MALFUNCTIONS
3935 80CA      3003                   SJMP   VER_BOMB_OUT               ;AND SHOULD NEVER GET HERE
               3004
               3005 ****************************************************************************
               3006 ****************************************************************************
               3007 ****************               HANDLE PARITY ERRORS        ****************
               3008 ****************************************************************************
               3009 ****************************************************************************
               3010 *
               3011 * THIS ROUTINE IS JUMPED TO WHEN A BUFFER RAM PARITY ERROR IS DETECTED
               3012 * THIS ROUTINE REQUIRES THAT A COPY OF THE DICEY ERROR REGISTER BE IN THE ACC
               3013 *
3937 20E010    3017 VER_PARITY_ERR    JB     ACC.0,VER_PAR_IMPOS        ;DISK READ PARITY ERRORS IMPOSSIBLE
               3018
393A 20E108    3019                   JB     ACC.1,VER_LEGIT_PAR        ;MICRO READ PARITY ERROR ARE OK
               3020
393D 20E205    3021                   JB     ACC.2,VER_LEGIT_PAR        ;SCSI READ PARITY ERRORS ARE POSSIBLE TOO
               3022
3940 900000    3023                   MOV    DPTR,#EC_SCSI_FRMWR        ;IF NO PARITY ERROR, WHY IS THE FIRMWARE H
3943 80BC      3024                   JMP    VER_BOMB_OUT
               3025
3945 900000    3026 VER_LEGIT_PAR     MOV    DPTR,#EC_RAM_PARITY        ;INDICATE BUFFER PARITY ERROR
3948 80B7      3027                   JMP    VER_BOMB_OUT
               3028
394A 900000    3029 VER_PAR_IMPOS     MOV    DPTR,#EC_RAM_IMPOS         ;INDICATE WE GOT AN IMPOSSIBLE PARITY ERRO
394D 80B2      3030                   JMP    VER_BOMB_OUT
               3031
               3032
               3033
               3034 ****************************************************************************
               3035 ***************** SYNC AND DATA ERROR HANDLER ******************************
               3036 ****************************************************************************
```

```
      3037 ;****************************************************************
      3038 ;****************************************************************
      3039
      3040
      3041 VER_SYNC_ERROR
394F  3042            JNB     ACC.5,VER_SYNC_PAT      ;TEST FOR SYNC TIME OUT
394F 30E505 3043
3952 900000 3044      MOV     DPTR,#EC_SYNC_LATE
3955 B0AA   3045      JMP     VER_BOMB_OUT
      3046
      3047 VER_SYNC_PAT
3957 30E405 3048      JNB     ACC.4,VER_SYNC_IMPOS    ;TEST FOR SYNC PATTERN ERROR
      3049
395A 900000 3050      MOV     DPTR,#EC_SYNC_INVLD
395D B0A2   3051      JMP     VER_BOMB_OUT
      3052 VER_SYNC_IMPOS
395F 900000 3053      MOV     DPTR,#EC_SCSI_FRMWR    ;INDICATE A FIRMWARE IMPOSSIBLE ERROR
3962 B09D   3054      JMP     VER_BOMB_OUT
      3055
      3057 ;****************************************************************
      3058 ;************* HANDLE DATA (SYNDROME NON-ZERO) ERRORS ***********
      3059 ;****************************************************************
      3060
      3061
      3062 VER_DATA_ERROR
3964 300017 3063      JNB     SAVED_SYN_VALID,VER_SAVE_SYN  ;IF THIS IS OUR FIRST TIME THROUGH
                                                            ;(NO SAVED SYNDROME), SKIP COMPARING
3967 900010 3064      MOV     DPTR,#LAST_SYND        ;POINT MICRO POINTER AT SAVED SYNDROME
396A 120000 3065      CALL    SET_MICRO_ADRS
      3066
396D 7800   3067      MOV     R0,#BUFREG             ;R0 ==> SAVED SYNDROME IN BUFFER RAM
396F 7900   3068      MOV     R1,#SYND0              ;R1 ==> SYNDROME IN DICEY
3971 7A0C   3069      MOV     R2,#12                 ;R2 COUNTS THE BYTES
      3070
      3071 VER_COMPARE_LUP
3973 E2     3072      MOVX    A,@R0                  ;COMPARE ONE BYTE OF THE SYNDROME
3974 FB     3073      MOV     R3,A
3975 E3     3074      MOVX    A,@R1
3976 6B     3075      XRL     A,R3
3977 7005   3076      JNZ     VER_SAVE_SYN
      3077
3979 09     3078      INC     R1                     ;POINT AT NEXT SYNDROME BYTE
397A DAF7   3079      DJNZ    R2,VER_COMPARE_LUP
      3080
397C B01D   3081      SJMP    VER_GO_CORRECT         ;IF THEY'RE EQUAL THEN WE ARE OK TO
                                                    ;CORRECT
      3083 *
      3084 * SAVE THE SYNDROME AWAY AND CHECK FOR A ZERO SYNDROME
      3085 *
      3086
      3087 VER_SAVE_SYN
397E 900010 3087      MOV     DPTR,#LAST_SYND        ;POINT MICRO POINTER AT SYNDROME SAVE
3981 120000 3088      CALL    SET_MICRO_ADRS         ;AREA IN BUFFER RAM
```

```
3084                                                    ;R0 ==> SYNDROME SAVE AREA
3085                                                    ;R1 ==> SYNDROME IN DICEY
3086                                                    ;R2 COUNTS THE TRANSFER
3087                                                    ;R3 CHECKS FOR ZERO SYNDROMES
3984 7800       3089            MOV     R0,#BUFREG
3986 7900       3090            MOV     R1,#SYND0
3988 7A0C       3091            MOV     R2,#12
398A 7B00       3092            MOV     R3,#00
                3093
                3094
398C E3         3095 VER_SAVE_LUP  MOVX  A,@R1           ;GET A BYTE FROM DICEY
398D F2         3096            MOVX    @R0,A           ;SAVE IT IN BUFFER
398E 4B         3097            ORL     A,R3            ;AND CHECK IT FOR NON-ZERO
398F FB         3098            MOV     R3,A
3990 09         3099            INC     R1
3991 DAF9       3100            DJNZ    R2,VER_SAVE_LUP
3993 D200       3101            SETB    SAVED_SYN_VALID ;INDICATE SAVED COPY VALID FOR RETRIES
                3102
3995 EB         3103            MOV     A,R3            ;CHECK FOR A ZERO SYNDROME
3996 6011       3104            JZ      VER_GOOD_DATA   ;IF ITS NON_ZERO, WE REALLY HAD AN ERROR
                3105
3998 D50023     3106            DJNZ    RETRY_CNT,VER_RESTORE ;COUNT THIS TRY. IF TRIES LEFT THEN RETRY
                3107
                3108 *
                3109 * USE ECC TO CORRECT DATA IN THE BUFFER
                3110 *
399B 123280     3112 VER_GO_CORRECT CALL  ECC
                3113
399E 30E717     3114            JNB     ACC.7,VER_ECC_CORR   ;ECC CODES LESS THAN 80H ARE GREAT
                3115
39A1 30E00F     3116            JNB     ACC.0,VER_ECC_UNCORR ;ECC CODE 80 = UNCORRECTABLE DATA
                3117
39A4 900000     3118            MOV     DPTR,#EC_PNTR_INVLD  ;ECC CODE 81 = DATA POINTER NOT MOD 51;
39A7 2101       3119            JMP     VER_BOMB_OUT
                3120
                3121
39A9 850000     3122 VER_GOOD_DATA MOV   RETRY_CNT,MAX_RETRIES ;RESET RETRY COUNT STOPS RECOVERED ERR RPT
39AC D200       3123            SETB    RESYNC                ;IF IT IS ZERO, DATA IS FINE. INDICATE
39AE 123248     3124            CALL    SAVE_STATUS           ;NO LONGER IN SYNC. CLEAR OUT STATUS
39B1 014B       3125            JMP     VER_OK                ;FOR ERROR CHECKING
                3126
                3127 *
                3128 * THE DATA IN THE BUFFER IS UNCORRECTABLE
                3129 *
                3130
39B3 900000     3131 VER_ECC_UNCORR MOV  DPTR,#EC_DATA_UNCOR  ;INDICATE UNCORRECTABLE ERROR
39B6 2101       3132            JMP     VER_BOMB_OUT
                3133
                3134 *
                3135 * THE DATA IN THE BUFFER WAS CORRECTABLE AND HAS BEEN CORRECTED
                3136 *
                3137
39B8 900000     3138 VER_ECC_CORR MOV    DPTR,#EC_DATA_CORR   ;THE ERROR TYPE
39BB 023901     3139            LJMP    VER_BOMB_OUT
```

```
                    3140  *
                    3142  * RESTORE THE DATA POINTER AND C,H,S ADDRESS FOR RETRIES
                    3143  *
                    3144
                    3145
                    3146  VER_RESTORE
39BE                3147
39BE 120000         3148            CALL     LBA_CHS              ;POSITION OURSELVES OVER SECTOR AGAIN
                    3149
39C1 120000         3150            CALL     UPDT_DEFECT_SYS      ;ADJUST POSITION FOR SECTORS IN PBLK_CNT
39C4 E500           3151  VER_RES_LUP  MOV   A,BLK_SIZE
39C6 B50002         3152            CJNE     A,PBLK_CNT,VER_RES_MORE
39C9 8007           3153            SJMP     VER_RETRY
                    3154
39CB 120000         3155  VER_RES_MORE CALL  NEXT_CHS
39CE 1500           3156            DEC      BLK_SIZE
39D0 B0F2           3157            SJMP     VER_RES_LUP
                    3158
39D2 120000         3159  VER_RETRY   CALL   SEEK_SETUP           ;REPOSITION HEAD FOR RE-TRY
39D5 C200           3160            CLR      OFFTRK_SEC
                    3161
39D7 900000         3162            MOV      DPTR,#MODE_BLK_SIZE  ;RESET THE BLOCK SIZE, WE CORRUPTED IT
39DA 120000         3163            CALL     SET_MICRO_ADRS
39DD E2             3164            MOVX     A,@R0
39DE C3             3165            CLR      C
39DF 13             3166            RRC      A
39E0 F500           3167            MOV      BLK_SIZE,A
                    3168
39E2 0237D1         3169            JMP      VER_SYNCHRONIZE
                    3170

Errors=  0

LINE#   SYMBOL           TYPE    REFERENCES

2150   ADRSERR           A      2163,2169
  239   ADRS_VALID        E      887,2942
 2456   ANTILOG           A      1705,1760,1866
  299   BLK_CNT_HI        E      744,775,1027,1031,2803,2807,2837,2874
  300   BLK_CNT_LO        E      745,776,1025,1029,2800,2805,2839,2876
  302   BLK_SIZE          E      450,538,794,1014,1192,1197,1208,1331,1332,2581,2645,2798,3151,3156,3167
  912   BOMB_LOOP         A      913
  904   BOMB_OUT          A      707,713,737,817,862,865,929,933,937,941,945,948,966,969,972,1062,1127
  281   BUFF_CAPACITY     E      799
  277   BUFREG            E      998,1074,1095,1162,2400,2426,3067,3090
  249   BUF_TO_RAM        E      493,2594
  250   BUS_FREE          A
 1396   CHECK_LBA         A
  251   CHECK_READY       E      419,2550
 1405   CHECK_XFER_LEN    A      425,2556
 1899   CHKCONS           A      1878
```

| | | |
|---|---|---|
| 665 | CHK_ERROR | A | 645,657 |
| 1017 | CHK_FOR_ERR | A | 642 |
| 645 | CHK_MAL | A | |
| 743 | CHK_MORE | A | 872 |
| 885 | CHK_POINTER | A | |
| 1111 | CHK_RETRY | A | 826,827 |
| 831 | CHK_UPDATE | A | |
| 1108 | CHK_ZERO_SYN | A | 302 |
| 232 | CMDB0 | E | 304,2535 |
| 232 | CMDB1 | E | |
| 232 | CMDB2 | E | 293 |
| 232 | CMDB3 | E | 294 |
| 232 | CMDB4 | E | 295 |
| 232 | CMDB5 | E | 297 |
| 232 | CMDB6 | E | 299,2546 |
| 232 | CMDB7 | E | 300,2547 |
| 232 | CMDB8 | E | |
| 232 | CMDB9 | E | |
| 1072 | COMPARE | A | 1084 |
| 1078 | COMPARE_LOOP | A | |
| 871 | COMPLETED | E | |
| 854 | COMPLETE_LOOP | A | 851,868,869 |
| 1634 | COMPSYN | A | 1748 |
| 1794 | COMPX | A | 1784 |
| 867 | COMP_NO_ERROR | A | 856 |
| 864 | COMP_PAR_ERR | A | 859 |
| 887 | COMP_RETURN | A | 874 |
| 277 | CONFIG | E | 504,2607 |
| 277 | CONFIG2 | E | 514,2617 |
| 2160 | CORRECT | A | 1948,1987,2011,2016,2028,2033,2046,2051,2097,2119,2133 |
| 2182 | CORRECTLP | A | 2269 |
| 1024 | COUNT_BLOCK | A | 1018,1021 |
| 706 | COUNT_ERROR | A | 698 |
| 981 | COUNT_SEC | A | 697,719 |
| 1006 | COUNT_SECT | A | 984,988 |
| 741 | CURR_OK | A | 733 |
| 234 | CUR_SEC | E | 473,573,578,582,610,628,813,1318,2682,2698,2901 |
| 234 | CYL_HI | E | |
| 234 | CYL_LO | E | |
| 1170 | DATA_CORRECT | A | 1109,1144,1152 |
| 1070 | DATA_ERROR | A | 704 |
| B | DAY | A | |
| 276 | DCNTHI | E | 1486 |
| 276 | DCNTLO | E | 1485 |
| 277 | DCNTRL | E | 808,2896 |
| 276 | DCPLO | E | 1246,1462,2160,2281 |
| 276 | DCPMD | E | 1180 |
| 339 | DCY_ERROR | E | 909 |
| 337 | DCY_ERR_COND | E | |
| 340 | DCY_MALFUN | E | |

| | | |
|---|---|---|
| 663 | DCY_MALFUNED | A 653,655 |
| 338 | DCY_STATUS | E |
| 1028 | DEC_LOW_BYTE | A 1026 |
| 282 | DERROR_SAVE | E |
| 486 | DISCONNECT | A 471 |
| 240 | DISCONNECTED | E 469,494,564,2587,2595,2943 |
| 240 | DISCON_OK | A 470,2588 |
| 1690 | DIVSYN | E 1681 |
| 282 | DMALFUN_SAVE | A |
| 2277 | DONE | E |
| 2295 | DONE1 | A |
| 428 | DONT_READ | A 417,420,423,436 |
| 2559 | DONT_VER | A 2544,2548,2551,2554,2566 |
| 697 | DOUBLE_ERROR | A |
| 1033 | DO_COMPLETE | A 1022 |
| 1036 | DO_CURR | A 1007,1032 |
| 282 | DSTATUS_SAVE | E |
| 319 | DTE | A |
| 1586 | ECC | E 458,1019 |
| 2141 | ECCRET | A 225,1122,3112 |
| 326 | ECC_SPAN | A 1880,2151,2296 |
| 351 | ECC_WRK_SPC | E 2339 |
| 266 | EC_ABORT_FAIL | E 2771 |
| 265 | EC_DATA_COL | E 928,2983 |
| 261 | EC_DATA_CORR | E 3138 |
| 263 | EC_DATA_UNCOR | E 3131 |
| 265 | EC_DCY_HARDWR | E 736,861,940,947,2829,2995,3002 |
| 265 | EC_DCY_IMPOS | E 712,2763 |
| 266 | EC_FALSE_ABORT | E |
| 267 | EC_FYLD_HARDWR | E |
| 267 | EC_FYLD_WTO | E 944,2999 |
| 268 | EC_HALTED | E |
| 268 | EC_ILGL_RSRV | E |
| 272 | EC_INIT_DET_ERR | E |
| 268 | EC_INVALID_CMND | E |
| 269 | EC_INVALID_LUN | E |
| 268 | EC_INV_CMND | E 2538 |
| 269 | EC_INV_FIELD | E |
| 268 | EC_INV_LBA | E |
| 269 | EC_INV_LUN | E |
| 269 | EC_INV_PARAM | E |
| 271 | EC_MODE_CHNG | E |
| 270 | EC_MODE_ERR | E |
| 264 | EC_MSG_REJECT | E |
| 272 | EC_PARITY | E |
| 266 | EC_PNTR_INVLD | E 1126,3118 |
| 266 | EC_RAM_IMPOS | E 971,3029 |
| 272 | EC_RAM_PARITY | E 864,968,3026 |
| 262 | EC_RECALING | E |
| 271 | EC_RESET_OCCUR | E |

| | | |
|---|---|---|
| 261 | EC_RETRIES | E 2789 |
| 264 | EC_SCSI_ERR | E |
| 264 | EC_SCSI_FRMWR | E 706, 816, 965, 1061, 2904, 3023, 3052 |
| 272 | EC_SCSI_PARITY | E |
| 264 | EC_SELECT_FAIL | E |
| 265 | EC_SERVO_COL | E 932, 2987 |
| 262 | EC_STARTING | E |
| 263 | EC_SYNC_INVLD | E 3049 |
| 263 | EC_SYNC_LATE | E 3044 |
| 265 | EC_WR_OVRLP | E 936, 2991 |
| 1022 | END_IN_ERR | A 1019 |
| 282 | ERROR_INFO | E |
| 341 | ERROR_LBA | E 876 |
| 344 | ERROR_LBA_LSB | E |
| 343 | ERROR_LBA_MID | E |
| 342 | ERROR_LBA_MSB | E |
| 310 | ERROR_SAVE | E 667, 688, 732, 1049, 1442, 2733, 2757, 2822 |
| 277 | ERRREG | E 665, 858, 1441, 2731 |
| 1636 | EXT_READ | A 225 |
| 1152 | GETSYN | A 1663 |
| 1866 | GOOD_DATA | A 1123 |
| 322 | GOTY | A 1864 |
| 670 | GOT_ABORT_FLAG | E 550, 643, 694, 825, 1315 |
| 739 | GOT_PARITY_ERR | A |
| 1117 | GOT_SYNC_ERR | A 734, 735 |
| 842 | GO_CORRECT | A 1086 |
| 808 | GO_LOOP | A |
| 251 | GO_READ | A |
| 1126 | GO_TO_DMA | E 588 |
| 234 | HDWR_MALFUN | A |
| 239 | HEAD | E |
| 1948 | ILLEGAL_LUN | E 417, 2544 |
| 1986 | IL_000 | A |
| 1942 | IL_001 | A 1947 |
| 1985 | IL_00X | A |
| 2036 | IL_010 | A 1956 |
| 2048 | IL_011 | A 1955 |
| 1950 | IL_011C | A 2042 |
| 1935 | IL_01X | A 1940 |
| 1984 | IL_0XX | A |
| 1999 | IL_100 | A 1971 |
| 2010 | IL_101 | A 1970 |
| 2013 | IL_101B | A 2007 |
| 1965 | IL_101C | A 2005 |
| 2018 | IL_10X | A |
| 2030 | IL_110 | A 1979 |
| 2067 | IL_110C | A 2024 |
| 2078 | IL_111 | A 1978 |
| 2088 | IL_111B | A |
| | IL_111_012 | A |

| 2101 | IL_111_120 | A | 2073 |
| 2123 | IL_111_201 | A | 2084 |
| 1973 | IL_1XX | A | 1963 |
| 1958 | IL_1XX | A | 1933 |
| 1372 | INC_LBA | A | 1024, 2799 |
| 839 | INC_PROC_SEC | A | 834 |
| 250 | INIT_RECONNECT | E | 584, 2945 |
| 1881 | INTLP | A | 1877 |
| 1626 | INTLVLP | A | 1881 |
| 834 | INTRP_CHK | A | 831 |
| 1274 | INVLD_PNTR | A | 1249, 1251, 1262, 1268, 1271 |
| 350 | LAST_SYND | E | 1072, 1093, 3064, 3087 |
| 247 | LBA_CHS | E | 422, 1190, 2553, 3147 |
| 295 | LBA_LSB | E | 883, 1003, 1167, 1375, 1377 |
| 294 | LBA_MID | E | 881, 1001, 1165, 1379, 1381 |
| 293 | LBA_MSB | E | 879, 999, 1163, 1383, 1385 |
| 968 | LEGIT_PARITY | A | 962, 963 |
| 2435 | LOG | A | 1701, 1725 |
| 353 | LOGS1 | E | |
| 354 | LOGS2 | E | |
| 355 | LOGS3 | E | |
| 1728 | LP4 | A | 1732 |
| 1732 | LP41 | A | 1730 |
| 1861 | LSOK | E | 1851 |
| 277 | MALFREG | A | 646, 1444, 2709 |
| 927 | MALFUNCTION | A | 663, 867 |
| 311 | MALFUN_SAVE | E | 1445 |
| 947 | MALF_OOPS | A | 943 |
| 307 | MAX_RETRIES | E | 463, 536, 982, 987, 1170, 2642, 2643, 2785, 3122 |
| 276 | MCROLO | E | 992, 1156, 2385, 2412 |
| 276 | MCROMD | E | 995, 1159, 2357 |
| 250 | MESSAGE_IN | E | 487, 490, 2591 |
| 2372 | MOD | A | 1704, 1759, 1773 |
| 2374 | MOD1 | A | 2372 |
| 2376 | MOD2 | A | 2374 |
| 283 | MODE_BLK_SIZE | E | 445, 1203, 2576, 3162 |
| 283 | MODE_BLOCK | E | |
| 283 | MODE_ERR_FLAGS | E | 452, 1117, 1141 |
| 445 | MODE_INIT | A | 437 |
| 284 | MODE_MAX_RETRY | E | 460, 2638 |
| 283 | MODE_PAGE1 | E | |
| 284 | MODE_PAGE2 | E | |
| 1843 | MODLP | A | 1848, 1850 |
| 7 | MONTH | | |
| 753 | MORE_LEFT | A | 744, 748, 750 |
| 774 | MORE_LEFT_CHK | A | |
| 1851 | MSO | A | 1845 |
| 256 | MSG_DISCON | E | 489, 2590 |
| 256 | MSG_SAVE_DP | E | 486 |
| 1846 | MSNOTO | A | 1844 |

| | | | |
|---|---|---|---|
| 986 | NEEDED_RETRIES | A | |
| 1714 | NEXTDIV | A | 1700 |
| 1876 | NEXTINTLV | A | 1683 |
| 247 | NEXT_CHS | E | 753,1196,2850,3155 |
| 2268 | NEXT_INT | A | 2232 |
| 703 | NORM_DATA_ERR | A | 693,694,699 |
| 935 | NOT_COL | A | 931 |
| 931 | NOT_DC | A | 927 |
| 939 | NOT_OVRLP | A | 935 |
| 576 | NOT_THERE | A | 573 |
| 943 | NOT_WR_PROB | A | 939 |
| 709 | NO_DATA_ERROR | A | 689 |
| 1317 | NO_UAB | A | 1314 |
| 234 | NUM_OF_HEADS | E | 437,771,826,829,1201,2568,2869,2915,2920,3160 |
| 239 | OFFTRK_SEC | A | 565 |
| 570 | ON_TRACK | A | 1135 |
| 1138 | OUT_OF_TRIES | A | 670 |
| 961 | PARITY_ERROR | A | 961 |
| 971 | PARITY_IMPOS | A | |
| 304 | PBLK_CNT | E | 538,750,781,797,1007,1014,1193,2645,2792,2798,2846,2883,3152 |
| 318 | PER | A | 456,988,1152 |
| 1329 | PERFORM_UPDATE | A | 1317 |
| 481 | PLUS_RSULT | A | 479 |
| 1246 | POINTER_TEST | A | 226,885 |
| 434 | POS_HEAD | A | 426 |
| 297 | PROC_SEC | E | 543,570,602,622,784,812,839,840,1319,2650,2674,2692,2887,2900,2928,2929 |
| 246 | QUAL_ERR_FATAL | E | 567,607,625,2662,2679,2695 |
| 249 | RAM_TO_BUF | A | 910 |
| 398 | READ | A | 225 |
| 2412 | READRAM | A | 1671,1691,1757,1929,2184,2229,2248,2280,2306,2309 |
| 851 | READ_COMPLETE | A | 721,754,1054,1059,1146 |
| 729 | READ_CURR | A | 681,720 |
| 315 | READ_CURR_FLAG | E | 548,658,693,703,729,730,810,2653,2724,2767,2774,2819,2820,2898 |
| 825 | READ_END | A | 770,771,772,777,782,787,800,814 |
| 504 | READ_INIT | A | 470,474,483,488,491 |
| 621 | READ_LOOP | A | 842 |
| 624 | READ_LOOP2 | A | 629 |
| 628 | READ_LOOP_TEST | A | 624 |
| 770 | READ_NEXT | A | 729,746,751 |
| 719 | READ_OK | A | 710,1173 |
| 564 | READ_PREP | A | 566,568,582 |
| 681 | READ_PREV | A | 669 |
| 316 | READ_PREV_FLAG | E | 547,681,682,741,782,827,2652,2750,2751,2834,2885,2917 |
| 587 | READ_READY | A | 564 |
| 417 | READ_START | A | 404 |
| 240 | RECONNECTED | E | 585,2946 |
| 585 | RECON_LOOP | A | 585 |
| 239 | REPLC_SEC | E | |
| 1485 | RESET_COUNTERS | A | 528,2630 |
| 1180 | RESTORE | A | 1111,1136 |

| | | | |
|---|---|---|---|
| 1190 | RESTORE_CHS | A | 1198 |
| 1192 | RESTORE_LOOP | A | 1193 |
| 1196 | RESTORE_MORE | A | 1181 |
| 1183 | RESTORE_PNTR | A | |
| 320 | RESYNC | E | 611,621,772,837,1171,1321,2683,2691,2871,2926,3123 |
| 1200 | RETRY | A | 1194 |
| 306 | RETRY_CNT | E | 536,983,987,1047,1111,1134,1136,1170,2643,2786,3106,3122 |
| 10 | REV | A | |
| 584 | RE_CONNECT | A | 574 |
| 789 | ROOM_CHK | A | |
| 255 | ROVR_MDC | E | |
| 321 | SAVED_SYN_VALID | E | 545,1006,1070,1106,3062,3101 |
| 1799 | SAVEX | A | 1797 |
| 1100 | SAVE_LOOP | A | 1105 |
| 1438 | SAVE_STATUS | A | 530,1172,2632,3124 |
| 1093 | SAVE_THE_SYN | A | 1070,1082 |
| 276 | SCNTHI | E | 789,1329,1489 |
| 276 | SCNTLO | E | 1488 |
| 277 | SCNTRL | E | 1311,1338 |
| 276 | SCSILO | E | 1247,1459 |
| 276 | SCSIMD | E | |
| 234 | SECTOR | E | 476,540,787,2647,2890 |
| 784 | SECTOR_CHK | A | 775,779,781 |
| 240 | SEEK_CMPLT | E | 471,565,770,2660,2867 |
| 240 | SEEK_ERR_FLG | E | 566,606,624,2661,2678,2694 |
| 246 | SEEK_SETUP | E | 434,438,828,1200,2563,2569,2919,3159 |
| 233 | SENSE | E | 905,990,1053,1058,1139,1154,1275,2966 |
| 233 | SENSE_KEY | E | 871,904,989,1017,1052,1057,1138,1153,1274,2965 |
| 2357 | SETDRAMAD | A | 2246,2258 |
| 2348 | SETWORK | E | 1586,2182,2278 |
| 1465 | SET_ADRS | A | 1460,1463 |
| 1462 | SET_DPTR_ADRS | A | 525,2628 |
| 248 | SET_MICRO_ADRS | E | 446,453,461,877,1073,1094,1118,1142,1204,2577,2639,3065,3088,3163 |
| 1459 | SET_SPTR_ADRS | A | 526 |
| 249 | SIX_TO_TEN | A | 398 |
| 2319 | SORTRET | A | |
| 2327 | SPAN_CHECK | A | 2332 |
| 2330 | SP_CHK_LP1 | A | 2337 |
| 2335 | SP_CHK_LP2 | A | 2339 |
| 2340 | SP_CHK_RET | A | |
| 277 | STATUS | E | 639,854,912,1313,1438,2704 |
| 1313 | STATUS_LOOP | A | 1320,1322 |
| 309 | STATUS_SAVE | E | 641,656,709,907,1439,2706,2721,2760,2766 |
| 580 | STILL_NOT | A | 578 |
| 2205 | SUB512 | A | 2195 |
| 1818 | SUBL | A | 1816 |
| 1814 | SUBLP | A | 1818 |
| 2304 | SWAP | A | 1901 |
| 2305 | SWAPLP | A | 2318 |
| 352 | SYN | E | |

| 602 | SYNCHRONIZE | A | 608,621,626,659,1064,1210 |
|------|-------------|---|---|
| 1047 | SYNC_ERROR | A | 739 |
| 1064 | SYNC_ERR_RET | A | 1047 |
| 1061 | SYNC_IMPOS | A | 1056 |
| 606 | SYNC_LOOP | A | 610 |
| 610 | SYNC_TEST | A | 606 |
| 277 | SYNDO | E | 1075,1096,1639,3068,3091 |
| 1700 | SYNLP | A | 1717 |
| 255 | SYS_AREA | E | |
| 799 | TEST_FOR_ROOM | A | 795 |
| 1051 | TEST_STO | A | |
| 1056 | TEST_SYNC_ERR | A | 1051 |
| 281 | TOP_BUFF | E | |
| 2140 | UNCORR | A | 1785,2053,2075,2076,2089,2101,2103,2108,2111,2123,2125 |
| 1134 | UNCORR | A | 1120,1124 |
| 2053 | UNCOR_2B | A | 2008,2010,2013,2015,2026,2027,2030,2032,2044,2045,2048,2050 |
| 1311 | UPDATE | A | 700,832,852 |
| 317 | UPDATE_SCNT | E | 549,699,795,831,851,1015,1340 |
| 247 | UPDT_DEFECT_SYS | E | 435,1191,2564,3149 |
| 536 | VAR_INIT | A | |
| 2535 | VERIFY | A | 225 |
| 2941 | VERIFY_EXIT | A | 2559,2968 |
| 2948 | VERIFY_RET | A | 2943 |
| 2965 | VER_BOMB_OUT | A | 2539,2764,2772,2790,2830,2905,2984,2988,2992,2996,3000,3003,3024,3027,3030,3045,3050,3053,3119,3132,3139 |
| 2731 | VER_CHK_ERROR | A | 2708,2722,2725 |
| 3071 | VER_COMPARE_LUP | A | 3078 |
| 2940 | VER_COMPLETE | A | 2810,2851 |
| 2792 | VER_COUNT_SECT | A | 2787 |
| 2819 | VER_CURR | A | 2750,2792,2808 |
| 2834 | VER_CURR_OK | A | 2827 |
| 2766 | VER_DATA_ERR | A | 2758 |
| 3062 | VER_DATA_ERROR | A | 2775 |
| 2729 | VER_DCY_MALF | A | 2716,2719 |
| 2804 | VER_DEC_LO_BYT | A | 2801 |
| 3138 | VER_ECC_CORR | A | 3114 |
| 2774 | VER_ECC_ERR | A | 2767,2769 |
| 3131 | VER_ECC_UNCORR | A | 3116 |
| 2915 | VER_END | A | 2867,2869,2871,2877,2885,2890,2902 |
| 3122 | VER_GOOD_DATA | A | 3104 |
| 3112 | VER_GO_CORRECT | A | 3080 |
| 2607 | VER_INIT | A | 2588,2592 |
| 2922 | VER_INTRP_CHK | A | 2915,2917 |
| 3026 | VER_LEGIT_PAR | A | 3019,3021 |
| 2691 | VER_LOOP | A | 2931 |
| 2694 | VER_LUP | A | 2698 |
| 2678 | VER_LUP_TEST | A | 2694 |
| 2982 | VER_MALFUNCTION | A | 2729 |
| 3002 | VER_MALF_GGFS | A | 2996 |

| | | | |
|---|---|---|---|
| 2576 | VER_MODE_INIT | A | 2568 |
| 2850 | VER_MORE_LEFT | A | 2837, 2843, 2846 |
| 2867 | VER_NEXT | A | 2819, 2840, 2848 |
| 2990 | VER_NOT_COL | A | 2986 |
| 2986 | VER_NOT_DC | A | 2982 |
| 2994 | VER_NOT_OVRLP | A | 2990 |
| 2998 | VER_NOT_WR_PROB | A | 2994 |
| 2785 | VER_OK | A | 2761, 3125 |
| 3017 | VER_PARITY_ERR | A | 2741 |
| 2741 | VER_PAR_ERR | A | 2735, 2737 |
| 3029 | VER_PAR_IMPOS | A | 3017 |
| 2563 | VER_POS_HEAD | A | 2557 |
| 2660 | VER_PREP | A | 2661, 2663 |
| 2750 | VER_PREV | A | 2739 |
| 2928 | VER_PROC_SEC | A | 2922 |
| 2665 | VER_READY | A | 2660 |
| 3146 | VER_RESTORE | A | 3106 |
| 3151 | VER_RES_LUP | A | 3157 |
| 3155 | VER_RES_MORE | A | 3152 |
| 3159 | VER_RETRY | A | 3153 |
| 3095 | VER_SAVE_LUP | A | 3100 |
| 3087 | VER_SAVE_SYN | A | 3062, 3075 |
| 2887 | VER_SECTOR_CHK | A | 2874, 2880, 2883 |
| 2544 | VER_START | A | 2536 |
| 2674 | VER_SYNCHRONIZE | A | 2680, 2691, 2696, 3169 |
| 2832 | VER_SYNC_ERR | A | 2823, 2825 |
| 3041 | VER_SYNC_ERROR | A | 2832 |
| 3052 | VER_SYNC_IMPOS | A | 3047 |
| 2678 | VER_SYNC_LUP | A | 2682 |
| 3047 | VER_SYNC_PAT | A | 3042 |
| 2682 | VER_SYNC_TEST | A | 2678 |
| 2946 | WAIT_RECONNECT | A | 2946 |
| 246 | WAIT_SEEK | E | 337, 338, 339, 340, 341, 342, 343, 344, 350, 351, 352, 353, 354, 355, 356, 357, 358, 359, 360, 361, 362, 363, 364 |
| 283 | WORK_AREA | E | 1596, 1653, 1746, 1831, 2165, 2260, 2312, 2315 |
| 2385 | WRITERAM | A | |
| 241 | WRK_FLAG0 | E | 315 |
| 241 | WRK_FLAG1 | E | 316 |
| 241 | WRK_FLAG2 | E | 317 |
| 241 | WRK_FLAG3 | E | 318 |
| 242 | WRK_FLAG4 | E | 319 |
| 242 | WRK_FLAG5 | E | 320 |
| 242 | WRK_FLAG6 | E | 321 |
| 242 | WRK_FLAG7 | E | 322 |
| 235 | WRK_REG0 | E | 306 |
| 235 | WRK_REG1 | E | 307 |
| 235 | WRK_REG2 | E | 309 |
| 235 | WRK_REG3 | E | 310 |
| 235 | WRK_REG4 | E | 311 |
| 2400 | WRK_REG5 | A | 1868 |
| | WRR | | |

| | |
|---|---|
| 357 | X0HI E |
| 356 | X0LO E |
| 360 | X1HI E |
| 359 | X1LO E |
| 363 | X2HI E |
| 362 | X2LO E |
| 358 | Y0 E |
| 361 | Y1 E |
| 364 | Y2 E |
| 9 | YEAR A |

Having thus described a presently preferred embodiment of the present invention, it will now be appreciated that the objects of the invention have been fully achieved, and it will be understood by those skilled in the art that many changes in construction and circuitry and widely differing embodiments and applications of the invention will suggest themselves without departing from the spirit and scope of the invention. The disclosures and the description herein are intended to be illustrative and are not in any sense limiting of the invention, more preferably defined in scope by the following claims.

I claim:

1. In Reed-Solomon error correction code apparatus for a computing system storage device including a programmed digital microcontroller for controlling operations of the device in accordance with prestored program routines and in which useful data written on the surface of a rotating disk in finite blocks is read by a transducing mechanism and in which each finite block of data so recorded includes finite field error correction coding syndrome information appended at the end thereof for enabling detection and correction of errors within the block, an error correction code syndrome generator/decoder of minimized logic elements for calculating error correction coding syndrome information in accordance with a predetermined Galois field and syndrome generator polynomial, the generator/decoder for testing the calculated information with the appended information to signal any discrepancies indicative of an error within the data block, the generator/decoder comprising:

an input/output summing junction for receiving each incoming data block as a clocked data stream of serial bytes, an error correction code feedback path leading from the summing junction and carrying feedback values, multiplier apparatus for multiplying the feedback values by a first predetermined constant to yield first product values, for multiplying the feedback values by a second predetermined constant to yield second product values, and for multiplying the feedback values by a third predetermined constant to yield third product values, a first clocked latch stage for latching the feedback values present on the feedback path, a first summing junction for summing the latched feedback values from the first latch stage with the first product values to yield first sum values, a second clocked latch stage for latching the first sum values, a second summing junction for summing the first sum values and the second product values to yield second sum values, a third clocked latch stage for latching the second sum values, a third summing junction for summing the second sum values and the third product values to yield third sum values, a fourth clocked latch stage for latching the third sum values, the input-output summing junction for summing the third sum values with the incoming clocked stream of serial bytes to generate the feedback values, the first, second, third and fourth latch stages being clocked in synchronism with the incoming data stream of serial bytes, testing means for testing the values held in the first, second, third and fourth latch stages at the end of processing of each block thereby to determine if an error has occurred, and the first, second, third and fourth latch stages including at least one addressable, enablable bus driver for enabling syndrome byte values contained therein at the end of processing of a data block to be obtained and analyzed by the programmed digital microcontroller in accordance with Read Solomon error correction routines executed thereby for locating and correcting at least one data byte determined to be in error.

2. The error correction code syndrome generator/decoder set forth in claim 1 wherein each data block is divided into at least two interleaves, wherein the first, second, third and fourth latch stages include synchronously clocked byte serial latches corresponding in number to the number of interleaves, and wherein the syndrome generator/decoder calculates a number of syndromes corresponding in number to the number of interleaves.

3. The error correction code syndrome generator/decoder set forth in claim 2 wherein each data block is divided inside the generator/decoder into three interleaved parts, wherein each of the first, second, third and fourth latch stages includes three synchronously clocked serial latches, and wherein the syndrome generator/decoder calculates three syndromes, each syndrome corresponding to a said interleave.

4. The error correction code syndrome generator/decoder set forth in claim 3 wherein each data block includes five hundred twelve data bytes followed by twelve error correction code syndrome bytes, there being four syndrome bytes provided for each said interleave part.

5. The error correction code syndrome generator/decoder set forth in claim 4 wherein the first interleave begins with the first data byte and includes every third byte thereafter, the second interleave begins with the second data byte and includes every third byte thereafter, and the third interleave begins with the third byte and includes every third byte thereafter, and wherein the twelve syndrome bytes are appended immediately following the last data byte of the block in the order S3A, S1A, S2A, S3B, S1B, S2B, S3C, S1C, S2C, S3D, S1D, S2D, where S denotes syndrome byte, the numeral denotes the interleave number and the letters A, B, C and D denote respectively the first, second, third and fourth bytes of the syndrome.

6. The error correction code syndrome generator/decoder set forth in claim 1 wherein the Galois field is GF($2^8$) in accordance with a field generator polynomial having the form of $x^8+x^4+x^3+x^2+1$, and wherein the first term of the field is $x^5+x^3+x+1$ (which is 00101011 binary).

7. The error correction code syndrome generator/decoder set forth in claim 6 wherein the syndrome byte values are generated in accordance with a syndrome generator polynomial having the form $X^4+\text{Alpha}^{18}X^3+\text{Alpha}^{89}X^2+\text{Alpha}^{18}X+1$.

8. In Reed-Solomon error correction code apparatus for a computing system storage device in which useful data written on the surface of a rotating disk in finite blocks is read by a transducing mechanism and in which each finite block of data so recorded includes finite field error correction coding syndrome information appended at the end thereof for enabling detection and correction of errors within the block, an error correction code syndrome generator of minimized logic elements for calculating error correction coding syndrome information in accordance with a Galois field $GF(2^8)$ generated by a field generator polynomial having the form $x^8+x^4+x^3+x^2+1$ and wherein the first term of the field is $x^5+x^3+x+1$ (which is 00101011 binary), the generator for testing the calculated information with the appended information to signal any discrepancies indicative of an error within the data block, the generator comprising:

an input/output summing junction for receiving each incoming data block as a clocked data stream of serial bytes, an error correction code feedback path leading from the summing junction and carrying feedback values, multiplier apparatus for multiplying the feedback values by a first predetermined constant to yield first product values, for multiplying the feedback values by a second predetermined constant to yield second product values, and for multiplying the feedback values by a third predetermined constant to yield third product values, a first clocked latch stage for latching the feedback values present on the feedback path, a first summing junction for summing the latched feedback values from the first latch stage with the first product values to yield first sum values, a second clocked latch stage for latching the first sum values, a second summing junction for summing the first sum values and the second product values to yield second sum values, a third clocked latch stage for latching the second sum values, a third summing junction for summing the second sum values and the third product values to yield third sum values, a fourth clocked latch stage for latching the third sum values, the input-output summing junction for summing the third sum values with the incoming clocked stream of serial bytes to generate the feedback values, the first, second, third and fourth latch stages being clocked in synchronism with the incoming data stream of serial bytes, and testing means for testing the values held in the first, second, third and fourth latch stages at the end of processing of each block thereby to determine if an error has occurred.

9. The error correction code syndrome generator set forth in claim 8 wherein each data block is divided into at least two interleaves, wherein the first, second, third and fourth latch stages include synchronously clocked byte serial latches corresponding in number to the number of interleaves, and wherein the syndrome generator calculates a number of syndromes corresponding in number to the number of interleaves.

10. The error correction code syndrome generator set forth in claim 9 wherein each data block is divided inside the generator into three interleaved parts, wherein each of the first, second, third and fourth latch stages includes three synchronously clocked latches, and wherein the syndrome generator calculates three syndromes, each syndrome corresponding to a said interleave.

11. The error correction code syndrome generator set forth in claim 10 wherein each data block includes five hundred twelve data bytes followed by twelve error correction code syndrome bytes, there being four syndrome bytes provided for each said interleave part.

12. The error correction code syndrome generator set forth in claim 11 wherein the first interleave begins with the first data byte and includes every third byte thereafter, the second interleave begins with the second data byte and includes every third byte thereafter, and the third interleave begins with the third byte and includes every third byte thereafter, and wherein the twelve syndrome bytes are appended immediately following the last data byte of the block in the order S3A, S1A, S2A, S3B, S1B, S2B, S3C, S1C, S2C, S3D, S1D, S2D, where S denotes syndrome byte, the numeral denotes the interleave number and the letters A, B, C and D denote respectively the first, second, third and fourth bytes of the syndrome.

13. The error correction code syndrome generator set forth in claim 8 wherein the first syndrome byte values are generated in accordance with a syndrome generator polynomial having the form $X^4+\text{Alpha}^{18}X^3+\text{Alpha}^{89}X^2+\text{Alpha}^{18}X+1$.

14. The error correction code syndrome generator set forth in claim 8 wherein the first, second, third and fourth latch stages include at least one addressable, enablable bus driver for enabling syndrome values contained therein at the end of processing of a data block to be obtained and analyzed by a correction computer thereby for locating and correcting at least one data byte determined to be in error.

15. The error correction code generator set forth in claim 14 further comprising additional latching means for latching syndrome values of a present data block having an error so that a subsequent data block may be processed by said generator as the first block is undergoing error correction processing at the microprocessor.

16. A rotating disk data storage subsystem for storing useful data including a rotating disk having a storage surface in which the data is recorded in blocks of predetermined finite length, a positionable data transducer for reading the data of selected data blocks from the surface, a transducer actuator structure for moving the data transducer among data block locations available on the surface in response to data retrieval commands from a host system and for maintaining the data transducer accurately positioned at each data block location in response to servo information obtained from the data surface, a data controller for managing retrieval of data from the surface via the transducer, a buffer memory for temporarily storing each block of data retrieved from the surface, an interface communicating with the host for sending each data block and status commands to the host and for receiving operational commands from the host, a single microprocessor controller for controlling the actuator structure in order to position the transducer, each block of data including an error correction code syndrome portion calculated in accordance with a predetermined Galois field error correction algorithm, the data controller including a cyclic error correction code syndrome generator for processing each incoming byte of the block in accordance with the said error correction algorithm in a manner which tests for the presence of any errors and which generates error values from which the errors may be located and corrected, the microprocessor having access to the data controller for testing to determine if the generator has determined the presence of an error for an incoming block, and if so, for obtaining the error values, the microprocessor being programmed to process the error values to determine the location and nature of at least one error, and having access to the buffer memory whereby a data byte of the block including an error may be removed and a corrected byte substituted in its place.

17. The storage subsystem set forth in claim 16 wherein access by the microprocessor to the buffer memory is via registers of the data controller.

18. The data storage subsystem set forth in claim 16 wherein the Reed-Solomon error correction code syndrome generator comprises:
an input/output summing junction for receiving each incoming data block from the transducer as a clocked data stream of serial bytes,
an error correction code feedback path leading from the summing junction and carrying feedback values,
multiplier apparatus for multiplying the feedback values by a first predetermined constant to yield first product values for multiplying the feedback values by a second predetermined constant to yield second product values, and for multiplying the feedback values by a third predetermined constant to yield third product values,
a first clocked latch stage for latching the feedback values present on the feedback path,
a first summing junction for summing the latched feedback values from the first latch stage with the first product values to yield first sum values,
a second clocked latch stage for latching the first sum values,
a second summing junction for summing the first sum values and the second product values to yield second sum values,
a third clocked latch stage for latching the second sum values,
a third summing junction for summing the second sum values and the third product values to yield third sum values,
a fourth clocked latch stage for latching the third sum values,
the input-output summing junction for summing the third sum values with the incoming clocked stream of serial bytes to generate the feedback values,
the first, second, third and fourth latch stages being clocked in synchronism with the incoming data stream of serial bytes, and
testing means for enabling the microprocessor to test the values held in the first, second, third and fourth latch stages at the end of processing of each block thereby to determine if an error has occurred,
and wherein the microprocessor has direct access to the values held in the first, second, third and fourth latch stages at the end of processing of each block thereby to obtain the values therein.

19. The data storage subsystem set forth in claim 16 wherein each data block is divided into at least two interleaves, wherein the first, second, third and fourth latch stages include synchronously clocked byte serial latches corresponding in number to the number of interleaves, and wherein the syndrome generator calculates a number of syndromes corresponding in number to the number of interleaves.

20. The data storage subsystem set forth in claim 19 wherein each data block is divided inside the generator into three interleaved parts, wherein each of the first, second, thrid and fourth latch stages includes three synchronously clocked serial latches, and wherein the syndrome generator calculates three syndromes, each syndrome corresponding to a said interleave.

21. The data storage subsystem set forth in claim 20 wherein each data block includes five hundred twelve data bytes followed by twelve error correction code syndrome bytes, there being four syndrome bytes provided for each said interleave part.

22. The data storage subsystem set forth in claim 21 wherein the first interleave begins with the first data byte and includes every third byte thereafter, the second interleave begins with the second data byte and includes every third byte thereafter, and the third interleave begins with the third byte and includes every third byte thereafter, and wherein the twelve syndrome bytes are appended immediately following the last data byte of the block in the order S3A, S1A, S2A, S3B, S1B, S2B, S3C, S1C, S2C, S3D, S1D, S2D, where S denotes syndrome byte, the numeral denotes the interleave number and the letters A, B, C and D denote respectively the first, second, third and fourth bytes of the syndrome.

23. The data storage subsystem set forth in claim 16 wherein the error correction algorithm enables the error correction a field $GF(2^8)$ to be generated by field generator polynomial having the form $x^8+x^4+x^3+x^2+1$ and wherein the first term of the field is of the form $x^5+x^3+x+1$ which is 00101011 in binary).

24. The data storage subsystem set forth in claim 23 wherein the syndrome byte values are generated by a syndrome generator polynomial having the form $X^4+Alpha^{18}X^3+Alpha^{87}X^2+Alpha^{18}X+1$.

25. The data storage subsystem set forth in claim 18 wherein the first, second, third and fourth latch stages include addressable, enablable bus drivers for enabling syndrome values contained therein at the end of processing of a data block to be obtained and analyzed by a correction computer thereby for locating and correcting at least one data byte determined to be in error.

26. The data storage subsystem set forth in claim 18 wherein a single bus driver is connected to the fourth latch stage output and a clocking circuit means responds to an addressing signal from the microprocessor controller in order to clock all of the latch stages, so that the microprocessor may thereby obtain all of the syndrome bytes in sequence.

27. The data storage subsystem set forth in claim 18 further comprising additional latch-drivers connected to the first, second, third and fourth latch stage outputs so that at least one subsequent block of data of a track may be checked for errors while error correction processing of a present data block of the track is being carried out.

28. The data storage subsystem set forth in claim 18 wherein the input-output, first, second and third summing junctions are implemented with two input exclusive-OR gates.

* * * * *